(12) United States Patent
Charles et al.

(10) Patent No.: US 12,366,705 B2
(45) Date of Patent: *Jul. 22, 2025

(54) PHOTONICS OPTOELECTRICAL SYSTEM

(71) Applicant: The Research Foundation for The State University of New York, Albany, NY (US)

(72) Inventors: William Charles, Albany, NY (US); Douglas Coolbaugh, Albany, NY (US); Douglas La Tulipe, Albany, NY (US); Gerald L. Leake, Jr., Albany, NY (US)

(73) Assignee: THE RESEARCH FOUNDATION FOR THE STATE UNIVERISTY OF NEWYORK, Albany, NY (US)

( * ) Notice: Subject to any disclaimer, the term of this patent is extended or adjusted under 35 U.S.C. 154(b) by 23 days.

This patent is subject to a terminal disclaimer.

(21) Appl. No.: 18/151,900

(22) Filed: Jan. 9, 2023

(65) Prior Publication Data
US 2023/0244029 A1     Aug. 3, 2023

Related U.S. Application Data

(63) Continuation of application No. 16/575,938, filed on Sep. 19, 2019, now Pat. No. 11,550,099.
(Continued)

(51) Int. Cl.
G02B 6/12     (2006.01)
G02B 6/13     (2006.01)
(Continued)

(52) U.S. Cl.
CPC .......... G02B 6/12004 (2013.01); G02B 6/12 (2013.01); G02B 6/12002 (2013.01); G02B 6/13 (2013.01);
(Continued)

(58) Field of Classification Search
CPC ...... G02B 6/12004; G02B 2006/12061; G02B 6/12002; G02B 6/428; G02B 6/43;
(Continued)

(56) References Cited

U.S. PATENT DOCUMENTS 5,835,646 A     11/1998   Yoshimura et al.
6,048,775 A      4/2000   Yao et al.
(Continued)

FOREIGN PATENT DOCUMENTS

CN     104882368           9/2015
CN     106558577 A         4/2017
(Continued)

OTHER PUBLICATIONS

Bogaerts et al., Machine Translation of JP 2012-256869A. (Year: 2012).*

(Continued)

*Primary Examiner* — Michelle R Connelly
(74) *Attorney, Agent, or Firm* — Heslin Rothenberg Farley & Mesiti P.C.

(57) ABSTRACT

There is set forth herein a method including building a first photonics structure using, wherein the building the first photonics structure includes fabricating one or more photonics device.

20 Claims, 29 Drawing Sheets

Related U.S. Application Data

(60) Provisional application No. 62/770,634, filed on Nov. 21, 2018.

(51) Int. Cl.
*G02B 6/42* (2006.01)
*G02B 6/43* (2006.01)
*H01S 5/02* (2006.01)
*H01S 5/02345* (2021.01)
*H01S 5/026* (2006.01)
*H10F 30/21* (2025.01)

(52) U.S. Cl.
CPC .......... *G02B 6/4245* (2013.01); *G02B 6/428* (2013.01); *G02B 6/4283* (2013.01); *G02B 6/43* (2013.01); *H01S 5/026* (2013.01); *G02B 2006/12061* (2013.01); *G02B 2006/12085* (2013.01); *G02B 6/131* (2013.01); *H01S 5/0216* (2013.01); *H01S 5/02345* (2021.01); *H01S 5/0262* (2013.01); *H10F 30/21* (2025.01)

(58) Field of Classification Search
CPC ...... H01S 5/026; H01S 5/1032; H01S 5/0216; H01L 2224/05025
See application file for complete search history.

(56) References Cited

U.S. PATENT DOCUMENTS

| | | | |
|---|---|---|---|
| 6,056,630 A | 5/2000 | Nanda et al. | |
| 6,108,464 A | 8/2000 | Foresi et al. | |
| 6,538,299 B1 | 3/2003 | Kwark et al. | |
| 6,621,972 B2 | 9/2003 | Kimerling et al. | |
| 6,631,225 B2 | 10/2003 | Lee et al. | |
| 6,635,110 B1 | 10/2003 | Luan et al. | |
| 6,690,871 B2 | 2/2004 | Lee et al. | |
| 6,706,576 B1 | 3/2004 | Ngo | |
| 6,812,495 B2 | 11/2004 | Wada et al. | |
| 6,879,014 B2 | 4/2005 | Wagner et al. | |
| 6,887,773 B2 | 5/2005 | Gunn, III et al. | |
| 6,927,392 B2 | 8/2005 | Liddiard | |
| 7,008,813 B1 | 3/2006 | Lee et al. | |
| 7,095,010 B2 | 8/2006 | Scherer et al. | |
| 7,103,245 B2 | 9/2006 | Lee et al. | |
| 7,123,805 B2 | 10/2006 | Sparacin et al. | |
| 7,190,871 B2 | 3/2007 | Lock et al. | |
| 7,194,166 B1 | 3/2007 | Gunn, III et al. | |
| 7,205,525 B2 | 4/2007 | Yasaitis | |
| 7,259,031 B1 | 8/2007 | Dickinson et al. | |
| 7,262,117 B1 | 8/2007 | Gunn, III et al. | |
| 7,279,682 B2 | 10/2007 | Ouvrier-Buffet et al. | |
| 7,317,242 B2 | 1/2008 | Takizawa | |
| 7,321,713 B2 | 1/2008 | Akiyama et al. | |
| 7,389,029 B2 | 6/2008 | Rahman et al. | |
| 7,397,101 B1 | 7/2008 | Masini et al. | |
| 7,424,181 B2 | 9/2008 | Haus et al. | |
| 7,459,686 B2 | 12/2008 | Syllaios et al. | |
| 7,480,430 B2 | 1/2009 | Saini et al. | |
| 7,565,046 B2 | 7/2009 | Feng et al. | |
| 7,613,369 B2 | 11/2009 | Witzens et al. | |
| 7,651,880 B2 | 1/2010 | Tweet et al. | |
| 7,659,627 B2 | 2/2010 | Miyachi et al. | |
| 7,700,975 B2 | 4/2010 | Rakshit et al. | |
| 7,723,206 B2 | 5/2010 | Miyachi et al. | |
| 7,723,754 B2 | 5/2010 | Wada et al. | |
| 7,737,534 B2 | 6/2010 | McLaughlin et al. | |
| 7,801,406 B2 | 9/2010 | Pan et al. | |
| 7,816,767 B2 | 10/2010 | Pei et al. | |
| 7,831,123 B2 | 11/2010 | Sparacin et al. | |
| 7,902,620 B2 | 3/2011 | Assefa et al. | |
| 7,906,825 B2 | 3/2011 | Tweet et al. | |
| 7,916,377 B2 | 3/2011 | Witzens et al. | |
| 7,943,471 B1 | 5/2011 | Buller et al. | |
| 7,994,066 B1 | 8/2011 | Capellini et al. | |
| 8,030,668 B2 | 10/2011 | Hisamoto et al. | |
| 8,227,787 B2 | 7/2012 | Kumar et al. | |
| 8,354,282 B2 | 1/2013 | Stern | |
| 8,471,639 B2 | 6/2013 | Welch | |
| 8,592,745 B2 | 11/2013 | Masini et al. | |
| 8,625,935 B2 | 1/2014 | Mekis et al. | |
| 8,633,067 B2 | 1/2014 | Assefa et al. | |
| 8,649,639 B2 | 2/2014 | Mekis et al. | |
| 8,664,739 B2 | 3/2014 | King et al. | |
| 8,742,398 B2 | 6/2014 | Klem et al. | |
| 8,754,711 B2 | 6/2014 | Welch | |
| 8,787,774 B2 | 7/2014 | Guckenberger | |
| 8,798,476 B2 | 8/2014 | Gloeckner et al. | |
| 8,877,616 B2 | 11/2014 | Pinguet et al. | |
| 8,895,413 B2 | 11/2014 | Pinguet et al. | |
| 9,046,650 B2 | 6/2015 | Lin et al. | |
| 9,091,827 B2 | 7/2015 | Verslegers et al. | |
| 9,110,221 B2 | 8/2015 | Agarwal et al. | |
| 9,864,138 B2 | 1/2018 | Coolbaugh | |
| 10,295,745 B2 | 5/2019 | Coolbaugh | |
| 11,171,075 B2 | 11/2021 | Liu | |
| 11,550,099 B2* | 1/2023 | Charles | H01S 5/1032 |
| 2002/0052120 A1 | 5/2002 | Shintani et al. | |
| 2002/0172487 A1 | 11/2002 | Hwang et al. | |
| 2003/0063836 A1 | 4/2003 | Lam et al. | |
| 2003/0137706 A1 | 6/2003 | Rmanujam et al. | |
| 2003/0215203 A1 | 11/2003 | Lock et al. | |
| 2004/0057684 A1 | 3/2004 | Kokubun | |
| 2005/0012040 A1 | 1/2005 | Fiorini et al. | |
| 2005/0051705 A1 | 3/2005 | Yasaitis | |
| 2005/0101084 A1 | 5/2005 | Gilton | |
| 2005/0111806 A1 | 5/2005 | Brask | |
| 2005/0205954 A1 | 9/2005 | King et al. | |
| 2005/0220984 A1 | 10/2005 | Sun et al. | |
| 2006/0110844 A1 | 5/2006 | Lee et al. | |
| 2006/0194357 A1 | 8/2006 | Hsu et al. | |
| 2006/0243973 A1 | 11/2006 | Gilton | |
| 2006/0249753 A1 | 11/2006 | Herner | |
| 2006/0250836 A1 | 11/2006 | Herner et al. | |
| 2006/0250837 A1 | 11/2006 | Herner | |
| 2006/0289764 A1 | 12/2006 | Fiorini et al. | |
| 2007/0034978 A1 | 2/2007 | Pralle et al. | |
| 2007/0099329 A1 | 5/2007 | Maa et al. | |
| 2007/0104411 A1 | 5/2007 | Ahn et al. | |
| 2007/0141744 A1 | 6/2007 | Lee et al. | |
| 2007/0170536 A1 | 7/2007 | Hsu et al. | |
| 2007/0190722 A1 | 8/2007 | Herner | |
| 2007/0228414 A1 | 10/2007 | Kumar et al. | |
| 2007/0262296 A1 | 11/2007 | Bauer | |
| 2008/0093622 A1* | 4/2008 | Li | H01L 33/007 |
| | | | 257/E33.001 |
| 2008/0121805 A1 | 5/2008 | Tweet et al. | |
| 2008/0157253 A1 | 7/2008 | Starikov et al. | |
| 2008/0217651 A1 | 9/2008 | Liu et al. | |
| 2008/0311696 A1 | 12/2008 | Chee-Wee et al. | |
| 2008/0311718 A1 | 12/2008 | Futase | |
| 2008/0316795 A1 | 12/2008 | Herner | |
| 2008/0318397 A1 | 12/2008 | Herner | |
| 2009/0032814 A1 | 2/2009 | Vashchenko et al. | |
| 2009/0196631 A1 | 8/2009 | Daghighian et al. | |
| 2010/0006784 A1 | 1/2010 | Mack et al. | |
| 2010/0006961 A1 | 1/2010 | Yasaitis | |
| 2010/0008675 A1 | 1/2010 | De Dobbelaere | |
| 2010/0029033 A1 | 2/2010 | Carothers et al. | |
| 2010/0046955 A1 | 2/2010 | De Dobbelaere et al. | |
| 2010/0060972 A1 | 3/2010 | Kucharski et al. | |
| 2010/0090110 A1 | 4/2010 | Tweet et al. | |
| 2010/0102412 A1 | 4/2010 | Suh et al. | |
| 2010/0133536 A1 | 6/2010 | Syllaios et al. | |
| 2010/0133585 A1 | 6/2010 | Kim et al. | |
| 2010/0151619 A1 | 6/2010 | Yasaitis | |
| 2010/0213561 A1 | 8/2010 | Assefa et al. | |
| 2010/0225791 A1 | 9/2010 | Nakayama | |
| 2011/0008060 A1 | 1/2011 | Kucharski | |
| 2011/0012221 A1 | 1/2011 | Fukikata et al. | |
| 2011/0027950 A1 | 2/2011 | Jones et al. | |
| 2011/0063024 A1 | 3/2011 | Kucharski et al. | |
| 2011/0156183 A1 | 6/2011 | Liu | |

(56) References Cited

U.S. PATENT DOCUMENTS

| | | |
|---|---|---|
| 2011/0227116 A1 | 9/2011 | Saito et al. |
| 2011/0236029 A1 | 9/2011 | De Dobbelaere et al. |
| 2011/0243569 A1 | 10/2011 | De Dobbelaere et al. |
| 2012/0001283 A1 | 1/2012 | Assefa et al. |
| 2012/0025212 A1 | 2/2012 | Kouvetakis et al. |
| 2012/0115310 A1 | 5/2012 | Miu |
| 2012/0129302 A1 | 5/2012 | Assefa et al. |
| 2012/0177378 A1 | 7/2012 | De Dobbelaere et al. |
| 2012/0187280 A1 | 7/2012 | Kerness et al. |
| 2012/0193636 A1 | 8/2012 | Stern |
| 2012/0205524 A1 | 8/2012 | Mack et al. |
| 2012/0252158 A1 | 10/2012 | Carothers et al. |
| 2012/0288971 A1 | 11/2012 | Boagaerts et al. |
| 2012/0288992 A1 | 11/2012 | Assefa et al. |
| 2013/0154042 A1 | 6/2013 | Meade |
| 2013/0202005 A1 | 8/2013 | Dutt |
| 2013/0214160 A1 | 8/2013 | Cazaux et al. |
| 2013/0228886 A1 | 9/2013 | JangJian et al. |
| 2013/0284889 A1 | 10/2013 | Giffard et al. |
| 2013/0313579 A1 | 11/2013 | Kouvetakis et al. |
| 2013/0328145 A1 | 12/2013 | Liu et al. |
| 2013/0336664 A1 | 12/2013 | Mack et al. |
| 2014/0008750 A1 | 1/2014 | Feshali et al. |
| 2014/0029892 A1 | 1/2014 | Pomerene et al. |
| 2014/0124669 A1 | 5/2014 | Zheng et al. |
| 2014/0131733 A1 | 5/2014 | Meade |
| 2014/0159129 A1 | 6/2014 | Wang et al. |
| 2014/0175510 A1 | 6/2014 | Suh et al. |
| 2014/0203325 A1 | 7/2014 | Verma et al. |
| 2014/0206190 A1 | 7/2014 | Li et al. |
| 2015/0177458 A1 | 6/2015 | Bowers et al. |
| 2016/0109655 A1 | 4/2016 | Vurgaftman |
| 2016/0197111 A1 | 7/2016 | Coolbaugh et al. |
| 2016/0223749 A1 | 8/2016 | Coolbaugh |
| 2016/0363729 A1 | 12/2016 | Baiocco et al. |
| 2017/0092626 A1 | 3/2017 | Yuan |
| 2017/0139132 A1 | 5/2017 | Patel et al. |
| 2017/0207600 A1 | 7/2017 | Klamkin et al. |
| 2017/0299809 A1 | 10/2017 | Boeuf et al. |
| 2018/0143374 A1 | 5/2018 | Coolbaugh et al. |
| 2018/0308824 A1 | 10/2018 | Hsiao et al. |
| 2018/0314003 A1 | 11/2018 | Coolbaugh et al. |
| 2019/0025513 A1 | 1/2019 | Coolbaugh et al. |
| 2019/0310417 A1 | 10/2019 | Coolbaugh et al. |
| 2019/0331941 A1 | 10/2019 | Coolbaugh et al. |
| 2020/0026003 A1 | 1/2020 | Coolbaugh et al. |
| 2020/0091124 A1 | 3/2020 | Liao |
| 2020/0166703 A1 | 5/2020 | Charles et al. |
| 2020/0166720 A1 | 5/2020 | Charles et al. |

FOREIGN PATENT DOCUMENTS

| | | | |
|---|---|---|---|
| CN | 107408589 | 11/2017 | |
| EP | 2 214 042 A1 | 8/2010 | |
| EP | 3002568 | 4/2016 | |
| EP | 3002568 A1 | 4/2016 | |
| EP | 3336892 | 6/2016 | |
| EP | 3336892 A1 | 6/2018 | |
| GB | 2 552 264 A | 1/2018 | |
| JP | 2012256869 A * | 12/2012 | ........... H10F 30/223 |
| JP | 6168598 | 7/2017 | |
| TW | 201448262 | 12/2014 | |
| TW | 201709546 | 3/2017 | |
| WO | WO2018098146 A1 | 5/2018 | |

OTHER PUBLICATIONS

Written Opinion, International Application No. PCT/US2019/052232, filed Sep. 20, 2019, dated May 11, 2020.
Search Report, International Application No. PCT/US2019/052232, filed Sep. 20, 2019, dated May 11, 2020.
Written Opinion, International Application No. PCT/US2019/052234, filed Sep. 20, 2019, dated Apr. 20, 2020.
Search Report, International Application No. PCT/US2019/052234, filed Sep. 20, 2019, dated Apr. 20, 2020.
International Application Status Report for Application No. PCT/US2019/052232, filed Sep. 20, 2019, dated Nov. 21, 2022.
Stintz, A. et al., "Low-Threshold Current Density 1.3-μm InAs Quantum-Dot Lasers with the Dots-in-a-Well (DWELL) Structure," IEEE Photonics Technology Letters, vol. 12, No. 6, Jun. 2000, pp. 591-593.
Ray, S.K. et al., "Improved Temperature Performance of 1.31-μm Quantum Dot Lasers by Optimized Ridge Waveguide Design," IEEE Photonics Technology Letters, vol. 17, No. 9, Sep. 2005, pp. 1785-1787 (+cover).
Crowley, M.T. et al., "GaAs-Based Quantum Dot Lasers," Semiconductors and Semimetals, vol. 86, ISSN: 0080-8784, 2012, pp. 371-417.
Liu, G.T. et al., "Ultra-low threshold current density quantum dot lasers using the dots-in-a-well (DWELL) structure," Physics and Simulation of Optoelectronic Devices VIII, vol. 3944, 2000, pp. 814-824.
Chen, S.M. et al., "1.3 μm InAs/GaAs quantum-dot laser monolithically grown on Si substrates operating over 100° C.," Electronics Letters, vol. 50 No. 20, Sep. 25, 2014, pp. 1467-1468.
Kwoen, J. et al., "All MBE grown InAs/GaAs quantum dot lasers on on-axis Si (001)," Optics Express, vol. 26, No. 9, Apr. 30, 2018, pp. 11568-11576.
Park, C.Y. et al., "Electroluminescence at 1.3 μm from InAs/GaAs quantum dots monolithically grown on Ge/Si substrate by metal organic chemical vapor deposition," IOPScience, The Japan Society of Applied Physics, 2016, pp. 100304-1 thru 100304-4 (+Cover).
Wang, J. et al., "1.3 μm InAs/GaAs quantum dot lasers on silicon with GaInP upper cladding layers," Photonics Research, vol. 6, No. 4, Apr. 2018, pp. 321-325.
Lee A.D. et al., "InAs/GaAs Quantum-Dot Lasers Monolithically Grown on Si, Ge, and Ge-on-Si Substrates," IEEE Journal of Selected Topics in Quantum Electronics, vol. 19, No. 4, Jul./Aug. 2013, 7 pages.
Wan, Y. et al., "InAs/GaAs quantum dots on GaAs-on-V-grooved-Si substrate with high optical quality in the 1.3 μm band," Applied Physics Letters, 2015, 081106-1 thru 081106-4 (+cover).
Chen, S. et al., "Electrically pumped continuous-wave III-V quantum dot lasers on silicon," Nature Photonics, 2016, pp. 1-6.
Tang, M. et al., "Optimizations of Defect Filter Layers for 1.3-μm InAs/GaAs Quantum-Dot Lasers Monolithically Grown on Si Substrates," IEEE Journal of Selected Topics in Quantum Electronics, vol. 22, No. 6, Nov./Dec. 2016, 7 pages.
Liu, G.T. et al, "The Influence of Quantum-Well Composition on the Performance of Quantum Dot Lasers Using InAs/InGaAs Dots-in-a-Well (DWELL) Structures," IEEE Journal of Quantum Electronics, vol. 36, No. 11, Nov. 2000, pp. 1272-1279.
Lu et al. "Via-First Inter-Wafer Vertical Interconnects utilizing Wafer-Bonding of Damascene-Patterned Metal/Adhesive Redistribution Layers"; Proceedings of 3D Packaging Workshop at IPAMS International Conference on Device Packaging; Mar. 20-23, 2006; 7 pages.
Skordas et al. "Wafer-Scale oxide Fusion Bonding and Wafer Thinning Development for 3D Systems Integration"; 2012 3rd IEEE International Workshop on Low Temperature Bonding for 3D Integration; May 22-23, 2012; pp. 203-208.
Office Action; Intellectual Property Office of the Republic of China; Application No. 108133748; Feb. 22, 2023; 12 pages. (submitted with copy of original document and full text English translation).
Search Report; Taiwan Intellectual Property Office; Application No. 108133748; Feb. 20, 2023; 2 pages.
Office Action; Intellectual Property Office of the Republic of China; Application No. 108133748; Nov. 7, 2023. 2 pages.
Communication pursuant to Article 94(3) EPC; European Patent Office; Application No. 19863977.5-1020; Jan. 2, 2024. 7 pages.
Office Action; Korean Intellectual Property Office; Application No. 10-2021-7016814; Sep. 9, 2024; 16 pages (submitted with copy of original document and full text English translation).

(56) References Cited

OTHER PUBLICATIONS

European Patent Office Office Action issued in EU Application 19863977.5, dated Jan. 30, 2025. 7 pages.

* cited by examiner

PHOTONICS OPTOELECTRICAL SYSTEM

CROSS-REFERENCE TO RELATED APPLICATION

This application claims the benefit of priority of U.S. application Ser. No. 16/575,938, filed Sep. 19, 2019, titled "Photonics Optoelectrical System", which is incorporated by reference in its entirety, which U.S. application Ser. No. 16/575,938 claims priority to U.S. Application No. 62/770,634, filed Nov. 21, 2018, titled "Photonics Optoelectrical System", which is incorporated by reference herein in its entirety.

GOVERNMENT RIGHTS STATEMENT

This invention was made with government support under Defense Advanced Research Projects Agency (DARPA) of the United States, under grant contract number HR0011-12-2-0007. The government may have certain rights in the invention.

FIELD

The present disclosure relates to photonics generally and specifically to fabricating of photonics optoelectrical systems.

BACKGROUND

Commercially available photonic integrated circuits are fabricated on wafers, such as bulk silicon or silicon-on-insulator wafers.

In one aspect photonics integrated circuits can include waveguides for transmission of optical signals between different areas of a photonic integrated circuit chip as well as on and off the chip. Commercially available waveguides are of rectangular or ridge geometry and are fabricated in silicon (single or polycrystalline) or silicon nitride.

Commercially available photonics integrated circuits can include photodetectors and other optical components. Photonic integrated circuits rely on the emission, modulation and the detection of light in the communication band (about 1.3 µm to about 1.55 µm). A bandgap absorption edge in germanium is near 1.58 µm. Germanium has been observed to provide sufficient photo-response for optoelectrical applications using 1.3 µm and 1.55 µm carrier wavelengths.

Commercially available photonics integrated circuit chips are available on systems having a photonics integrated circuit chip disposed on a printed circuit board.

BRIEF DESCRIPTION

The shortcomings of the prior art are overcome, and additional advantages are provided, through the provision, in one aspect, of a photonics structure.

There is set forth herein according to one embodiment an optoelectrical system comprising a first photonics structure having a first photonics dielectric stack; a second photonics structure having a second photonics dielectric stack; one or more metallization layers integrally formed in the first photonics dielectric stack; one or more first photonics devices integrally formed in the first photonics dielectric stack; at least one metallization layer integrally formed in the second photonics dielectric stack; at least one second photonics device integrally formed in the second photonics dielectric stack; one or more laser stack structures formed in the second photonics dielectric stack, each laser stack structure including a buffer structure, and each laser stack structure having a bottom contact structure thereof; and an extended dielectric stack region of the second photonics dielectric stack including a contact extending therethrough to contact at least one bottom contact structure of a laser stack structure, and the extended dielectric stack region further including a termination in electrical communication with the contact.

There is set forth herein according to one embodiment an optoelectrical system comprising a first photonics structure having a first photonics dielectric stack; a second photonics structure having a second photonics dielectric stack; a bond layer that fusion bonds the first photonics structure to the second photonics structure; one or more first metallization layers integrally formed in the first photonics dielectric stack; at least one second metallization layer integrally formed in the second photonics dielectric stack; one or more first photonics device integrally formed in the first photonics dielectric stack; at least one second photonics device integrally formed in the second photonics dielectric stack; one or more laser stack structures formed in the second photonics dielectric stack, each laser stack structure including a buffer structure, and each laser stack structure having a bottom contact structure thereof; an extended dielectric stack region of the second photonics dielectric stack including a contact extending therethrough to contact at least one bottom contact structure of a laser stack structure, and the extended dielectric stack region further including a termination in electrical communication with the contact; and a waveguide integrally formed in the second photonics dielectric stack, the waveguide being edge-coupled to one of the one or more laser stack structures.

There is set forth herein according to one embodiment an optoelectrical system comprising a first photonics structure having a first photonics dielectric stack; a second photonics structure having a second photonics dielectric stack; one or more metallization layers integrally formed in the first photonics dielectric stack; one or more first photonics devices integrally formed in the first photonics dielectric stack; at least one metallization layer integrally formed in the second photonics dielectric stack; at least one second photonics device integrally formed in the second photonics dielectric stack; one or more laser stack structures formed in the second photonics dielectric stack, each laser stack structure having a bottom contact structure thereof; and an extended dielectric stack region of the second photonics dielectric stack including a contact extending therethrough to contact at least one bottom contact structure of a laser stack structure, and the extended dielectric stack region further including a termination in electrical communication with the contact.

There is set forth herein according to one embodiment a method, the method including building a first photonics structure using a first wafer having a first substrate, wherein the building the first photonics structure includes integrally fabricating within a first photonics dielectric stack one or more photonics device, the one or more photonics device formed on the first substrate; building a second photonics structure using a second wafer having a second substrate, wherein the building the second photonics structure includes integrally fabricating within a second photonics dielectric stack a laser stack structure active region and one or more photonics device, the second photonics dielectric stack formed on the second substrate; and bonding the first photonics structure and the second photonics structure to define an optoelectrical system having the first photonics structure bonded the second photonics structure.

There is set forth herein according to one embodiment an optoelectrical system comprising a first photonics structure having a first photonics dielectric stack; a second photonics structure having a second photonics dielectric stack; a bond layer that fusion bonds the first photonics structure to the second photonics structure; one or more metallization layer integrally formed in the first dielectric stack; at least one metallization layer integrally formed in the second photonics dielectric stack; one or more photonics device integrally formed in the first photonics dielectric stack; at least one photonics device integrally formed in the second photonics dielectric stack; and one or more laser stack structure active region integrally formed in the second photonics dielectric stack.

There is set forth herein according to one embodiment a method, the method comprising building an interposer base structure using a base structure wafer having a base substrate, wherein the building the interposer base structure includes fabricating a redistribution layer, and through silicon vias that extend through the base substrate; building a first photonics structure using a first wafer having a first substrate, wherein the building the first photonics structure includes integrally fabricating within a photonics dielectric stack formed on the first substrate one or more photonics device; bonding the first photonics structure to the interposer base structure to define a bonded structure having the interposer base structure and the first photonics structure; building a second photonics structure using a second wafer having a second substrate, wherein the building the second photonics structure includes integrally fabricating within a second photonics dielectric stack formed on the second substrate a laser stack structure active region and one or more photonics device; bonding the second photonics structure and the bonded structure to define an interposer optoelectrical system having the second photonics structure bonded to the first photonics structure, and the first photonics structure bonded to the interposer base structure.

Additional features and advantages are realized through the techniques of the present disclosure.

BRIEF DESCRIPTION OF THE SEVERAL VIEWS OF THE DRAWINGS

One or more aspects of the present disclosure are particularly pointed out and distinctly claimed as examples in the claims at the conclusion of the specification. The foregoing and other objects, features, and advantages of the disclosure are apparent from the following detailed description taken in conjunction with the accompanying drawings in which:

DETAILED DESCRIPTION

Aspects of the present disclosure and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the disclosure in detail. It should be understood, however, that the detailed description and the specific examples, while indicating aspects of the disclosure, are given by way of illustration only, and not by way of limitation. Various substitutions, modifications, additions, and/or arrangements, within the spirit and/or scope of the underlying inventive concepts will be apparent to those skilled in the art from this disclosure.

Figure 1:
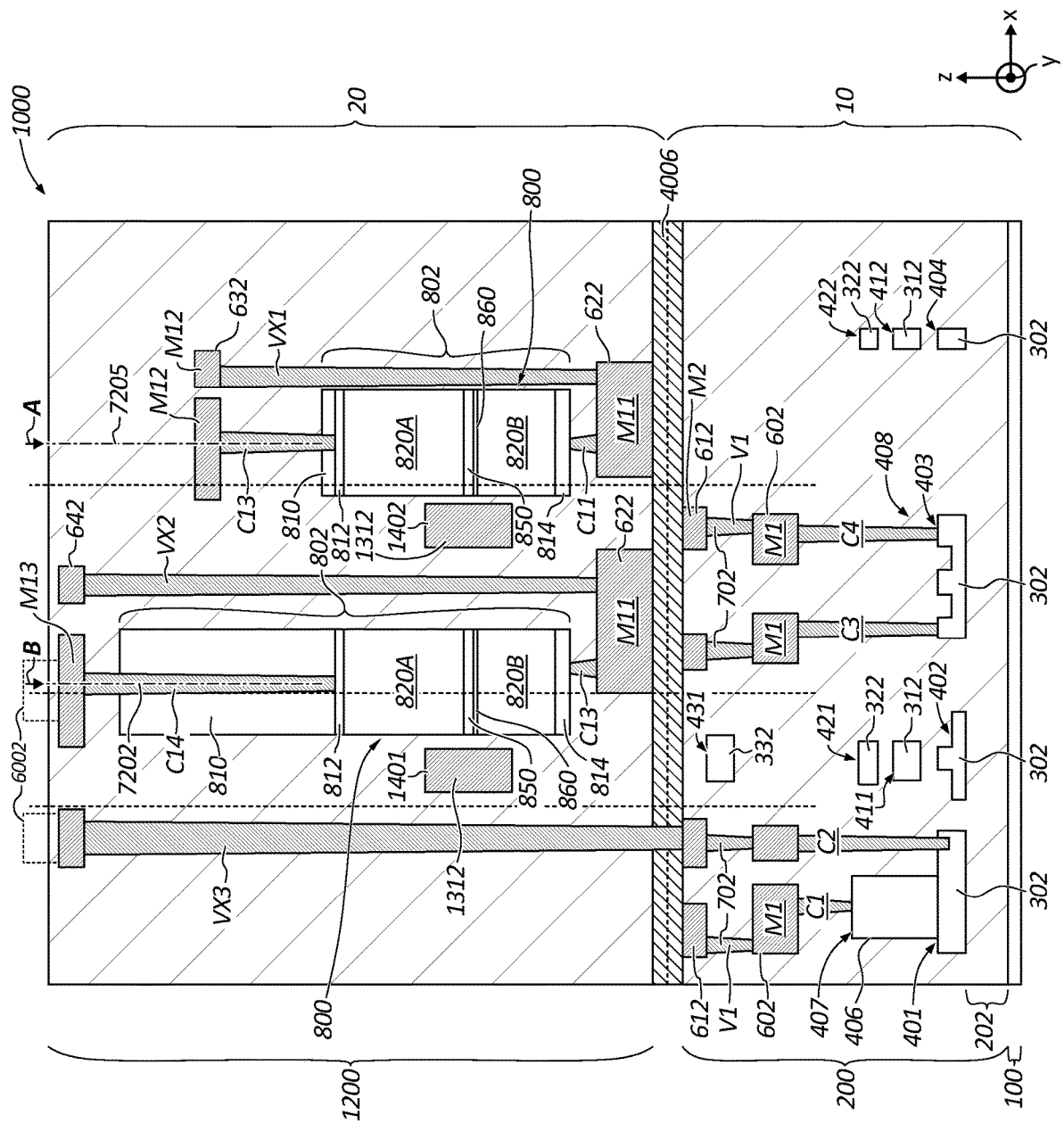
FIG. 1 is a cutaway side view of an optoelectrical system.

FIG. 1 illustrates optoelectrical system 1000 having photonics structure 10 and photonics structure 20. Photonics structures 10 and 20 can be wafer bonded together by bond layer 4006. Photonics structure 10 can include photonics dielectric stack 200 and photonics structure 20 can include photonics dielectric stack 1200. In photonics dielectric stack 200 of photonics structure 10 there can be integrated one or more photonics device. Photonics devices integrated in photonics dielectric stack 200 can include e.g. photodetector 407, modulator 408, and waveguides 402, 404, 411, 412, 421, 422, and 431. Photonics devices integrated in photonics structure 20 can include integrally formed and fabricated within photonics dielectric stack 1200 one or more photonics device, e.g. waveguide 1401 and waveguide 1402. Each of photonics dielectric stack 200 of photonics structure 10, and photonics dielectric stack 1200 of photonics structure 20 can have integrated therein a plurality of different types of photonics devices, e.g. one or more photodetector, one or more modulator, one or more grating, one or more polarizer, one or more resonator, and/or one or more waveguide.

FIG. 1 illustrates photonics structure 10 having a photonics dielectric stack 200, in which there can be integrated one or more photonics device integrally formed and fabricated within photonics dielectric stack 200, and one or more integrated laser light source having a laser stack structure that includes an active region integrally formed and fabricated in photonics dielectric stack 200. One or more photonics device integrally formed and fabricated within photonics dielectric stack 200 can include, e.g. waveguide 402 provided by a silicon (Si) ridge waveguide and can include waveguide 404 provided by a silicon rectangular waveguide, waveguide 411 provided by a rectangular silicon nitride waveguide, waveguide 412 provided by a rectangular silicon nitride waveguide, waveguide 421 provided by a rectangular silicon waveguide, and waveguide 422 provided by a rectangular silicon nitride waveguide and waveguide 431 patterned in layer 332 provided by a rectangular waveguide.

Photonics structure 10 can include an integrally formed and fabricated within photonics dielectric stack 200 photodetector 407 having light sensitive material formation 406, waveguiding material formation 401, contact C1, and contact C2. Photonics structure 10 can include integrally formed and fabricated within photonics dielectric stack 200 modulator 408 having waveguiding material formation 403, contact C3, and contact C4. Photonics structure 10 can include integrally formed and fabricated within photonics dielectric stack 200 other types of photonics devices, e.g. one or more grating, one or more polarizer, and/or one or more resonator. In the described embodiment set forth in reference to FIG. 1, waveguides integrally formed and fabricated within photonics dielectric stack 200 can be, e.g. single crystalline silicon waveguides or waveguides formed of nitride, e.g. SiN, polycrystalline silicon waveguides, amorphous silicon waveguides, and/or silicon nitride or silicon oxynitride waveguides.

Photonics structure 10 can further have fabricated therein one or more metallization layer and one or more vias layer. Integrated photonics structure 10 as shown in FIG. 1 can include metallization layer 602 that can be patterned to define metallization formations M1, vias layer 712 can be patterned to define vias V1, and metallization layer 612 can be patterned to define metallization formations M2. Metallization layers 602 and 612 can define horizontally extending wires. Wires defined by metallization layers 602 and 612 can be horizontally extending through areas of photonics dielectric stack 200. Horizontally extending wires defined by metallization layer 602 can be electrically connected to one or more vertically extending contact conductive material formations C1-C12 and vias V1 defined by vias layer 712 for distribution of one or more of control logic and/or power signals vertically and horizontally to different areas of photonics dielectric stack 200. Horizontally extending wires defined by metallization layer 6112 can be electrically connected to one or more of vertically extending vias V1 defined by vias layer 712 for distribution of one or more electrical control logic and/or power signals vertically and horizontally between different areas of photonics dielectric stack 200.

Referring to FIG. 1, photonics structure 20 can include one or more integrated laser light source 800 integrally formed and fabricated within photonics dielectric stack 1200 of photonics structure 20. Each laser light source can include a laser stack structure 802 having a plurality of layers including an active region layer, which active region layer can include a plurality of sublayers. Photonics structure 20 can include integrally formed and fabricated within photonics dielectric stack 1200 layer 1312 that can be subject to patterning to define one or more waveguide formed, e.g. of silicon nitride. One or more waveguide formed by patterning layer 1312 or another layer integrated in photonics dielectric stack 1200 can be aligned with active region 850 of a laser stack structure 802 so that an active region 850 of a laser stack structure 802 is precision aligned with the patterned waveguide integrated into a photonics dielectric stack using semiconductor patterning fabrication processes. For precision alignment between an active region 850 and a waveguide the active region and the waveguide can be integrally formed and fabricated within photonics dielectric stack 1200 so that respective longitudinal axes of the active region 850 and the waveguide coincide (see FIGS. 5A and 5B). Such laser stack structure and waveguide combination can be used for input of light into photonics structure 10 having one or more photonics devices integrated within photonics dielectric stack 200 of photonics structure 10.

Photonics structure 20 can include one or more termination 6002 formed on metallization layer 612. Termination 6002 can include, e.g., one or more of (a) an opening formed in photonics dielectric stack 200 opening to metallization layer 612; (b) a pad formed on metallization layer 612 and an opening to the pad; (c) an under bump metallization (UBM) layer formed on the metallization layer 612 with an opening formed in photonics dielectric stack 200 to the UBM; (d) a UBM formed on metallization layer 612 and a solder bump formed on the UBM externally protruding from photonics dielectric stack 200.

According to one embodiment, photonics structure 10 and photonics structure 20 can be fabricated using respective silicon on insulator (SOI) wafers. Referring to FIG. 1, substrate 100 can be a substrate of an SOI wafer, layer 202 can be an insulator layer of an SOI wafer, and layer 302 can be a silicon layer of an SOI wafer. Photonics structure 20 can also be formed using an SOI wafer but the corresponding substrate, insulator and silicon layers are not depicted in FIG. 1 for the reason that in the depicted embodiment the noted SOI structures are sacrificial and removed prior to the fabrication stage depicted in FIG. 1.

Layer 302 can have patterned therein waveguiding material formation 401 (defining photodetector 407), ridge waveguide 402, waveguiding material formation 403 (defining modulator 408), and waveguide 404. Substrate 100 according to one embodiment can have a thickness in a range of from about 10 um to about 1000 um. Substrate 100 according to one embodiment can have a thickness in a range of from about 100 um to about 1000 um. Layer 202 according to one embodiment can have a thickness of from about 100 nm to about 10 um. Layer 202 according to one embodiment can have a thickness of from about 1 um to about 5 um. Layer 302 according to one embodiment can have a thickness of from about 10 nm to about 1000 nm. Layer 302 according to one embodiment can be formed of monocrystalline silicon.

Layer 202 and layer 302 (as well as layer 1202 and 1302 of an SOI wafer used for fabrication of photonics structure 20) as shown throughout the views, according to one embodiment, can feature advantages associated with being prefabricated with use of high temperature treatments including defect annihilation treatments e.g. above 500 degrees C., in some cases above 700 degrees C. and in some cases above 1000 degrees C. SOI wafer layers as set forth herein such as layers 202 and 302 (as well as layer 1202 and 1302 of an SOI wafer used for fabrication of photonics structure 20) which can be prefabricated as part of an SOI wafer, can be subject to annealing processes for annihilation of defects with use of a thermal budget that can be limited after patterning or other use of layer 302 (and layer 1302) for fabrication of devices.

All of the component depicted within photonics dielectric stack 200 and photonics dielectric stack 1200 can be integrally formed and fabricated within photonics dielectric stack 200 or photonics dielectric stack 1200 using semiconductor device processes characterized by photolithography semiconductor device fabrication stages and/or chemical semiconductor device fabrication stages.

Figure 5A:
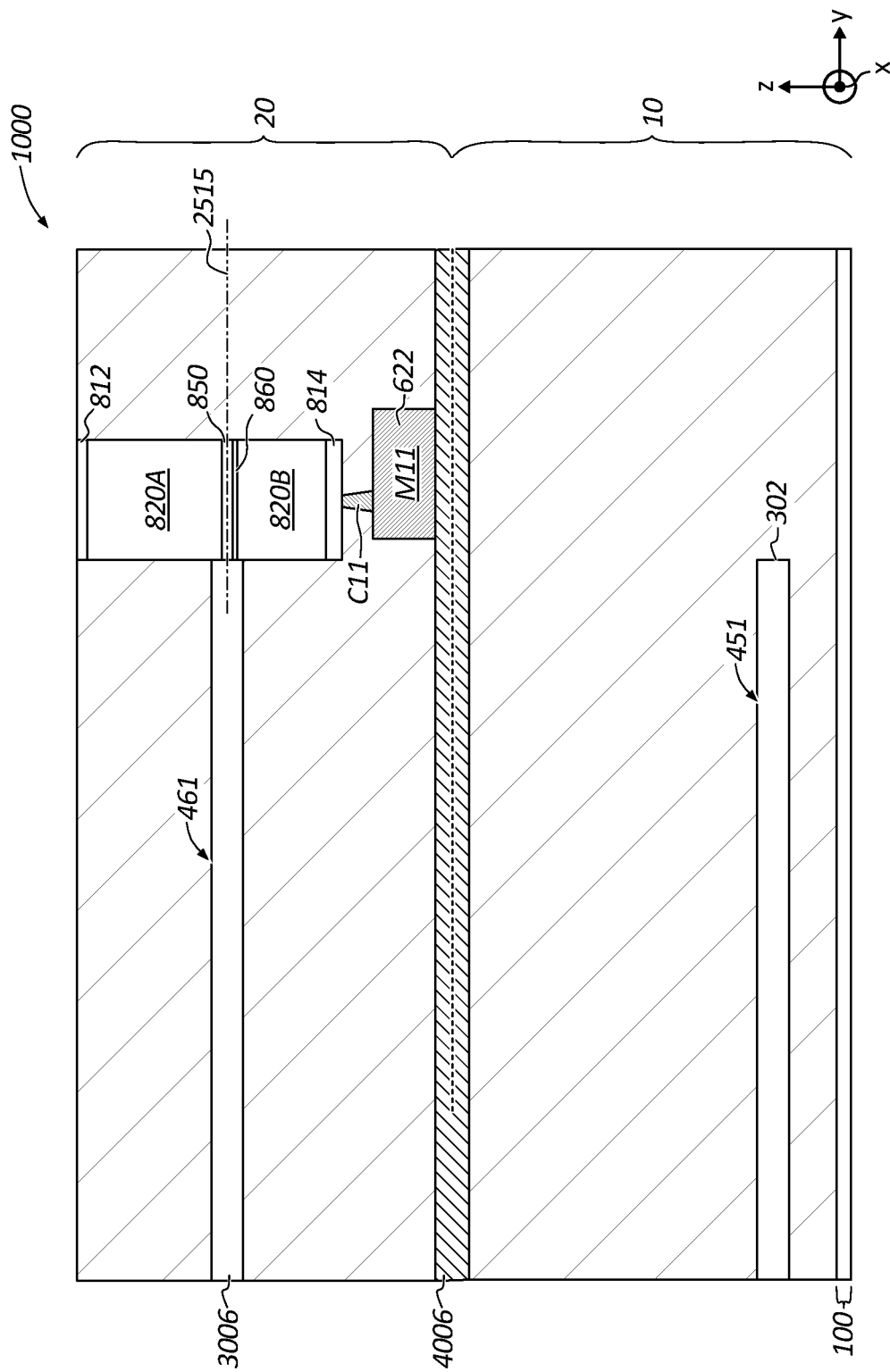
FIGS. 5A-5C are fabrication stage views illustrating coupling of light from an active region of a laser stack structure into one or more waveguide.
Figure 5B:
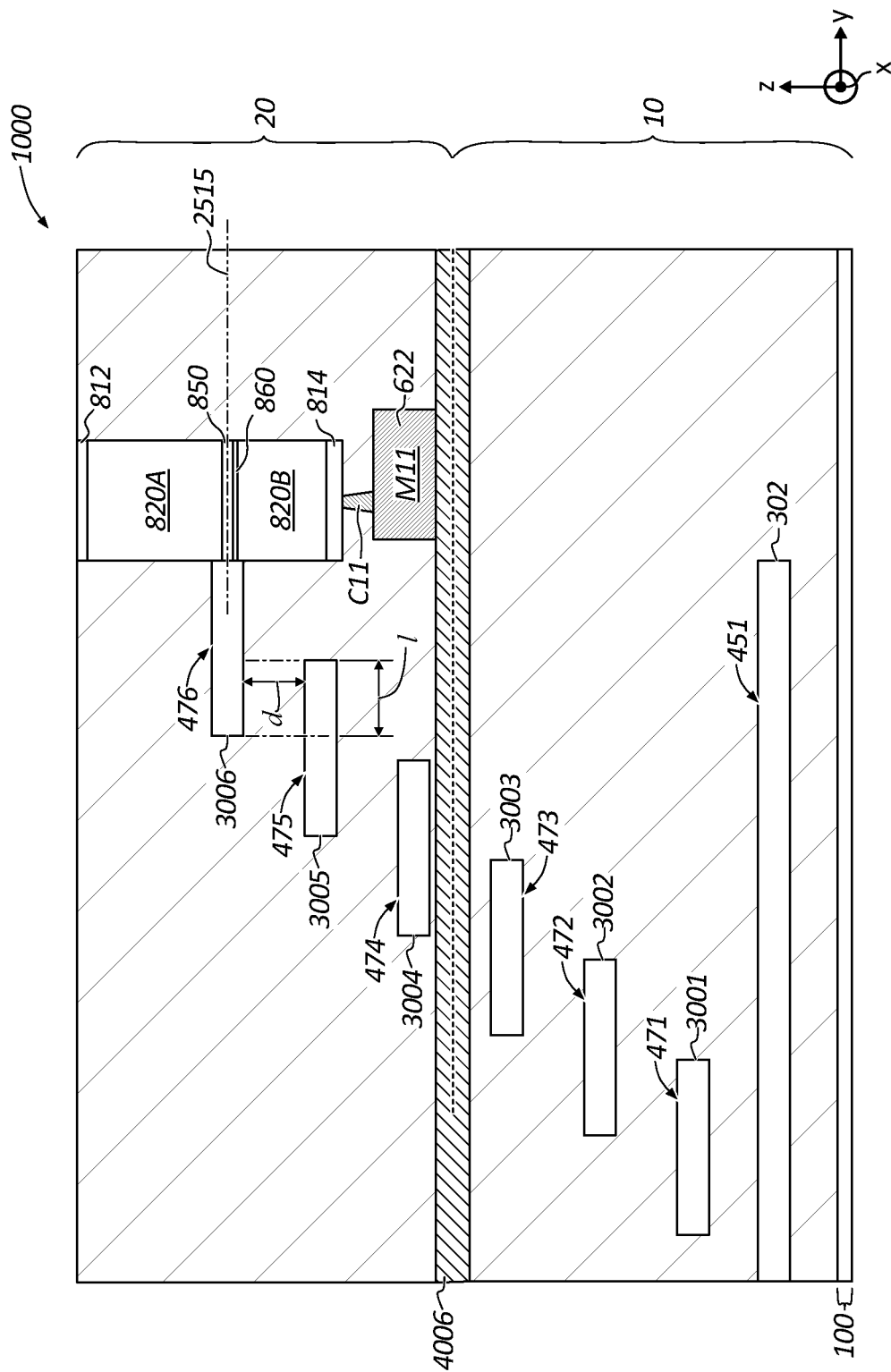
Figure 5C:
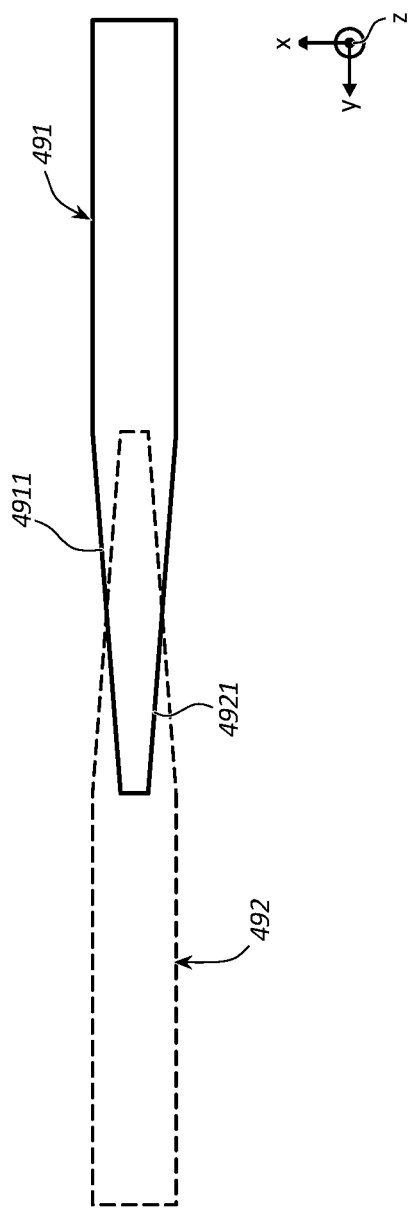

Providing optoelectrical system 1000 so that active region 850 of an integrated laser light source 800 is integrally formed and fabricated within photonics dielectric stack 1200 along with a waveguide into which the active region 850 emits light can facilitate precision alignment of an active region of an integrated laser light source 800 and a waveguide as described further herein in reference to FIGS. 5A-5C. Active regions 850 can emit light into such aligned waveguides in the foreground and/or in the background of integrated laser light sources 800 (extending out of the paper in FIG. 1 or into the paper of FIG. 1).

Integrally forming and fabricating photonics devices and laser light sources on a common photonics structure so that a photonics device and an active region of an integrated laser light source are commonly fabricated and disposed within a common photonics dielectric stack facilitates precision alignment between such photonics device and integrated laser light source 800 and alleviates a need for packaging technologies for facilitation of alignment.

Figure 2A:
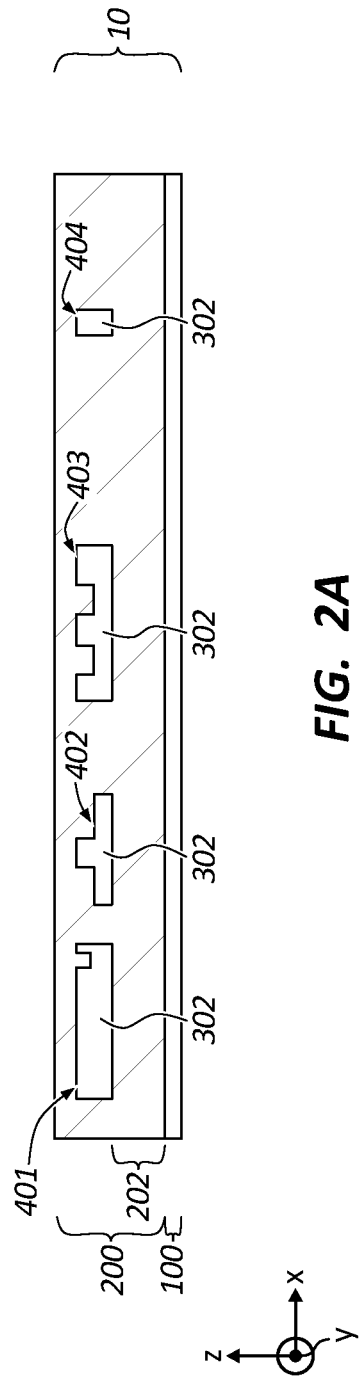
FIGS. 2A-2Q are fabrication stage views illustrating a method for fabrication of the optoelectrical system as shown in FIG. 1 according to one embodiment.

A method for fabrication of optoelectrical system 1000 is set forth with reference to the stage views of FIGS. 2A-2Q. FIG. 2A-2E illustrate fabrication stages for fabrication of photonics structure 10. FIGS. 2F-2K illustrate fabrication stages for fabrication of photonics structure 20.

A method for fabrication of photonics structure 10 is described with reference to the fabrication stage views of FIGS. 2A-2E. In FIG. 2A there is illustrated an intermediary stage view of photonics structure 10. Photonics structure 10 according to one embodiment can be fabricated using a SOI wafer having a substrate 100 formed of silicon (Si), insulator layer 202, and layer 302 formed of silicon. Within layer 302 there can be patterned waveguiding material formation 401 defining photodetector 407. Waveguide 402 provided by a ridge waveguide, waveguiding material formation 403 defining a modulator, and waveguide 404 provided by a rectangular waveguide. On the patterning of formations 401-404 a layer of dielectric material, e.g. $SiO_2$ can be deposited over the formations 401-404 and can be subject to chemical mechanical planarization (CMP) so that a horizontal plane is defined at a depicted top elevation of layer 302. In each instance herein where there is described CMP, the CMP can be accompanied by chemical mechanical polishing so that an atomically smooth horizontally planar surface is yielded as a result of the CMP.

Figure 2B:
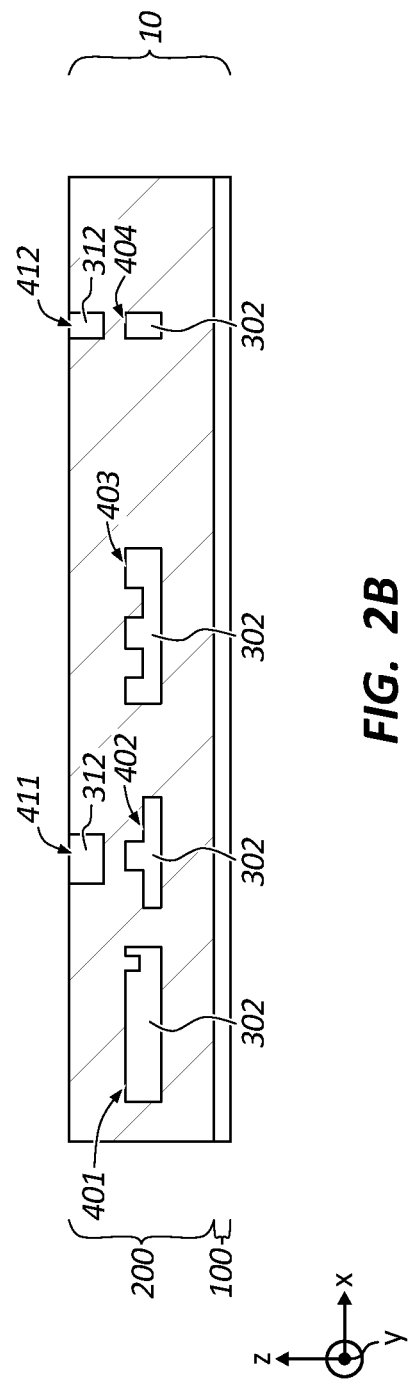

In FIG. 2B there is illustrated photonics structure 10 as shown in FIG. 2A in an intermediary stage of fabrication, after performance of further fabrication processing to define waveguide 411 and waveguide 412. Waveguides 411 and 412 can be formed of silicon nitride. For the formation of waveguides 411 and 412, layer 312 silicon nitride can be deposited at the depicted bottom elevation of layer 312 and can be subject to patterning to define waveguides 411 and 412. Subsequent to the defining of waveguides 411 and 412, by patterning of layer 312, dielectric layer can be deposited over waveguides 411 and 412 and can then be subject to CMP to reduce an elevation of the formed photonics dielectric stack 200 to the depicted top elevation of layer 312 to define a horizontally extending top surface of photonics structure 10 in the intermediary stage of fabrication shown partially defined at the depicted top elevation of layer 312 by dielectric material, e.g. $SiO_2$ and waveguides 411 and 412.

Figure 2C:
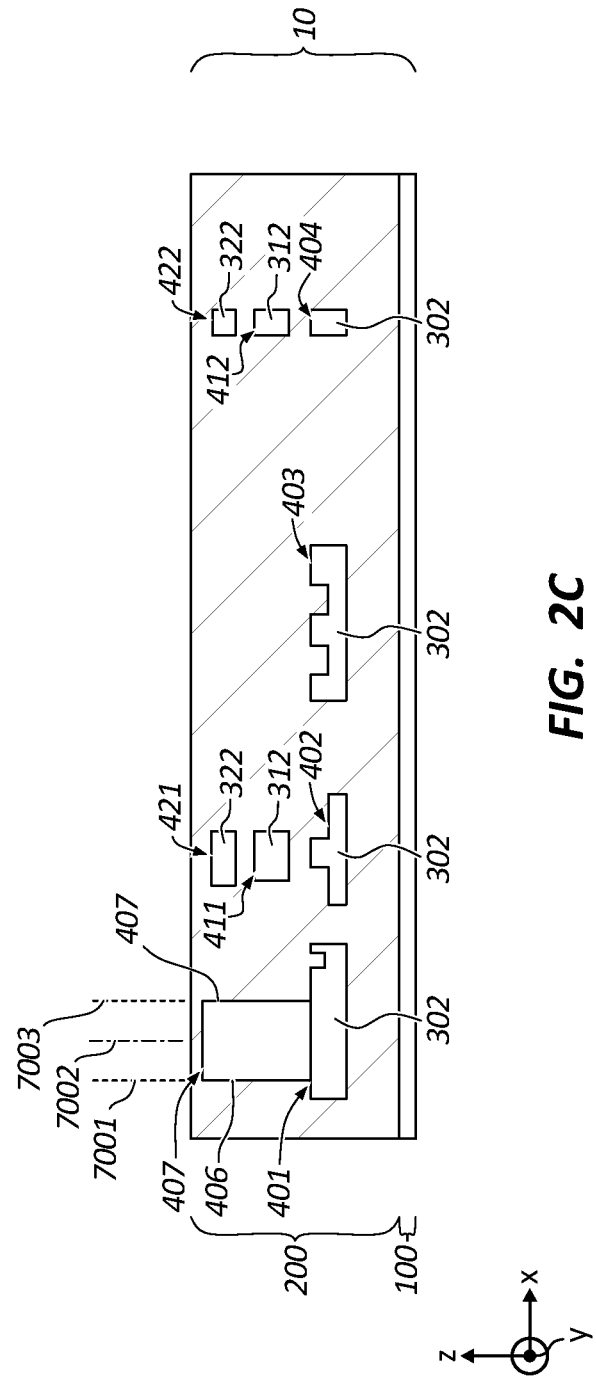

In FIG. 2C there is shown photonics structure 10 as shown in FIG. 2B in an intermediary stage of fabrication after further patterning to define waveguide 421 and waveguide 422. For the fabrication of waveguides 421 and 422 a dielectric layer can be deposited on the planar horizontal surface extending at the depicted top elevation of layer 312 followed by a further CMP process to define a horizontal plane extending at the depicted bottom elevation of layer 322. At the depicted bottom elevation of layer 322 layer 322 can be deposited and then subjected to patterning to defined waveguides 421 and 422. Layer 322 can be subject to CMP prior to the defining of sidewalls of waveguides 421 and 422. On the patterning of waveguides 421 and 422, a layer of dielectric material can be deposited over waveguides and can then be subject to CMP to define a horizontally extending planar surface at the depicted top elevation of photonics dielectric stack 200 as depicted in FIG. 2C.

Figure 2D:
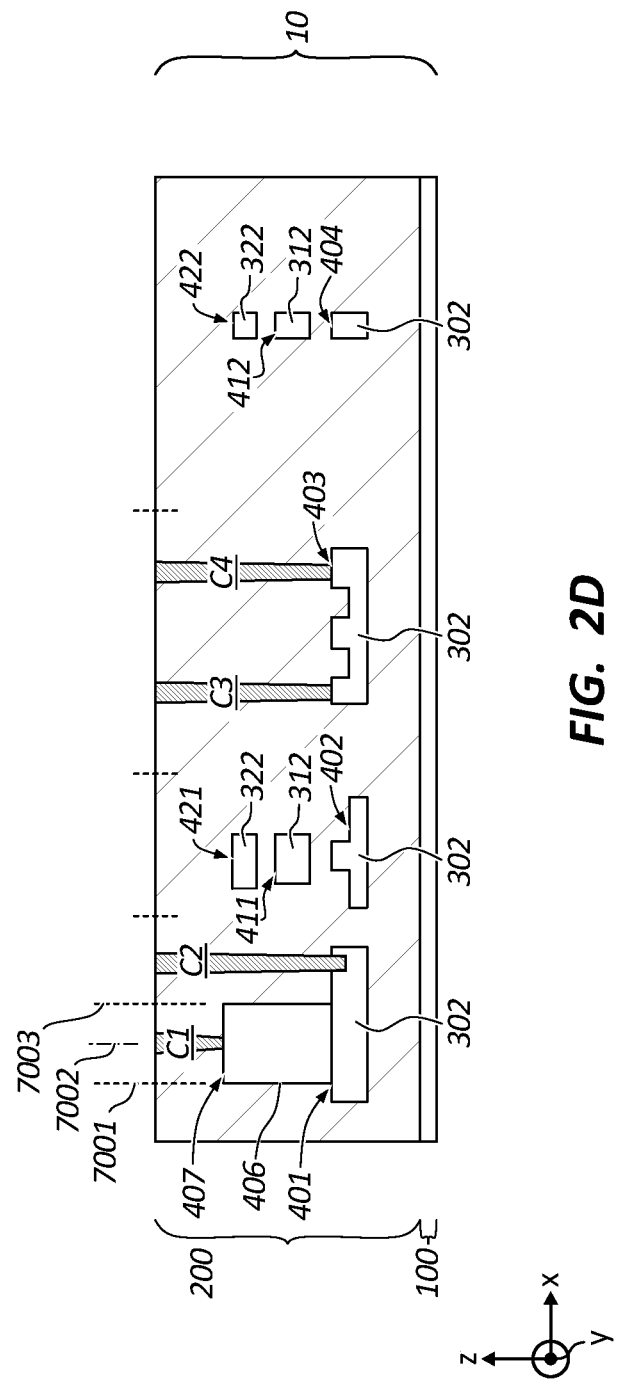

FIG. 2D illustrates photonics structure 10 as shown in FIG. 2C in an intermediary stage of fabrication after further patterning to define light sensitive material formation 406, defining photodetector 407. For the providing of light sensitive material formation 406 a plurality of layers of germanium can be epitaxially grown and annealed in a trench that can be formed by reactive ion etching (RIE). The formed trench can include vertically extending center axis 7002. The formed trench can include a perimeter intersecting vertically extending plane 7001 and vertically extending plane 7003. In one embodiment germanium can be selectively grown using reduced pressure chemical vapor deposition (RPCVD). Multiple epitaxially growing and annealing stages can be used for the formation of light sensitive material formation 406. Multiple depositing and annealing cycles, light sensitive material formation 406, e.g. formed of germanium can initially overflow the defined trench and then can be subject to CMP so that a planar horizontal surface is defined at the depicted top elevation of light sensitive material formation 406.

FIG. 2D illustrates photonics structure 10 shown in FIG. 2C in an intermediary stage of fabrication after performing processes for the fabrication of contact C1-C4. For the formation of contacts C1-C4 contact trenches having vertically extending center axes can be etched in photonics dielectric stack 200. Following the formation of the contact trenches, the contact trenches can be filled with contact conductive material, e.g. conductive metal.

Figure 2E:
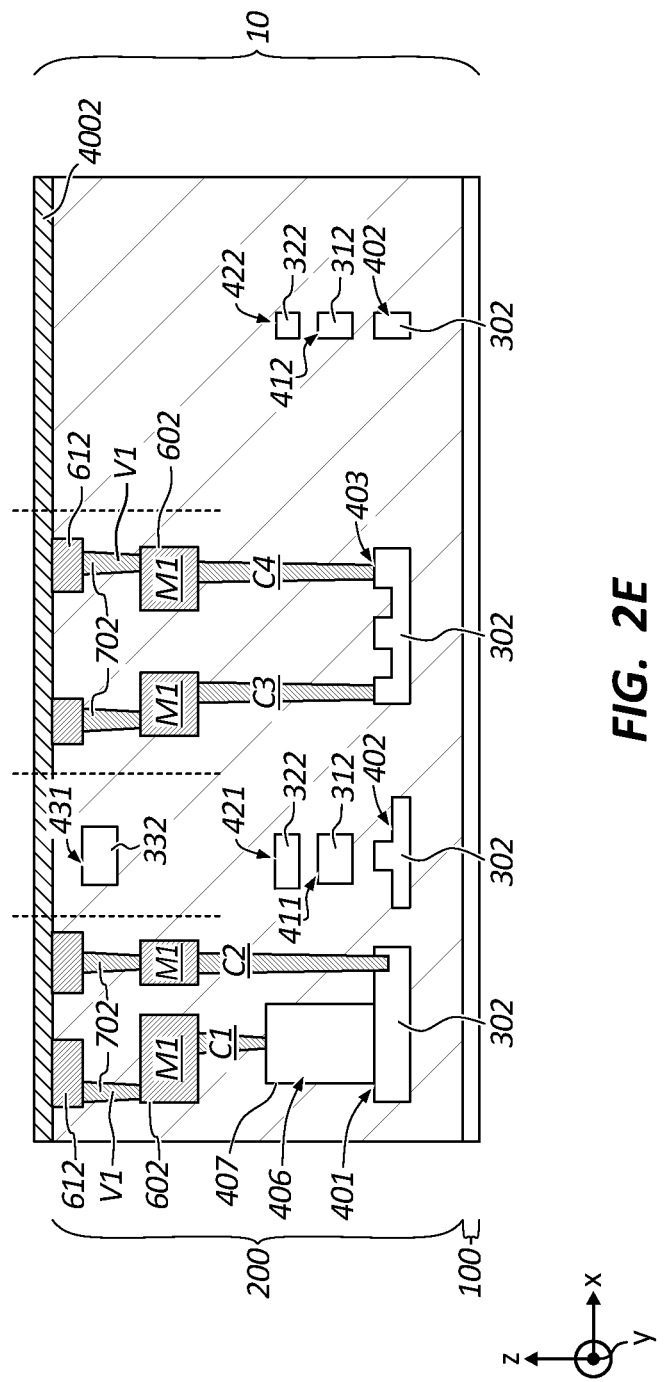

FIG. 2E illustrates photonics structure 10 in an intermediary stage of fabrication as shown in FIG. 2D in an intermediary stage of fabrication subsequent to further processing to define metallization layer 602, vias layer 702, and metallization layer 612. For the formation of metallization layer 602 trenches can be formed in photonics dielectric stack 200 to extend from a bottom elevation defined at the depicted top elevation of contacts C1-C13 to a top elevation defined at the depicted top elevation of metallization layer 602. For the formation of metallization layer 602 metallization formation trenches can be formed to include center axes at the centers of metallization formations M1 shown. The metallization layer trenches can be overfilled with conductive metal material and then subject to CMP to define a planar horizontal surface at the depicted top elevation of metallization layer 602. A dielectric layer can then be deposited and subsect to CMP to increase the elevation of photonics dielectric stack 200 to the depicted top elevation of vias V1 and vias trenches can be formed to include center axes at the vertical centers of respective vias V1 as shown. Waveguide 431 can be formed by depositing and CMP processing of layer 332 to a depicted top elevation of layer 332, and patterning layer 332 which can be formed of silicon nitride. Waveguide 431 can occupy elevations commonly occupied by vias V1. The vias trenches can be overfilled and subject to CMP so that a top elevation of photonics dielectric stack 200 is defined at the depicted top elevation vias V1. Dielectric material, e.g. oxide can be deposited on the horizontal surface defined at the depicted top elevation of vias V1 and then can be subject to CMP to define a horizontal planarized surface at the depicted top elevation of metallization layer 612. Metallization layer trenches can be formed in photonics dielectric stack 200 having metallization layer trench center axes at the center axes of respective metallization formations M2 as shown in FIG. E. The metallization layer trenches can be overfilled and subject to CMP to define horizontally extending planar surface at the depicted top elevation of metallization layer 612.

Then a further layer of dielectric material, e.g. oxide can be deposited on the horizontally extending planar surface at the depicted top elevation of layer 612 which additional layer can be subject to CMP to define a top elevation in the intermediary stage view of photonics dielectric stack 200 at the depicted top elevation of layer 4002.

FIG. 2E illustrates photonics structure 10 as shown in FIG. 2D in an intermediary stage of fabrication after additional processing to increase an elevation of photonics dielectric stack 200. As shown in FIG. 2E subsequent to the formation of light sensitive material formation 406, an additional layer of dielectric material, e.g. $SiO_2$ can be deposited and then subject to CMP to define a horizontal planar top surface of photonics dielectric stack 200 at elevation 610 as shown in FIG. 2E.

Figure 2F:
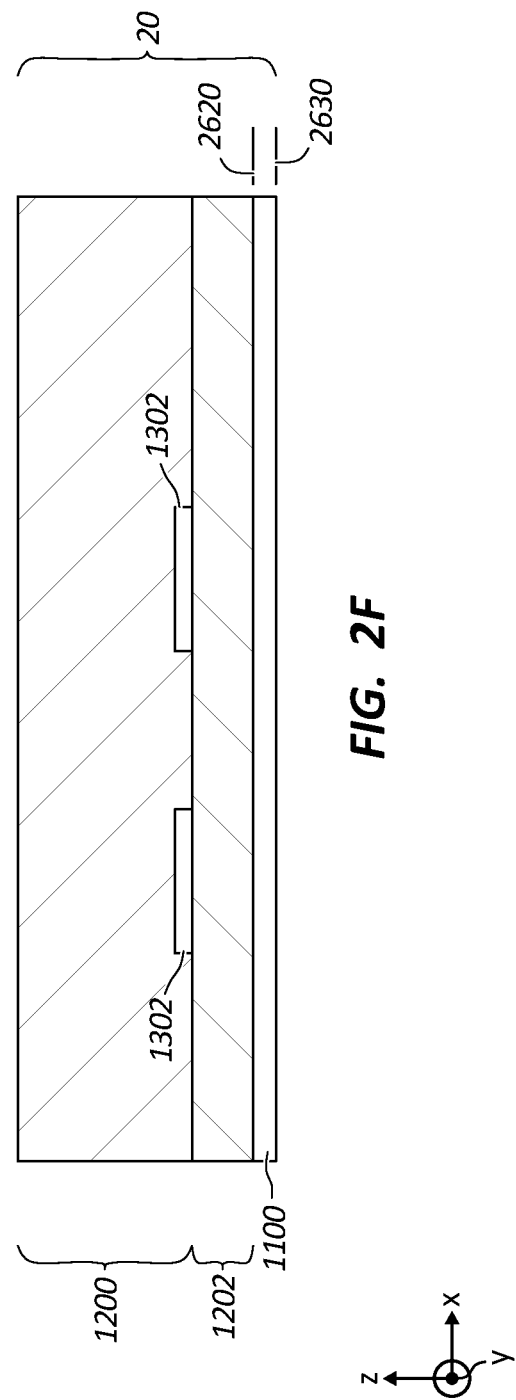

FIG. 2F is a stage view illustrating fabrication of photonics structure 20. Photonics structure 20 can be fabricated using silicon on insulator (SOI) wafer. FIG. 2F illustrates patterning of an SOI wafer. In FIG. 2F there is shown substrate 1100 which can be a substrate of an SOI wafer, layer 1202 which can be provided by an insulator layer of an SOI wafer, and layer 1302 which can be provided by a silicon layer of an SOI wafer. Layer 1302 can be a monocrystalline silicon layer. For fabricating of photonics structure 20 as shown in FIG. 2A, layer 1302 can be patterned to define spaced apart structures as shown in FIG. 2F each formed of silicon. The structures patterned from layer 1302 can define platforms for support of building of laser stack structures as set forth herein. On the patterning of structures within layer 1302 dielectric material can be deposited over the structures and then can be subject to chemical mechanical planarization (CMP) to define a horizontally extending planar surface at the top elevation depicted in the stage view of FIG. 2F.

Figure 2G:
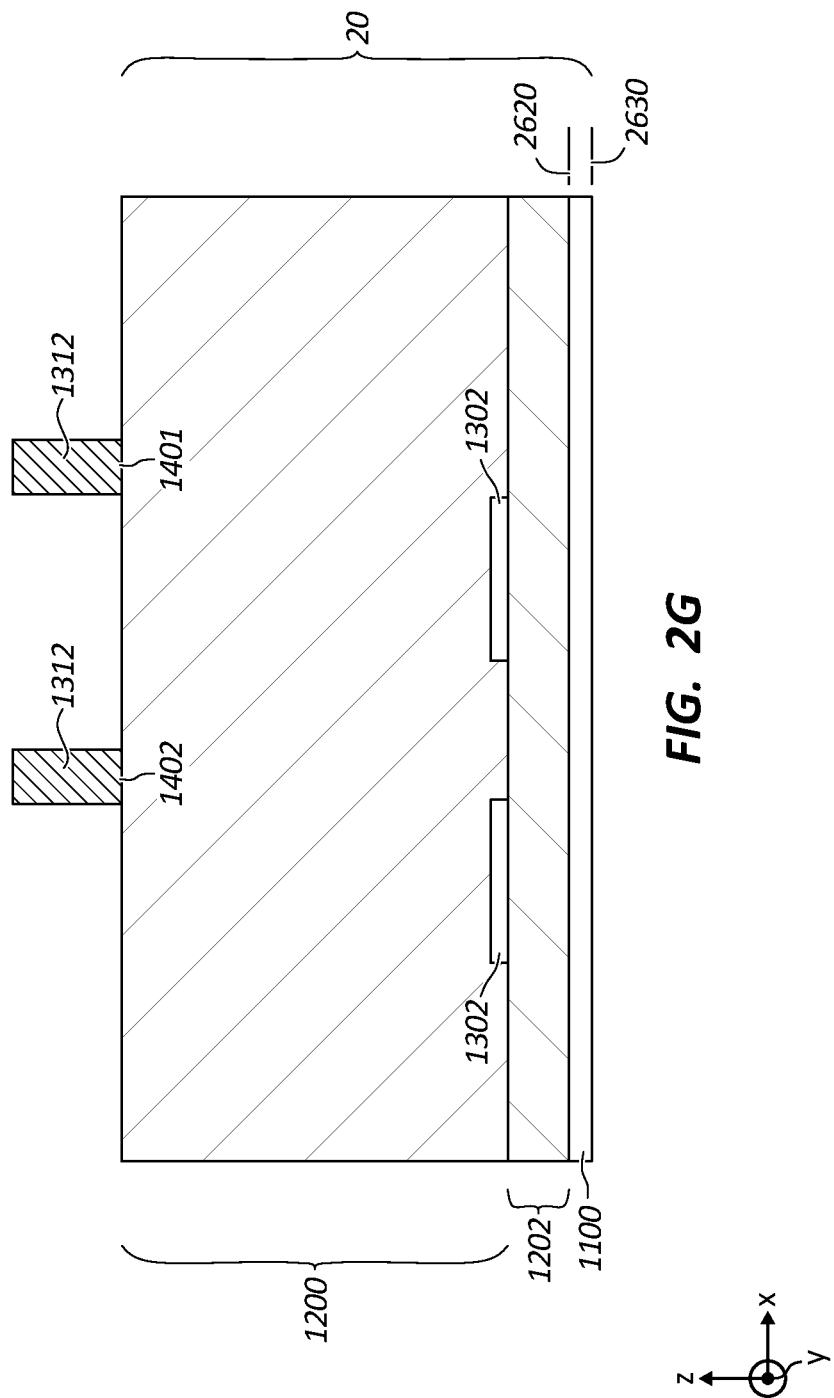

FIG. 2G illustrates photonics structure 20 as depicted in FIG. 2F in an intermediary stage of fabrication after further processing to increase an elevation of photonics dielectric stack 1200 to the top elevation of photonics dielectric stack 1200 depicted in FIG. 2G and to define waveguides, such as waveguides 1401 and 1402. Waveguides 1401 and 1402 can be provided by silicon nitride (SiN) waveguiding material and can be formed by patterning of layer 1312 formed on SiN. Referring to FIG. 2G, dielectric material can be deposited on the planar horizontal surface defined at the top elevation of layer 1202 in FIG. 2F (which can be the insulator layer of an SOI wafer) and then can be subject to CMP to define horizontally extending planar surface at the top elevation of photonics dielectric stack 1200 depicted in FIG. 2G. Layer 1312 can then be deposited at the top elevation of photonics dielectric stack depicted in FIG. 2G and can be subject to CMP so that a top surface of layer 1312 defines a horizontally extending planar surface extending at the depicted top elevation of layer. Layer can then be subject to patterning to define waveguides 1401 and 1402.

Figure 2H:
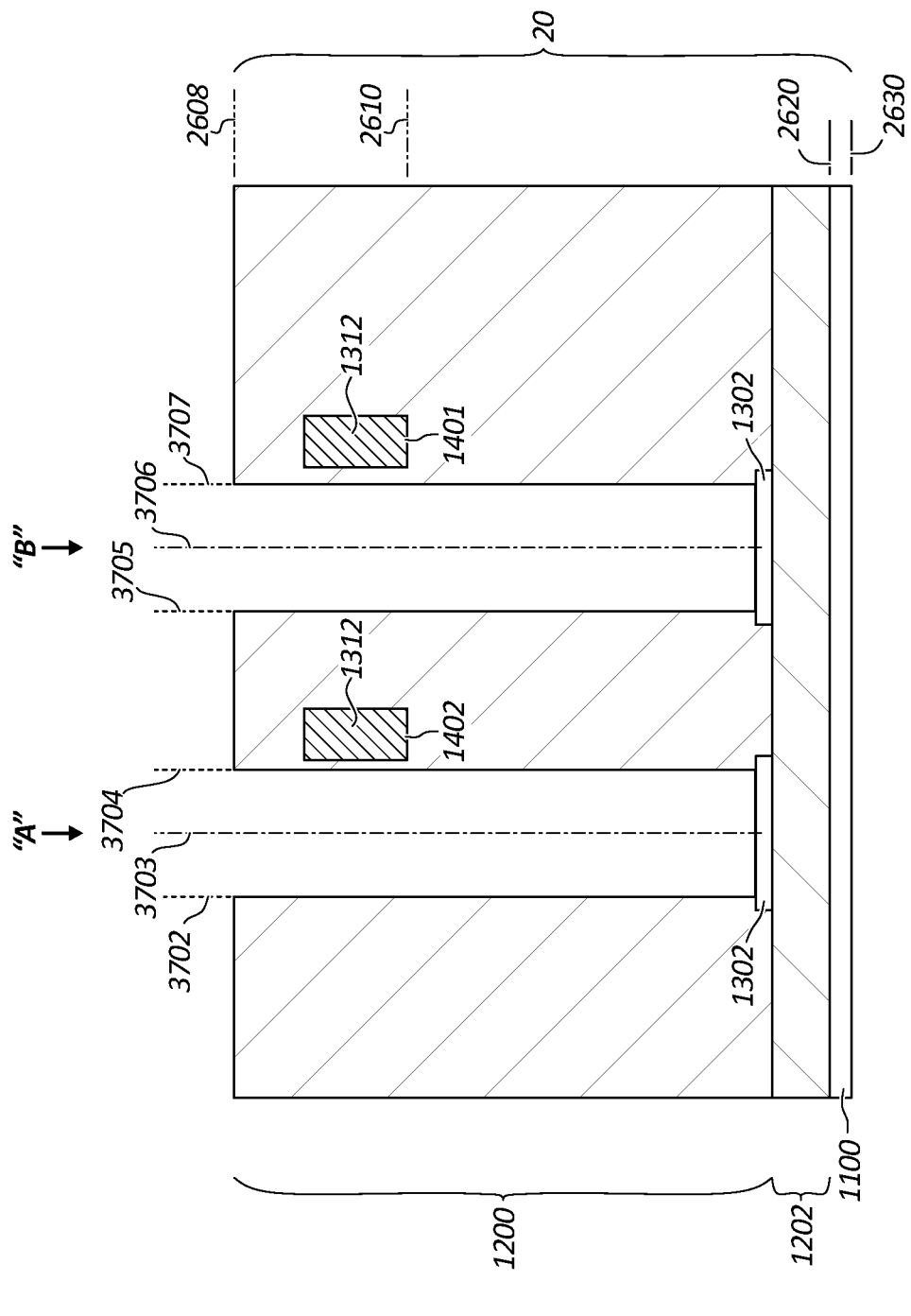
Figure 21:
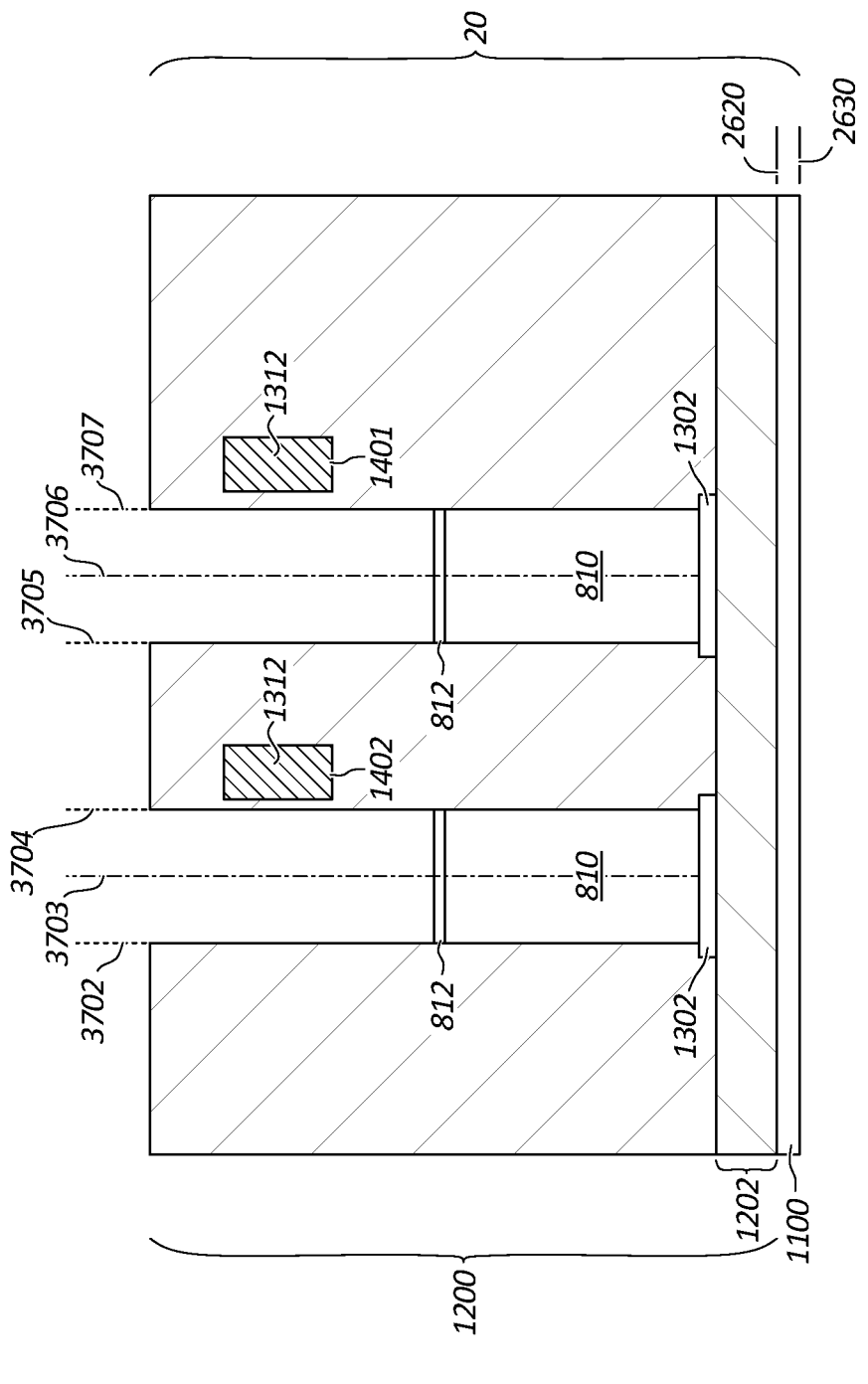

FIG. 2H illustrates photonics structure 20 as depicted in FIG. 2G in an intermediary stage of fabrication after further processing to define laser stack structure trenches. Referring to FIG. 2H additional dielectric material, e.g. oxide and be deposited on a horizontally extending planar surface at elevation 2610 and then can be subject to CMP to define a horizontally extending planar surface at elevation 2608. Then, with photonics dielectric stack 1200 defining a top elevation at elevation 2608 first and second laser stack structure trenches can be formed generally at locations A and B. The first laser stack structure trench can be formed to include vertically extending center axis 3703 and can define a trench perimeter intersecting vertically extending planes 3702 and 3704. A second laser stack structure trench can be formed to include vertically extending center axis 3706 and can define trench sidewalls intersecting vertically extending planes 3705 and 3707.

FIG. 2I illustrates photonics structure 20 as depicted in FIG. 2H in an intermediary stage of fabrication after building of a buffer structure 810 for first and second laser stack structures.

Buffer structure 810 can be epitaxially grown on layer 1302 formed of silicon. Various processes can be performed for fabrication of buffer structure 810. Embodiments herein recognize that a crystalline quality of a gallium arsenide (GaAs) layer can be improved using a germanium (Ge) interlayer (Ge buffer) between GaAs and silicon (Si) based on the observation that a lattice mismatch between GaAs and Ge is only about 0.07% smaller than a mismatch, e.g. about 4.1% between GaAs and Si. Embodiments herein recognize that a thermal expansion coefficient is comparable between GaAs and Ge.

FIGS. 2H and 2I depict photonics devices provided by waveguides 1401 and 1402 being fabricated prior to laser stack structure 802. According to another embodiment, photonics devices such as waveguides 1401 and 1402 can be fabricated subsequent to fabrication (partial fabrication or complete fabrication) of laser stack structure 802. Delaying fabrication of photonics devices according to some embodiments can increase a thermal budget for fabrication of laser stack structure 802 and can reduce degradation to photonics devices that might be incurred by subsequent fabrication processes for fabricating laser stack structure 802. For fabrication of waveguides 1401 and 1402 subsequent to fabrication of laser stack structure 802, photonics dielectric stack 1200 can be subject to etching to reduce an elevation of photonics dielectric stack 1200 after the fabrication of laser stack structure 802 and then a layer of waveguiding material can be deposited at the reduced elevation and subject to patterning for defining waveguides 1401 and 1402. According to one embodiment, laser stack structures 802 can be fabricated to a top elevation of contact structure 812 as depicted in FIG. 2I, then photonics dielectric stack 1200 can be subject to etching and CMP to define a top elevation at the depicted bottom elevation of layer 1312. Then layer 1312 can be deposited, subject to CMP and patterned to define waveguides 1401 and 1402. According, to one embodiment, photonics structure 20 can be absent of any fabricated photonics device when fabricating of laser stack structure 802 is commenced. According, to one embodiment, photonics structure 20 can be absent of any fabricated photonics device when fabricating of laser stack structure 802 is completed.

For epitaxially growing a buffer structure 810, according to one embodiment, a Ge interlayer can be initially epitaxially grown on a silicon substrate. After growing of a Ge interlayer, thermal cyclic annealing of the Ge interlayer can be performed, e.g. at a temperature in a temperature range of from about 750° C. to about 900° C. for about 5 minutes. The Ge interlayer can have a thickness, e.g. of from about 50 nm to about 500 nm. The remainder of buffer structure 810 can be formed by epitaxially growing GaAs, according to one embodiment. Subsequent to performing the III-V epitaxial growth for the formation of buffer structure 810, buffer structure 810 can be subjected to a vaporized hydrogen fluoride (HF) clean and a thermal bake to remove a native oxide layer.

Laser stack structures 802 can include a plurality of epitaxially grown layers. Laser stack structure 802 can include buffer structure 810, contact structure 812, cladding structure 820A, active region 850, cladding structure 820B, and contact structure 814. Cladding structure 820A and cladding structure 820B can be epitaxially grown so that cladding structure 820A and cladding structure 820B confine light within active region 850. Active region 850 according to one embodiment can include a plurality of thin layers, e.g. under 50 nm layers, formed of e.g. indium arsenide (InAs) and/or GaAs. According to one embodiment active region 850 can include alternating layers of InAs and GaAs to define a quantum dot (QD) emitting active region.

Buffer structures 810 can be grown using a multistage growing and annealing process, wherein layers forming buffer structure 810 can be epitaxially grown and then annealed. Material that can be epitaxially grown to form buffer structure 810 include III-V material, e.g. gallium arsenide or gallium phosphide. Prior to the growing of an initial layer of III-V material, a bottom surface of trenches associated with vertically extending center axes 3703 and 3706 can be subject to further treatment, e.g. treatment to clean RIE products and/or treatment to epitaxially grow a thin layer of silicon, e.g. monocrystalline silicon on the silicon surface (monocrystalline defining a bottom of the trenches associated with vertically extending center axes 3703 and 3706). Multiple epitaxially growing and annealing stages can be used for the providing of buffer structures 810. Embodiments herein recognize that when III-V material is epitaxially grown on a silicon surface defining a bottom of the trench, there will be a lattice mismatch which can induce defects. For reduction of defects annealing stages can be used. Buffer structure 810 provides a defect reduced interface for growing of remaining layers of laser stack structure 802.

Buffer structure 810 can be formed of, e.g. gallium arsenide (GaAs) deposited with multiple epitaxially growing and annealing cycles, with annealing cycles being performed for removal of defects to provide a low defect density of buffer structure 810. Buffer structure 810 can include a thickness, e.g. in the range of from about 1000 nm to about 4000 nm according to one embodiment.

Figure 2J:
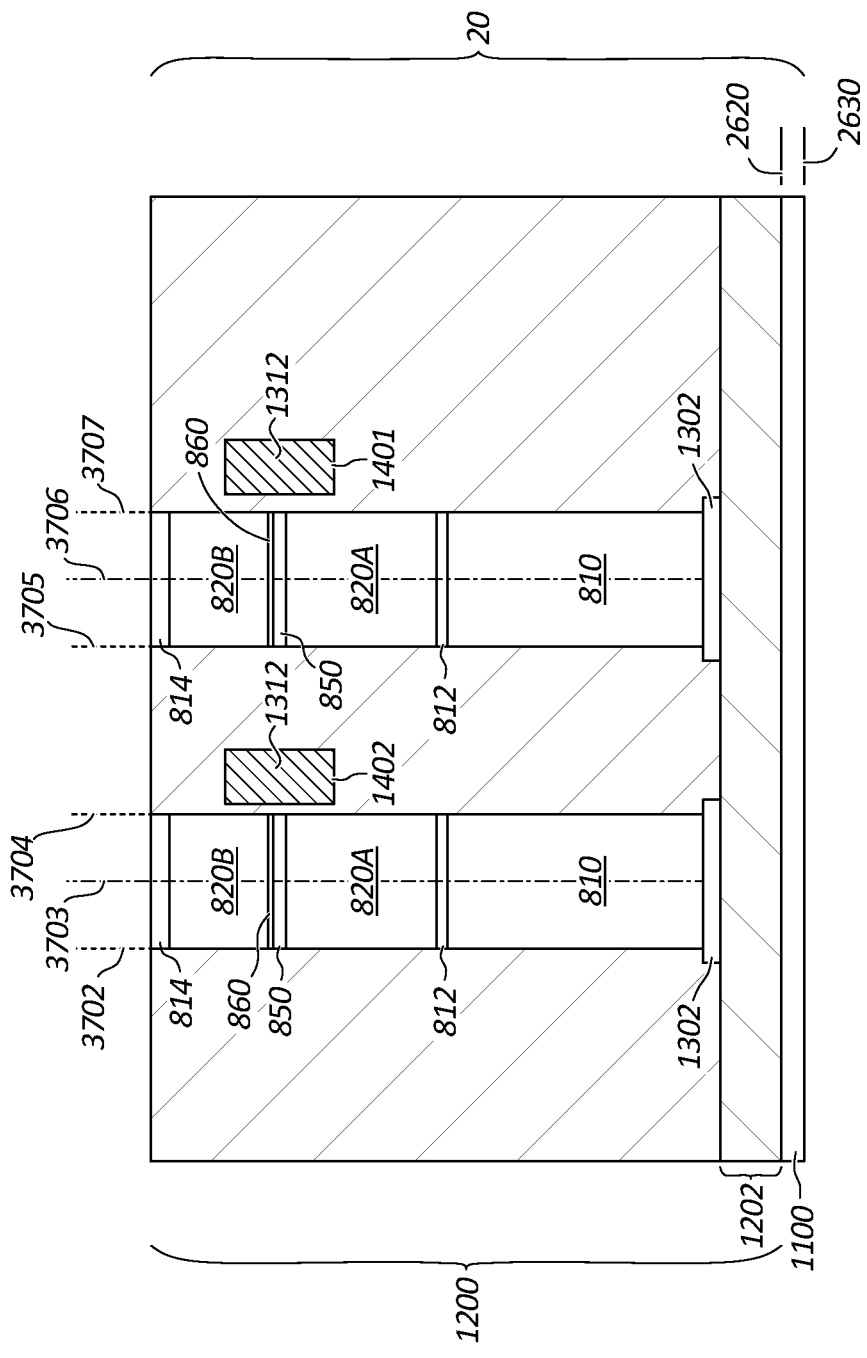

FIG. 2J illustrates photonics structure 20 as depicted in FIG. 2i with additional layers of laser stack structure 802 epitaxially grown. A laser stack structure 802 can include, e.g. buffer structure 810 epitaxially grown on layer 1302 formed of silicon, contact structure 812 epitaxially grown on buffer structure 810, cladding structure 820A epitaxially grown on contact structure 812, active region 850 epitaxially grown on cladding structure 820A, mode selection structure 860 epitaxially grown on active region, cladding structure 820B epitaxially grown on mode selection structure 860 and contact structure 814 epitaxially grown on cladding structure 820B.

Laser stack structures 802 can include a plurality of epitaxially grown layers. Laser stack structure 802 can include buffer structure 810, contact structure 812, cladding structure 820A, active region 850, mode selection structure 860, cladding structure 820B, and contact structure 814. Cladding structure 820A and cladding structure 820B can be epitaxially grown so that cladding structure 820A and 820B confine light within active region 850.

Active region 850 according to one embodiment can include a plurality of thin, e.g. from about 3 nm to about 50 nm layers, formed of e.g. indium arsenide (InAs) and/or GaAs. According to one embodiment, active region 850 can include alternating layers of InAs and GaAs to define a quantum dot (QD) emitting laser active region.

Various deposition technologies can be utilized for the epitaxial growth of structures 810, 812, 820A, 850, 860, 820B, 814

According to one embodiment epitaxially grown structures 810, 812, 820A, 850, 860, 820B, 814 can be epitaxially grown using metal organic chemical vapor deposition (MOCVD). According to one embodiment, the various structures 810, 812, 820A, 850, 860, 820B, 814 can be epitaxially grown using MOCVD at one or more temperature within a temperature range of from about 550° C. to about 750° C. According to one embodiment epitaxially grown structures 810, 812, 820A, 850, 860, 820B, 814 can be epitaxially grown using metal organic chemical vapor deposition (MOCVD).

According to one embodiment, structures 810, 812, 820A, 850, 860, 820B, 814 can be epitaxially grown using molecular beam epitaxy (MBE). The various structures can be epitaxially grown at one or more temperature within a temperature range of from about 500° C. to about 700° C. according to one embodiment.

According to one embodiment a fabrication temperature for fabricating structures of laser stack structure 801 can be reduced for the deposition of active region 850 and ensuing structures. Embodiments herein recognize that active region 850 can be subject to performance degradation by post deposition processes at higher temperatures. Accordingly, for protecting active region 850 conditions for fabrication of laser stack structure 802 can be controlled so that a temperature (e.g. deposition temperature and/or annealing temperature) for fabrication of active region 850 and ensuing structures, namely structures 860, 820B, 814 can be reduced relative to fabrication temperatures for fabrication of preceding structures, namely structures 810, 812, 820A. According to one embodiment, a thermal budget temperature limit for fabricating upper laser stack structures 850, 860, 820B, 814 can be established to be at least about N° C. less than a thermal budget temperature limit for fabricating lower laser stack structures 810, 812, 820A. According to one embodiment N=10; according to one embodiment, N=20; according to one embodiment, N=30; according to one embodiment, N=40; according to one embodiment, N=50; according to one embodiment, N=60; according to one embodiment, N=70; according to one embodiment, N=80; according to one embodiment, N=90; according to one embodiment, N=100.

For example, the deposition temperature for epitaxially growing of the structures of laser stack structure 802 may be reduced for the fabrication of active region 850 and ensuing structures so that structures, 850, 860, 820B, 814 are epitaxially grown and annealed (where applicable) so as not to degrade active region 850. According to one embodiment, MOCVD can be used for the epitaxially growing of structures 810, 812, 820A and MBE can be used for the epitaxially growing of structures 850, 860, 820B, and 814.

According to one embodiment, the described MBE epitaxially growing stages for growing structures 850, 860, 820B, and 814 can be performed at lower temperatures than the described MOCVD epitaxial growing stages of growing structures 810, 812, 820A. According to one embodiment, structures 810, 812, 820A can be fabricated using MOCVD at one or more temperature within a first temperature range of from about 550° C. to about 750° C. and structures 850, 860, 820B, and 814 can be epitaxially grown using MBE at a second temperature range with a highest temperature used in the second temperature range (the thermal budget temperature limit) being at least about N° C. less than a highest temperature used in the first temperature range, where N is one of the specified values specified hereinabove. According to one embodiment, structures 810, 812, 820A can be fabricated using MOCVD at one or more temperature within a first temperature range of from about 500° C. to about 850° C. and structures 850, 860, 820B, and 814 can be epitaxially grown using MBE at a second temperature range with a highest temperature used in the second temperature range (the thermal budget temperature limit) being at least about N° C. less than a highest temperature used in the first temperature range, where N is one of the specified values specified hereinabove. According to one embodiment, structures 810, 812, 820A can be fabricated using MOCVD at one or more temperature within a first temperature range of from about 50° C. to about 950° C. and structures 850, 860, 820B, and 814 can be epitaxially grown using MBE at a second temperature range with a highest temperature used in the second temperature range (the thermal budget temperature limit) being at least about N° C. less than a highest temperature used in the first temperature range, where N is one of the specified values specified hereinabove. According to one embodiment, structures 810, 812, 820A can be epitaxially grown using MOCVD at a first temperature and structures 850, 860, 820B, and 814 can be epitaxially grown using MBE at a second temperature, the second temperature being at least about N° C. less than the first temperature, where N is one of the specified values specified hereinabove.

Embodiments herein recognize that active region 850 an be subject to performance degradation by processes at higher temperatures. Accordingly, conditions for fabrication of laser stack 802 can be controlled so that a temperature for fabrication of active region 850 and ensuing structures can be reduced. For example, according to one embodiment, the temperature for epitaxially growing (and annealing where applicable) of the structures of laser stack structure 802 may be reduced for the formation of active region 850 and ensuing structures so that structures 860, 820B, and 814 epitaxially grown subsequent to the formation of active region 850 are fabricated at temperatures of at least about 25° C. less than a highest temperature used for fabricating structures preceding active region 850. The active region 850 can be epitaxially grown in a temperature range of from about 475° C. to about 525° C. according to one embodiment and can be epitaxially grown using MOCVD or MBE with annealing temperatures in the temperature range of from about 525° C. to about 600° C. According to one embodiment, MOCVD can be used for the formation of structures 810, 812 and 820A and MBE can be used for the epitaxially growing of structures 850, 860, 820B, and 814.

For growing of laser stack 810, temperature budgets can be applied. A lower stack temperature budget can be applied for the fabrication of structures below active region 850, namely structures 810, 812, and 820A. According to one embodiment the lower stack thermal budget temperature limit can be established to be about 1000° C. so that deposition and annealing temperatures for the fabrication of structures below active region 850, namely, structures 810, 812, and 820A does not exceed about 1000° C. According to one embodiment the lower stack thermal budget temperature limit can be established to be about 950° C. so that deposition and annealing temperatures for the fabrication of structures below active region 850, namely, structures 810, 812, and 820A does not exceed about 950° C. According to one embodiment the lower stack thermal budget temperature limit can be established to be about 850° C. so that deposition and annealing temperatures for the fabrication of structures below active region 850, namely, structures 810, 812, and 820A does not exceed about 850° C. According to one embodiment the lower stack thermal budget temperature limit can be established to be about 750° C. so that deposition and annealing temperatures for the fabrication of structures below active region 850, namely, structures 810, 812, and 820A does not exceed about 750° C. According to one embodiment the lower stack thermal budget temperature limit can be established to be about 700° C. so that deposition and annealing temperatures for the fabrication of structures below active region 850, namely, structures 810, 812, and 820A does not exceed about 700° C. According to one embodiment the lower stack thermal budget temperature limit can be established to be about 650° C. so that deposition and annealing temperatures for the fabrication of structures below active region 850, namely, structures 810, 812, and 820A does not exceed about 650° C. According to one embodiment the lower stack thermal budget temperature limit can be established to be about 625° C. so that deposition and annealing temperatures for the fabrication of structures below active region 850, namely, structures 810, 812, and 820A does not exceed about 625° C. According to one embodiment the lower stack thermal budget temperature limit can be established to be about 600° C. so that deposition and annealing temperatures for the fabrication of structures below active region 850, namely, structures 810, 812, and 820A does not exceed about 600° C. According to one embodiment the lower stack thermal budget temperature limit can be established to be about 580° C. so that deposition and annealing temperatures for the fabrication of structures below active region 850, namely, structures 810, 812, and 820A does not exceed about 580° C.

An upper stack temperature budget can be applied for the fabrication of structures including and above active region 850, namely structures 850, 860, 820B, and 814. The upper stack temperature budget can be applied for protection of active region 850. According to one embodiment the upper stack thermal budget temperature limit can be established to be about 650° C. so that deposition and annealing temperatures for the fabrication of structures including and above active region 850, namely, structures 850, 860, 820B, and 814 does not exceed about 650° C. According to one embodiment the upper stack thermal budget temperature limit can be established to be about 625° C. so that deposition and annealing temperatures for the fabrication of structures including and above active region 850, namely, structures 850, 860, 820B, and 814 does not exceed about 625° C. According to one embodiment the upper stack thermal budget temperature limit can be established to be about 600° C. so that deposition and annealing temperatures for the fabrication of structures including and above active region 850, namely, structures 850, 860, 820B, and 814 does not exceed about 600° C. According to one embodiment the upper stack thermal budget temperature limit can be established to be about 575° C. so that deposition and annealing temperatures for the fabrication of structures including and above active region 850, namely, structures 850, 860, 820B, and 814 does not exceed about 575° C. According to one embodiment, the upper stack thermal budget temperature limit can be established to be lower that the lower stack thermal budget temperature limit.

Embodiments herein recognize that fabrication temperatures (e.g. for deposition and/or annealing) for fabrication of lower stack structures 810, 812, and 820A can exceed a thermal budget temperature limit for fabrication of upper stack structures 850, 860, 820B, and 814. According to one embodiment lower stack structures 810, 812, and 820A of laser stack structure 820 can be fabricated with a minimal count of photonics devices 1401 and 1402 previously integrally formed and fabricated within dielectric stack 1200. According to one embodiment lower stack structures 810, 812, and 820A of laser stack structure 820 can be fabricated with a zero count of photonics devices 1401 and 1402 previously integrally formed and fabricated within dielectric stack 1200. For example, according to one embodiment photonics devices 1401 and 1402 can be fabricated subsequent to the fabrication (e.g. partial fabrication or full fabrication) of laser stack structures 802.

Employing high temperature fabrication processes for fabrication of laser stack structure 810 (including lower stack structures 810, 812, and 820A) can provide various advantages. According to one embodiment, buffer structure 810 can be fabricated with use of an annealing process for annihilation of defects using an annealing temperature of at least about 950° C. According to one embodiment, buffer structure 810 can be fabricated with use of an annealing process for annihilation of defects using an annealing temperature of at least about 900° C. According to one embodiment, buffer structure 810 can be fabricated with use of an annealing process for annihilation of defects using an annealing temperature of at least about 850° C. According to one embodiment, buffer structure 810 can be fabricated with use of an annealing process for annihilation of defects using an annealing temperature of at least about 800° C. According to one embodiment, buffer structure 810 can be fabricated with use of an annealing process for annihilation of defects using an annealing temperature of at least about 750° C. According to one embodiment, buffer structure 810 can be fabricated with use of an annealing process for annihilation of defects using an annealing temperature of at least about 725° C. According to one embodiment, buffer structure 810 can be fabricated with use of a silicon seed layer thermal bake treatment process for removal of native oxide using a thermal bake temperature of at least about 950° C. According to one embodiment, buffer structure 810 can be fabricated with use of a silicon seed layer thermal bake treatment process for removal of native oxide using a thermal bake temperature of at least about 900° C. According to one embodiment, buffer structure 810 can be fabricated with use of a silicon seed layer thermal bake treatment process for removal of native oxide using a thermal bake temperature of at least about 850° C. According to one embodiment, buffer structure 810 can be fabricated with use of a silicon seed layer thermal bake treatment process for removal of native oxide using a thermal bake temperature of at least about 800° C. According to one embodiment, buffer structure 810 can be fabricated with use of a silicon seed layer thermal bake treatment process for removal of native oxide using a thermal bake temperature of at least about 750° C. According to one embodiment, buffer structure 810 can be fabricated with use of a silicon seed layer thermal bake treatment process for removal of native oxide using a thermal bake temperature of at least about 725° C.

Details of laser stack structure 802 according to one embodiment are set forth in reference to Table A. Each structure of structures 810, 812, 820A, 850, 860, 820B, and 814 can be provided by a layer which can include sublayers.

TABLE A

| Structure | Description, materials and process conditions |
| --- | --- |
| buffer structure 810 | Buffer structure 810 can be provided by a III-V layer designed to accommodate the antiphase domain defects and the lattice mismatch that exist between the silicon substrate and the III-V material. Buffer structure 810 can be grown to a thickness that will limit the surface defect to less than 1.0E7 cm^-3. Buffer structure 810 according to one embodiment can include a low temperature seed layer, followed by an intermediate temperature layer, followed by a high temperature layer. The low temperature seed layer can include e.g. GaAs, AlAs or GaP; thickness from about 3 nm to about 20 nm; deposition temperature of from about 380 C. to about 500 C. The intermediate temperature layer can include e.g. GaAs, or GaP; thickness from about 200 nm to about 500 nm; deposition temperature of from about 500 C. to about 600 C. The high temperature layer can include e.g. GaAs or GaInP; thickness of from about 2500 nm to about 3000 nm; deposition temperature of from about 600 C. to about 700 C. plus temperature cycling using temperature in the range of from about 500 C. to about 750 C. range. Buffer structure 810 can be epitaxially grown using MBE and/or MOCVD. |
| contact structure 812 | Contact structure 812 can be a highly doped layer for ohmic contact formation. Contact structure 812 can be formed of GaAs doped with Si to form an n-type contact layer. Contact structure 812 can have a thickness of from about 300 nm to about 500 nm. Deposition temperature can be in a range of from about 550 C. to about 700 C. Contact structure 812 can be epitaxially grown using MBE and/or MOCVD. |
| cladding structure 820A | Cladding structure 820A can have a lower refractive index than the active region and therefore can facilitate confinement of light within the active region. Also, this layer separates the laser light from the contact layers. Overall, this layer help to keep optical loss to a minimum and help with injection election to the active region 850. Cladding structure 820A can be lightly n-doped. Materials can include e.g. AlGaAs, GaInP or AlGaAs/GaInP; Thickness can be from about 1000 nm to about 1500 nm. Deposition temperature can be from about 550 C. to about 700 C. Cladding structure 820A can be epitaxially grown using MBE and/or MOCVD. |
| active region 850 | Active region 850 can be designed to generate light at a wavelength of about 1310 nm or about 1550 nm. According to one embodiment, active region 850 can include of 3 to 7 repeats of embedded quantum dots (QDs), material e.g. InAs QDs separated by a GaAs barrier/spacer. According to one embodiment, active region 850 can include of 3 to 7 repeats of embedded quantum wells (QWs), material e.g. InGaAs separated by a GaAs barrier/spacer. According to one embodiment, the active region 850 be provided by the DWELL structure and can include N repeats of the following layers: (1) a quantum well barrier layer comprising e.g. InGaAs; thickness about 3 nm; deposition temperature of from about 500 C. to about 650 C.; (2) light emitting quantum dots (QDs) InAs; thickness about 3.0 nm; deposition temperature of from about 480 C. to about 550 C.; (3) a quantum well layer e.g. InGaAs; thickness about 7 nm; deposition temperature of from about 500 C. to about 650 C.; (4) a Spacer/barrier; material GaAs; thickness 30 nm to 50 nm; deposition temperature of from about 500 C. to about 650 C. An anneal cycle using an annealing temperature of from about 550 C. to about 650 C. can follow each layer deposition. Active region 850 can be epitaxially grown using MBE and/or MOCVD. |
| mode selection structure 860 | Mode selection structure 860 can confine light within the active region and can define a distributed feedback (DFB) or distributed Bragg reflector (DBR) grating. The DFB or DBR grating can support the oscillation of light at a desired wavelength. All other potential lasing modes can be suppressed. Mode selection structure 860 can include an undoped layer of e.g. GaAs; thickness can be from about 50 nm to about 100 nm through with the grating will be etched; deposition temperature can be from about 550 C. to about 700 C. Mode selection structure 860 can be epitaxially grown using MBE and/or MOCVD. |
| cladding structure 820B | Cladding structure 820B can feature a lower refractive index than the active region and therefore can facilitate confinement of light within the active region. Also, the layer defined by cladding structure 820B separates the laser light from the contact layers. Overall, this layer helps to keep optical loss to a minimum and help channel holes to the active region. |

TABLE A-continued

| Structure | Description, materials and process conditions |
|---|---|
| | Cladding structure 820B is lightly p-doped. Material can include e.g. AlGaAs, GaInP or AlGaAs/GaInP; thickness can be from about 1000 nm to about 1500 nm; temperature can be from about 550 C. to about 700 C. Cladding structure 820B can be epitaxially grown using MBE and/or MOCVD. |
| contact structure 814 | Contact structure 814 can be highly p-doped for ohmic contact formation. The dopant can include e.g. Zn or C. Material can include e.g. doped GaAs; thickness can be from about 300 nm to about 500 nm; deposition temperature can be from about 550 C. to about 700 C. Contact structure 814 can be epitaxially grown using MBE and/or MOCVD. |

In addition to the structures specified in Table A, a laser stack structure 802 can include a spacer structure between cladding structure 820A and active region 850 which can function to confine light within active region 850. Such a spacer structure can include an undoped layer of e.g. GaAs which can have a thickness of from about 50 nm to about 100 nm. Deposition temperature can be from about 550 C to about 700 C. Mode selection structure 860 can be epitaxially grown using MBE and/or MOCVD.

According to one embodiment, active region 850 can include light emitting quantum dots (QDs), e.g., as defined by layers formed of indium arsenide (InAs). According to another embodiment, active region 850 can include light emitting quantum wells (QWs) as defined by layers formed of indium gallium arsenide phosphide (InGaAsP). Active region 850 can function to promote quantum confinement whether active region 850 includes QDs or QWs. Where quantum confinement is provided using QDs, electrons can easily move in zero (0) dimensions. Thus, QDs can be said to provide 3D quantization. Where quantum confinement is provided using QWs, electrons can easily move in two dimensions. Thus, QWs can be said to provide one-dimensional (1D) quantization.

A summary of deposition and quantization technologies for fabrication of laser stack structure 802 is set forth in Table B.

TABLE B

| Embodiment | Description |
|---|---|
| Embodiment 1 | Active region 850 includes QDs and all structures 810, 812, 820A, 850, 860, 820B, 814 of laser stack structure 802 are epitaxially grown using molecular beam epitaxy (MBE). |
| Embodiment 2 | Active region 850 includes QDs and all structures 810, 812, 820A, 850, 860, 820B, 814 of laser stack structure 802 are epitaxially grown using metal organic chemical vapor deposition (MOCVD). |
| Embodiment 3 | Active region 850 includes QDs. One or more structure of structures 810, 812, 820A, 850, 860, 820B, 814 of laser stack structure 802 is epitaxially grown using molecular beam epitaxy (MBE), and one or more structure of structures 810, 812, 820A, 850, 820B, 814 of laser stack structure 802 is epitaxially grown using metal organic chemical vapor deposition (MOCVD). |
| Embodiment 4 | Active region 850 includes QWs and all structures 810, 812, 820A, 850, 860, 820B, 814 of laser stack structure 802 are epitaxially grown using molecular beam epitaxy (MBE). |

TABLE B-continued

| Embodiment | Description |
|---|---|
| Embodiment 5 | Active region 850 includes QWs and all structures 810, 812, 820A, 850, 860, 820B, 814 of laser stack structure 802 are epitaxially grown using metal organic chemical vapor deposition (MOCVD). |
| Embodiment 6 | Active region 850 includes QWs. One or more structure of structures 810, 812, 820A, 850, 860, 820B, 814 of laser stack structure 802 is epitaxially grown using molecular beam epitaxy (MBE), and one or more structure of structures 810, 812, 820A, 850, 860, 820B, 814 of laser stack structure 802 is epitaxially grown using metal organic chemical vapor deposition (MOCVD). |

With the input of electrical energy, electrons can be injected into laser stack structure 802. Laser stack structure 802 of each laser light source 800 can be configured to facilitate a flow of electrons through the laser stack structure 802 with a high density of electrons formed in active region 850. The flow of electrons can be facilitated with appropriate electrical energy inputs at bottom contact structure 812 and/or top contact structure 814 made through contacts fabricated as set forth herein. With electrons occupying active region 850 of a laser stack structure 802 can emit light.

As set forth herein voltage can be applied by associated contacts across contact structure 812 and contact structure 814 of each laser stack structure 802. Such an applied voltage induces a flow of electrons through structures 810, 812, 820A, 850, 860, 820B, 814 of a laser stack structure 802. Each active region 850 can include a conduction band and a valance band. Applying a voltage between contact structure 812 and contact structure 814 can assure that an abundance of electrons reside in a conduction band of an active region 850 and can assure that an abundance of holes reside in a valance band of active region 850 to thus provide conditions suitable for the emission of light by active region 850. With the input of electrical energy, electrons can be injected into laser stack structure 802 so that the laser stack structure 802 of each laser light source 800 can be configured to facilitate a flow of electrons through the laser stack structure 802 with a high density of electrons formed in active region 850. The flow of electrons can be facilitated with appropriate electrical energy inputs at bottom contact structure 812 and/or top contact structure 814 made through contacts as are set forth herein. With electrons occupying active region 514 of a laser stack structure 802 the active region emits light.

Cladding structures 820A and 820B of laser stack structure 802 can be configured to aid in the confinement of light within active region 850 and can inhibit light interacting with contact structure 812 and contact structure 814 respectively. For confinement of light within active region 850, each laser stack structure 802 can include a highest index of refraction within active region 850 and can include reduced indices of refraction at spacing distances within laser stack structure 802 increased from active region 850.

Figure 2K:
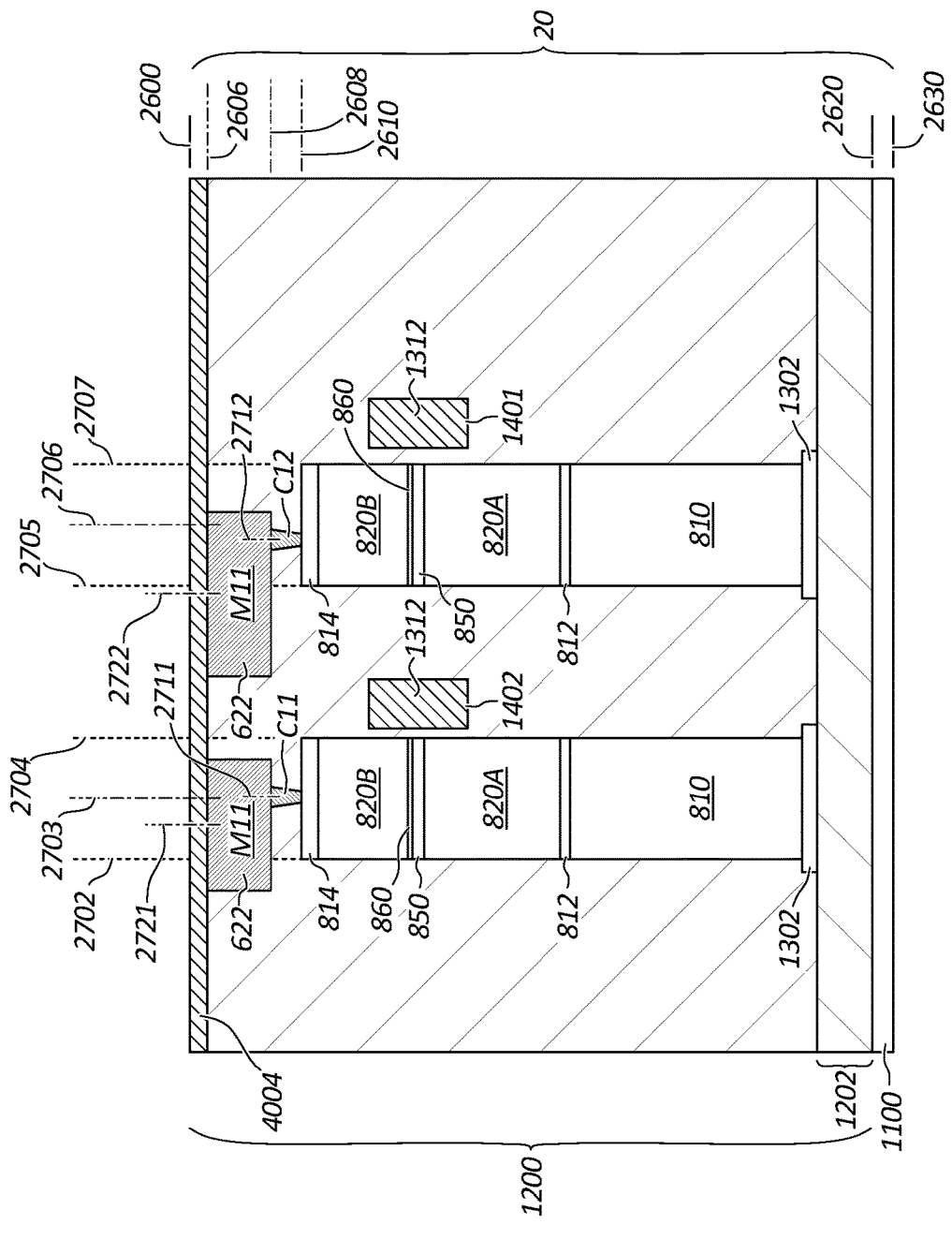

FIG. 2K illustrates photonics structure 20 as depicted in FIG. 2J in an intermediary stage of fabrication after fabrication to define contacts C11 and C12 and metallization layer 622. Referring to FIG. 2K, additional dielectric material can be deposited on the planar surface defined at elevation 2610 and then can be subject to CMP to define a planar horizontally extending planar surface at elevation 2608. Contact trenches can be formed to have center axes 2711 and 2712 respectively, and the contact trenches can be filled with conductive material and then the structure can be subject to CMP to define horizontally extending planar surface at elevation 2608. Subsequently, additional dielectric material can be deposited and then subject to CMP to define a horizontally extending planar surface at elevation 2606. Metallization formation trenches can then be etched to have center axes 2721 and 2722 respectively. The metallization formation trenches can be filled with conductive material and then subject to CMP to define a horizontally extending planar surface at elevation 2606. Additional dielectric material provided by layer 4004 described further in reference to FIG. 2L can be deposited and then subject to CMP to define a horizontally extending planar surface at elevation 2600.

Figure 2L:
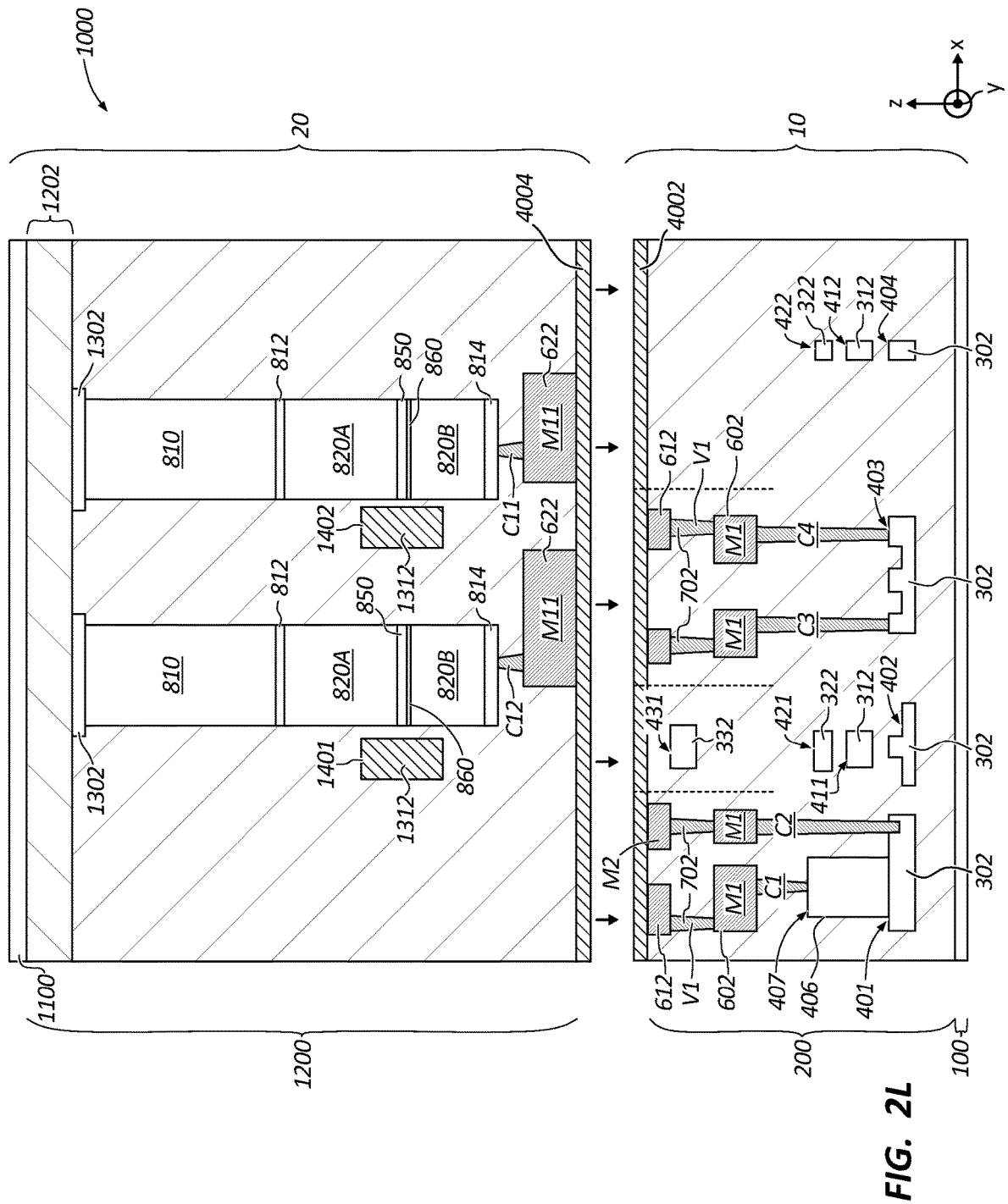
Figure 2M:
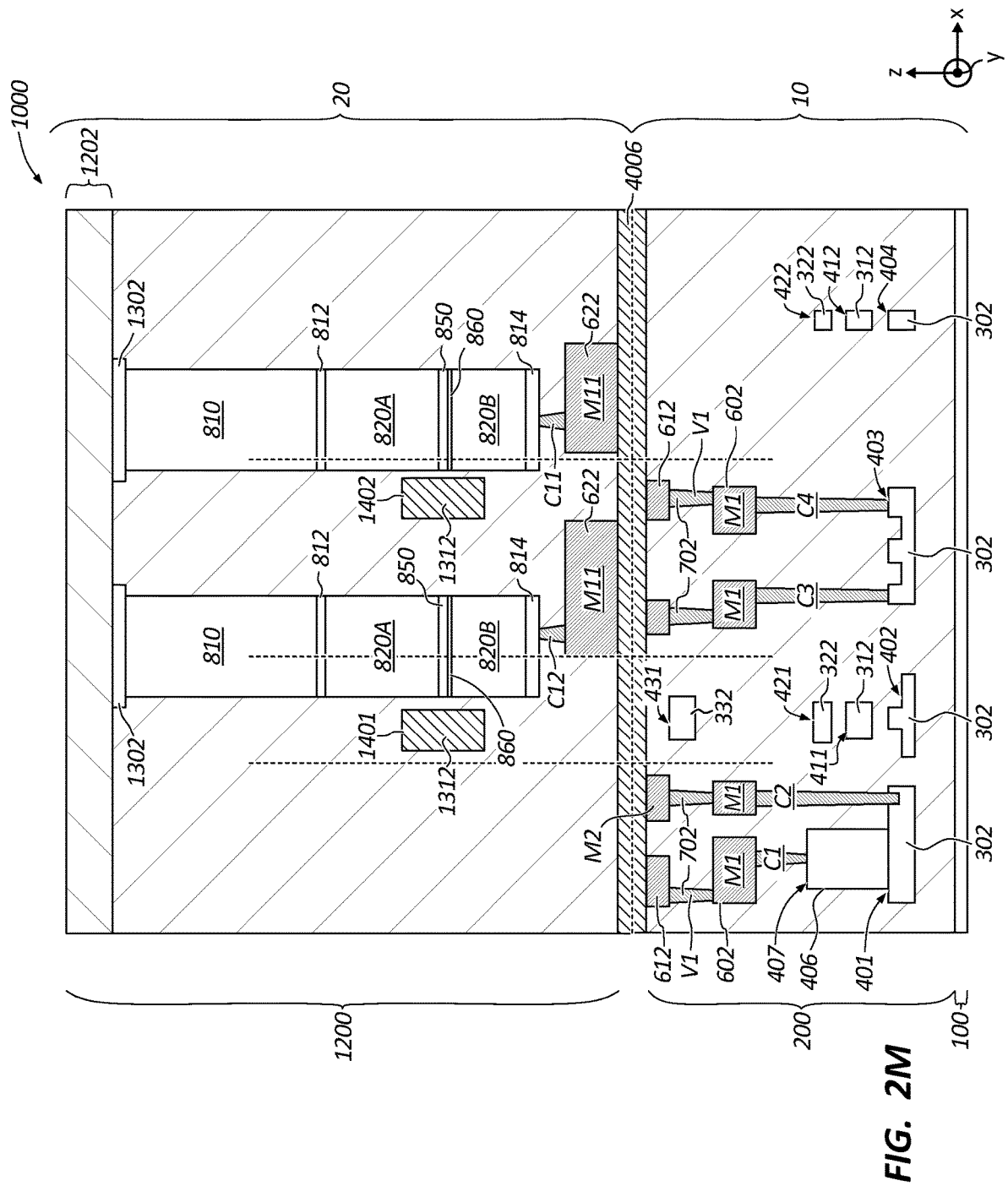

In FIG. 2L there is shown the photonics structure 20 built as described in reference to FIGS. 2F-2K aligned onto photonics structure 10 built as described in reference to the fabrication stage views of FIGS. 2A-2E. Referring to FIGS. 2L and 2M an oxide bonding thermal process is described. Low temperature oxide fusion bonding can be utilized. Low temperature oxide fusion bonding can be performed at lower temperatures, e.g. 300° C. or lower. For performance of low temperature oxide fusion bonding dielectric layers formed of silicon dioxide can be deposited as shown in FIGS. 2L and 2M. Dielectric layer 4002 formed of silicon dioxide can be deposited on photonics dielectric stack 200 of photonics structure 10. Dielectric layer 4004 formed of silicon dioxide can be deposited on photonics dielectric stack 1200 of photonics structure 20. Prior to depositing of layers 4002 and 4004 their respective undersurfaces can be polished, e.g. using CMP to define atomically smooth surfaces to facilitate quality contact for promotion of van der Waals forces. The surfaces of layers 4002 and 4004 after their deposition and smoothing can be treated to define appropriate surface chemistry to promote bonding between the two layers at an atomic level.

FIGS. 2L and 2M illustrate bonding between photonics structure 10 and photonics structure 20. On bonding of photonics structure 20 to photonics structure 10 using low temperature oxide fusion bonding as set forth in references to FIGS. 2L and 2M, the respective photonics structures can be fusion bonded together and can define a bond layer 4006 between photonics dielectric stack 200 of photonics structure 10 and photonics dielectric stack 1200 of photonics structure 20. Bonding of photonics structure 20 to photonics structure 10 as shown in FIGS. 2L and 2M can be completed by an annealing process for annealing the layers 4002 and 4004 to form bond layer 4006 (FIG. 2M) which according to one embodiment can be regarded to be a bond dielectric layer and according to one embodiment can be provided by low temperature oxide fusion bond dielectric layer. According to one embodiment substrate 100 of photonics structure 10 can be provided by a substrate of a first SOI wafer and substrate 1100 of photonics structure 20 can be provided by a substrate of a second SOI wafer.

The fusion bonding depicted in FIGS. 2L and 2M can be performed on a wafer scale wherein each of photonics structure 10 and photonics structure 20 depicts a wafer scale structure in wafer scale structure form prior to wafer dicing. Each wafer structure defined respectively by photonics structure 10 and photonics structure 20 according to one embodiment, can be provided by a 300 mm wafer structure. A wafer bonder such as a 300 mm wafer bonder can be used for completion of bonding of photonics structure 20 to photonics structure 10 as depicted in FIGS. 2L and 2M.

Wafer scale bonding as depicted in FIGS. 2L and 2M can be performed with the thicknesses of substrate 100 of photonics structure 10 and substrate 1100 of photonics structure 20 being preserved to their full thicknesses, e.g. having thicknesses of about 775 microns. Thus, the wafer scale bonding as depicted in FIGS. 2L and 2M can be performed with low risk of wafer breakage and can be carried out without use of handle wafers. FIGS. 2N-2Q depict further processing stages that can be performed subsequent to wafer scale bonding of photonics structure 20 to photonics structure 10 as depicted in FIGS. 2L and 2M. Wafer scale boding herein according to one embodiment can refer to the bonding of first and second wafer scale structures that are of wafer scale by virtue of their being a pre-diced stage.

With photonics structure 20 bonded to photonics structure 10 substrate 1100 of photonics structure 20 can be removed. The majority of an original thickness of substrate 1100 (FIG. 2L) can be removed with use of a grinding process which can stop at a predetermined distance, e.g. about 10 microns from a top elevation of photonics dielectric stack 1200 of photonics structure 20. A relatively thin, e.g. 10 microns thickness portion of substrate 1100 remaining where substrate 1100 is formed of the silicon the remaining portion of substrate 1100 can be removed, e.g. via reactive ion etching (RIE). The RIE can be selective to silicon (where substrate 1100 is formed of silicon) so that silicon material of substrate 1100 can be removed without removal of dielectric material of photonics dielectric stack 1200 of photonics structure 20.

Figure 2N:
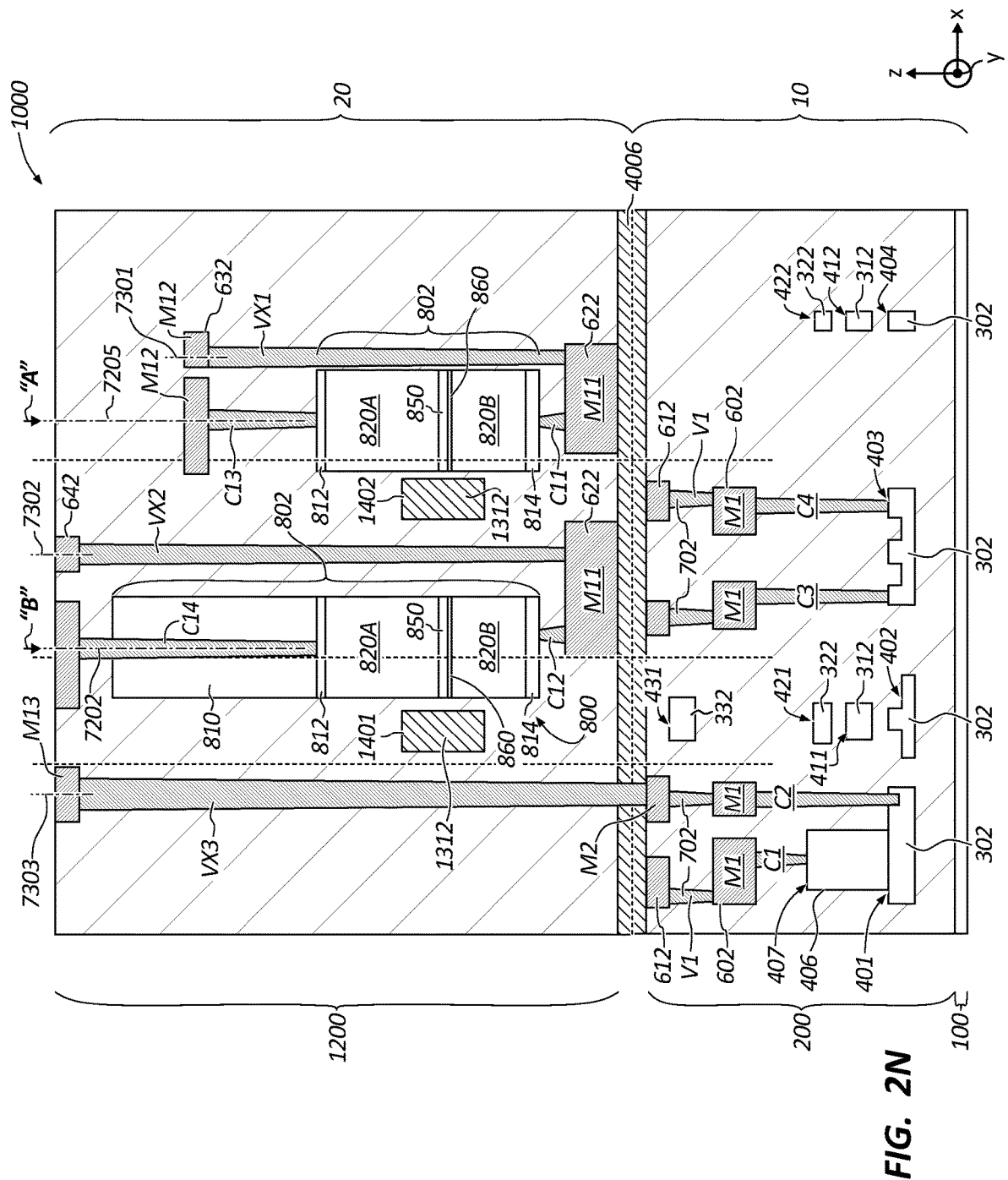
Figure 20:
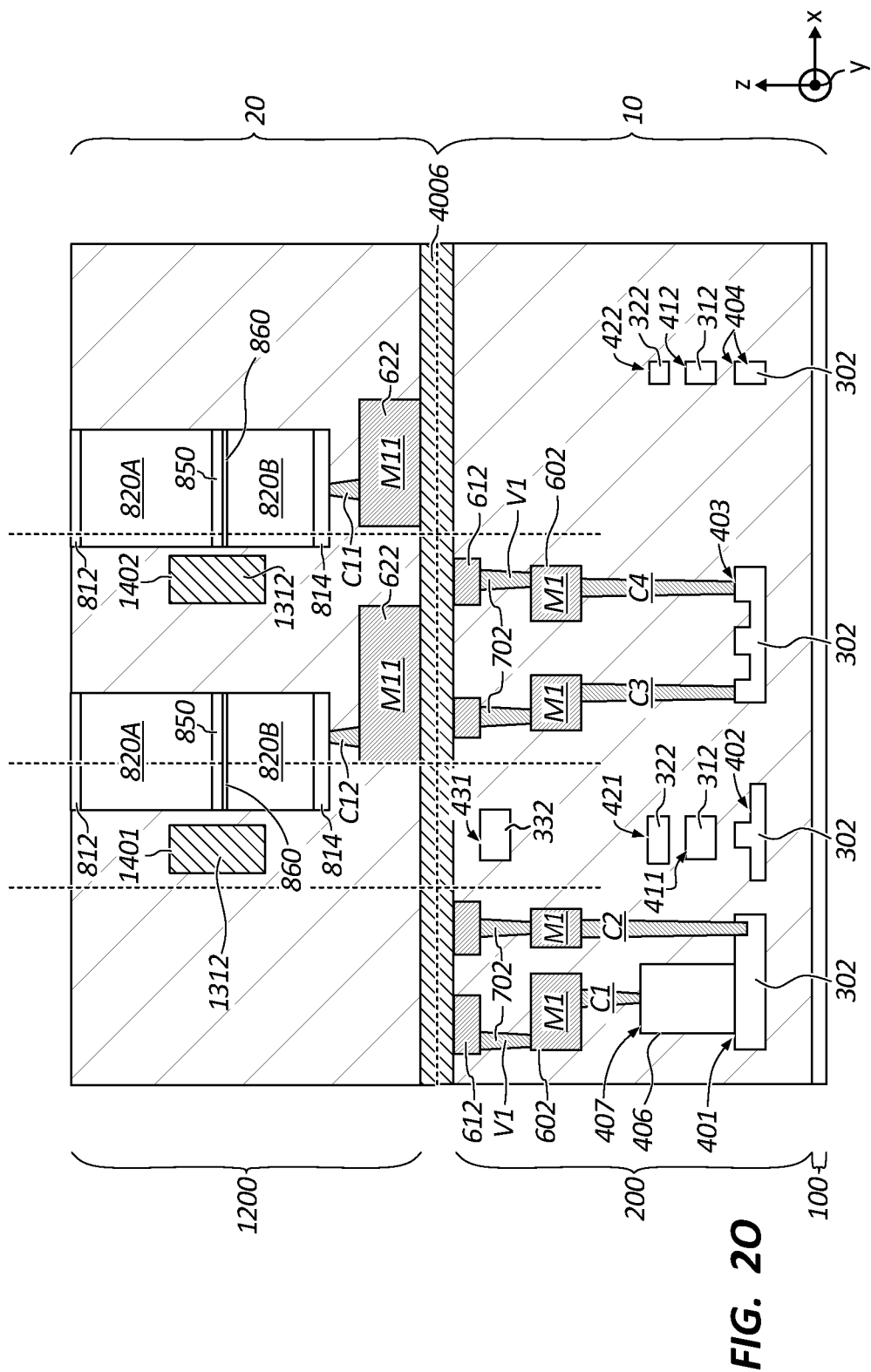

FIG. 2N illustrates optoelectrical system 1000 as depicted in FIG. 2M after further fabrication processing to define through vias, VX1, VX2, and VX3 and contacts C13 and C14. Through vias and contacts can be fabricated in general by way of etching a trench for receipt of conductive material and filling the trench with conductive material to define conductive material formation such as a vias or a contact and then planarizing using CMP. A trench for the formation of through via VX1 can have vertically extending center axis 7301, a trench for the formation of contact C13 can have a vertically extending center axis 7205, a trench for the formation of through via VX2 can have a vertically extending center axis 7302, a trench for the formation of contact C14 can have a vertically extending center axis 7202, and a trench for the formation of through via VX3 can have a vertically extending centered on axis 7303. Embodiments herein recognize that suitable mask coordination schemes can be applied for fabricating the trenches and depositing conductive material in a selected order. Through via VX3 can extend entirely through bond layer 4006 which can be provided by an oxide fusion bond layer. Through via VX3 which can be formed of conductive metal can extend from metallization layer 642 photonics structure 20 and can terminate on photonics structure 10 at metallization layer 612 of photonics structure 10. FIG. 2N further depicts fabrication of metallization formations M12 and M22.

Metallization formation M12 can be defined by metallization layer 632 and metallization formation M22 can be defined by metallization layer 642. Through via VX3 can extend from metallization formation M2 of photonics structure 10 through bond layer 4006 to metallization formation M13 of photonic structure 20. In the fabrication stage depicted in FIG. 2N, insulator layer 1202 (FIG. 2M) can be removed, e.g. by RIE selective to oxide and layer 1302 can be removed, e.g. using RIE selective to silicon. Layer 1202 can be the insulator layer of an SOI wafer used for the fabrication of photonics structure 20 and layer 1302 can be the silicon layer of an SOI wafer used for the fabrication of photonics structure 20.

As seen from the fabrication stage view of FIG. 2N buffer structure 810 of the laser stack structure 802 at location A can be removed so that buffer structure 810 for the laser stack structure 802 at location A is a sacrificial buffer structure. The buffer structure 810 for the laser stack structure 802 at location B may not be removed. However, buffer structure 810 at location B can be subject to trench formation to define a trench having center axis 7202 in which conductive material can be deposited for the formation of contact C14 which can extend entirely through the elevation of a remaining portion of buffer structure 810 as depicted in FIG. 2N. Contact C3 can be in contact with contact structure 812 of laser stack structure 802 at location B. Contact C14 can be in contact with contact structure 812 of laser stack structure 802 at location A.

Embodiments herein recognize that by removal of buffer structure 810 of a laser stack structure 802, height of a contact for contacting contact structure 812 can be reduced to thereby reduce a required distance of electron conduction to increase speed of a laser source. Further, embodiments herein recognize that a shorter contact can reduce fabrication overhead and can yield the thicker conductor having lowered resistance relative to that of a more elongated contact, e.g. contact C14 relative to contact C13. Referring to FIG. 2N, laser light source 800 at location A relative to laser light source 800 at location A can have a shorter laser stack structure 802 and can include a shorter bottom contact C13 relative to bottom contact C14 and therefore can be fabricated potentially with a higher yield, lower resistance, and higher speed by the removal of buffer structure 810.

The fabrication stage view diagram of FIG. 2O depicts alternative fabrication processing, wherein an entire elevation of photonics dielectric stack 1200 can be reduced substantially for removal of buffer structure 810 of the laser stack structure 802 at location A and also for removal of buffer structure 810 of the laser stack structure 802 at location B. An elevation of photonics dielectric stack 1200 can be reduced using a variety of processes including grinding RIE selective to oxide, RIE selective to silicon, and RIE selective to material of buffer structure 810.

Figure 2P:
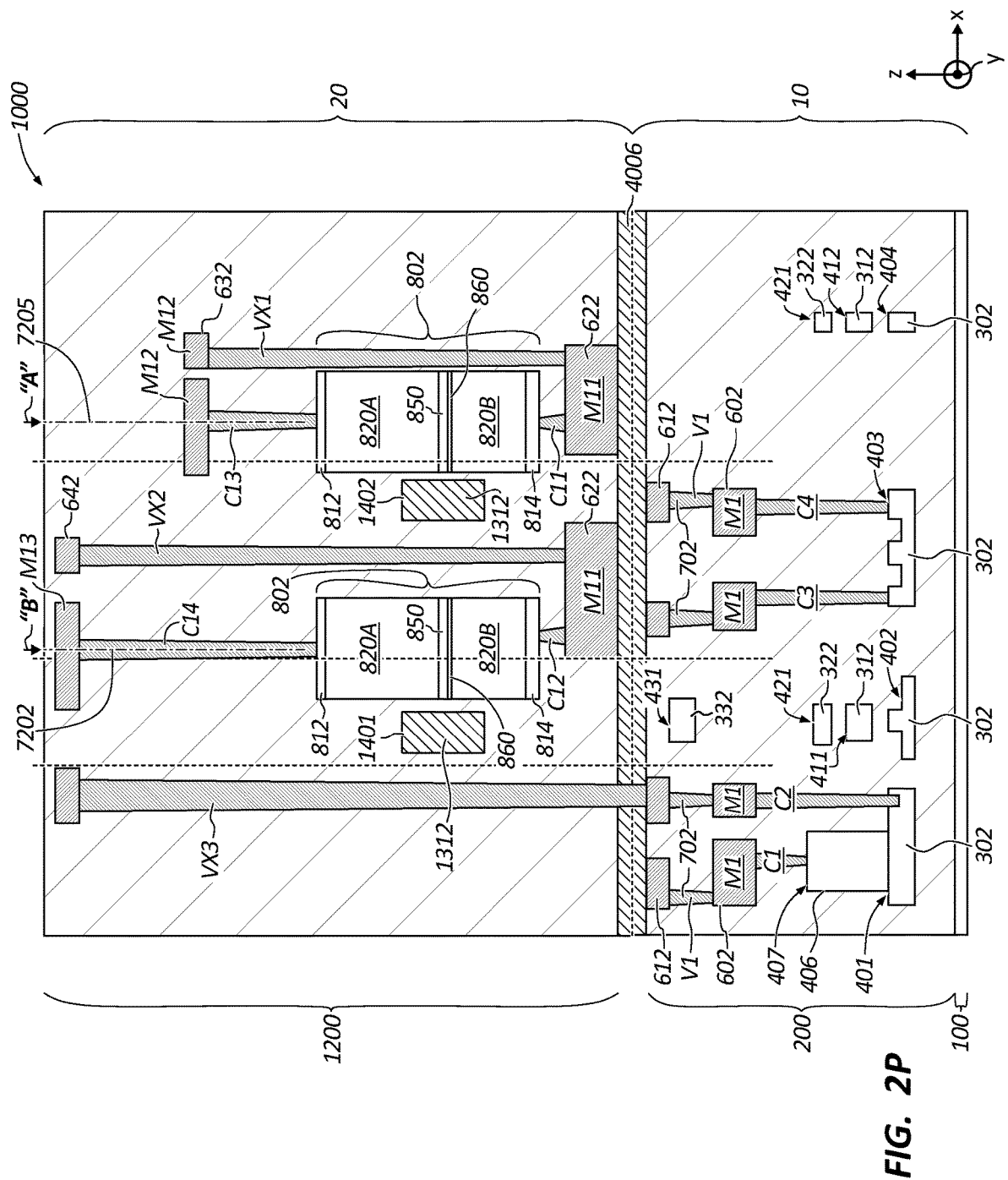

FIG. 2P illustrates the fabrication stage view, wherein buffer structure 810 associated with each of the laser stack structure 802 at location A and laser stack structure 802 at location B are removed. The bottom contact C14 associated in contact with contact structure 812 of laser stack structure 802 at location B is shown in elongated form, however can also be fabricated to be of reduced height, e.g. having a height in common with contact C13 associated to laser stack structure 802 at location A.

Figure 2Q:
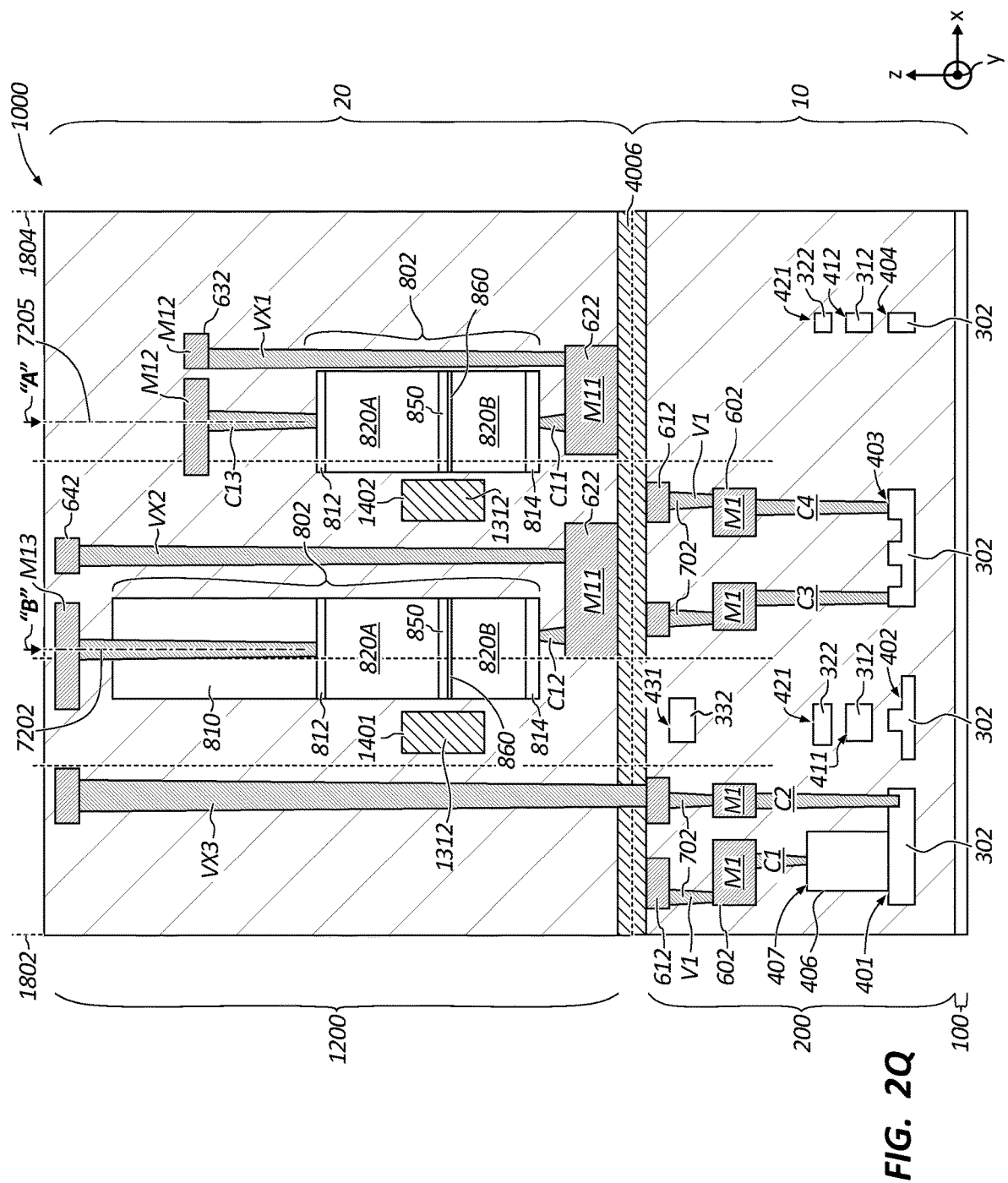

FIG. 2Q illustrates a fabrication stage view illustrating optoelectrical system 1000 as depicted in FIG. 2N after further processing to increase the height of photonics dielectric stack 1200 so that a top elevation of photonics dielectric stack 1200 is above a top elevation of metallization layer 642. Fabrication processing in the stage depicted in FIG. 2Q, optoelectrical system 1000 can be subject to further fabrication processing for defining terminations 6002. Photonics structure 10 can include one or more termination 6002 formed on metallization layer 612. Termination 6002 can include, e.g., one or more of (a) an opening formed in photonics dielectric stack 1200 opening to metallization layer 642; (b) a pad formed on metallization layer 642 and an opening to the pad; (c) an under bump metallization (UBM) layer formed on the metallization layer 642 with an opening formed in photonics dielectric stack 1200 to the UBM; (d) a UBM formed on metallization layer 642 and a solder bump formed on the UBM externally protruding from photonics dielectric stack 1200.

Optoelectrical system 1000 as depicted in FIG. 2Q in wafer scale form can be subject to dicing, e.g. subsequent to fabrication of terminations 6002 (FIG. 1) to define a plurality of integrated circuit chips. Referring to FIG. 2Q, vertically extending plane 1802 and vertically extending plane 1804 depict dicing lines which define lateral sides of a photonics integrated circuit chip when dicing is complete. When a wafer scale structure is diced to produce an integrated circuit chip, photonics structure 10 defining a top side of the integrated circuit chip and photonics structure 20 defining a bottom side of the integrated circuit chip with termination 6002 can have common widths in the X direction as depicted in FIG. 2Q and can also have common lengths in the Y direction. Integrated circuit chips produced by dicing can have a lateral side at vertically extending plane 1802 and a second lateral side at vertically extending plane 1804. Vertically extending plane 1802 can commonly define a first lateral side of photonics structure 10 portion of a produced chip and a photonics structure 20 portion of a produced chip. Vertically extending plane 1804 can commonly define a lateral side of a photonics structure 10 portion of a produced chip and a photonics structure 20 portion of a produced chip. In resulting integrated circuit chips produced by dicing along vertically extending plane 1802 and vertically extending plane 1804, a resulting photonics structure 10 and photonics structure 20 of a produced chip can have common widths in the X direction depicted in FIG. 2Q.

Figure 3:
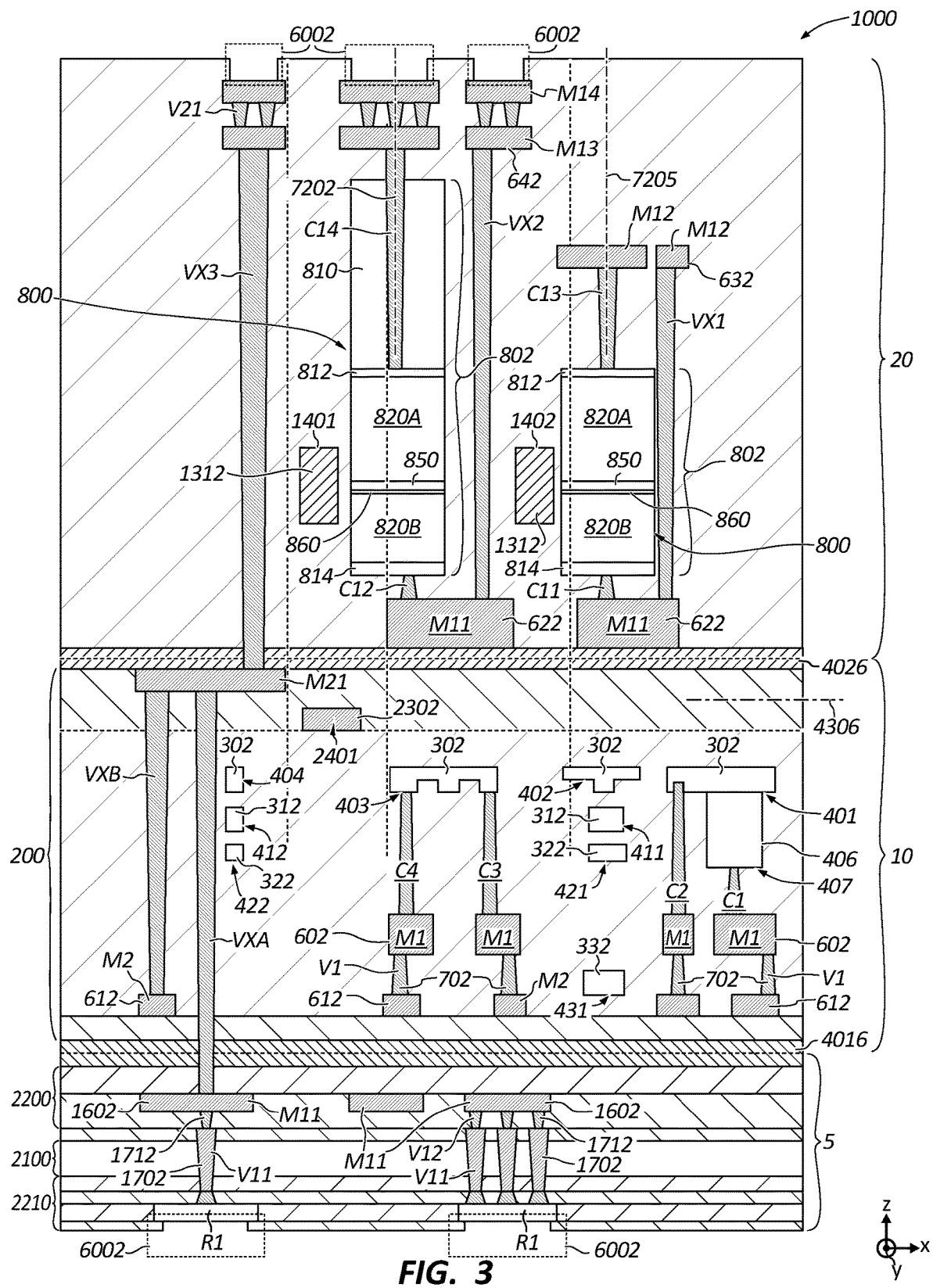
FIG. 3 depicts an optoelectrical system configured as an interposer.

FIG. 3 depicts optoelectrical system 1000 configured as an interposer. An interposer as depicted in FIG. 3 can be characterized by including redistribution layer R1 that can define horizontally extending redistribution wiring that fans out for redistribution contacts defined by vertically extending through vias such as through via VX1 and through via VX3. The interposer shown in FIG. 3 can include photonics structure 10, wafer scale bonded with photonics structure 20, and can also include interposer base structure 5 wafer scale bonded to photonics structure 10. FIGS. 4A-4G are fabrication stage views illustrating fabrication stages for fabrication of the interposer shown in FIG. 3. Photonics structure 20 of optoelectrical system 1000 as shown in FIG. 3 can include one or more termination 6002 formed on metallization layer 612. Termination 6002 can include, e.g., one or more of (a) an opening formed in photonics dielectric stack 200 opening to metallization layer 612; (b) a pad formed on metallization layer 612 and an opening to the pad; (c) an under bump metallization (UBM) layer formed on the metallization layer 612 with an opening formed in photonics dielectric stack 200 to the UBM; (d) a UBM formed on metallization layer 612 and a solder bump formed on the UBM externally protruding from photonics dielectric stack 200. Redistribution layer R1 can provide electrical communication between finer pitch wiring layers as wiring layer defined by metallization layers and vias layers of photonics structure 10 and photonics structure 20 and coarser pitch terminations such as may be provided by terminations 6002 of an interposer base structure.

Figure 4A:
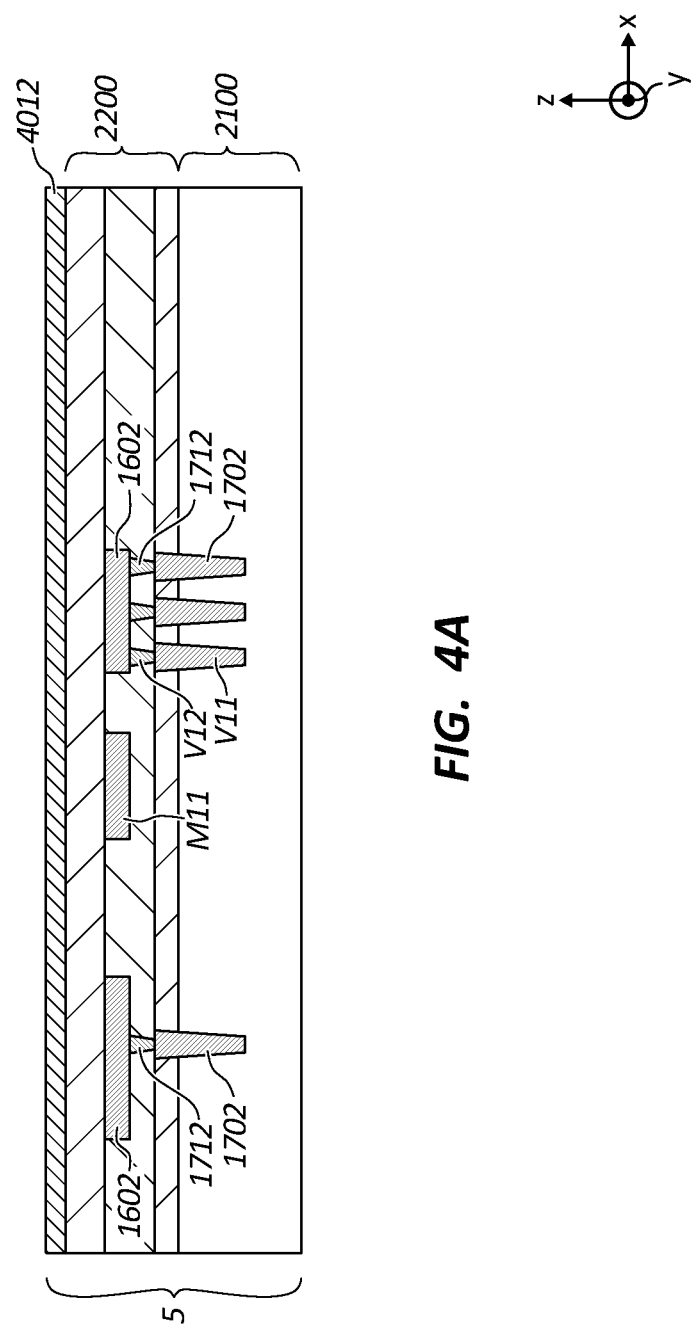
FIGS. 4A-4G are fabrication stage views illustrating a method for fabrication of the optoelectrical system as shown in FIG. 1 according to one embodiment.

FIG. 4A illustrates fabrication of an interposer base structure which can include substrate 2100 and an interposer base photonics dielectric stack 2200. Substrate 2100 can support vias V11. Substrate 2100 can be provided by a bulk silicon wafer in one embodiment. For the formation of vertically extending via V11, substrate 2100 can be subject to etching, e.g. RIE and the resulting trenches can be filled with conductive material. The structure of FIG. 4A can be patterned to include multiple dielectric layers such as dielectric layers shown defining photonics dielectric stack 2200. Within interposer base photonics dielectric stack 2200 there can be patterned multiple metallization layers and/or vias layers such as vias layer 1712 defining vias V11 and metallization layer 1602 defining metallization formations M11. Vertically extending through vias V11 defined by vias layer 1702 can be fabricated to extend within elevations of interposer based photonics dielectric stack 2200 to provide electrical connectivity between redistribution layer R1 and a metallization layer of interposer base structure 5.

In some embodiments the materials of the different dielectric layers defining interposer based photonics dielectric stack 2200 can be differentiated. For example, some dielectric layers can be selected for optimization of functioning as a hard mask and some dielectric layers can be selected to inhibit conductive material migration. With photonics dielectric stack 2200 fabricated dielectric layer 4012 formed of silicon dioxide can be deposited on interposer base photonics dielectric stack 2200 depicted in FIG. 4A.

Figure 4B:
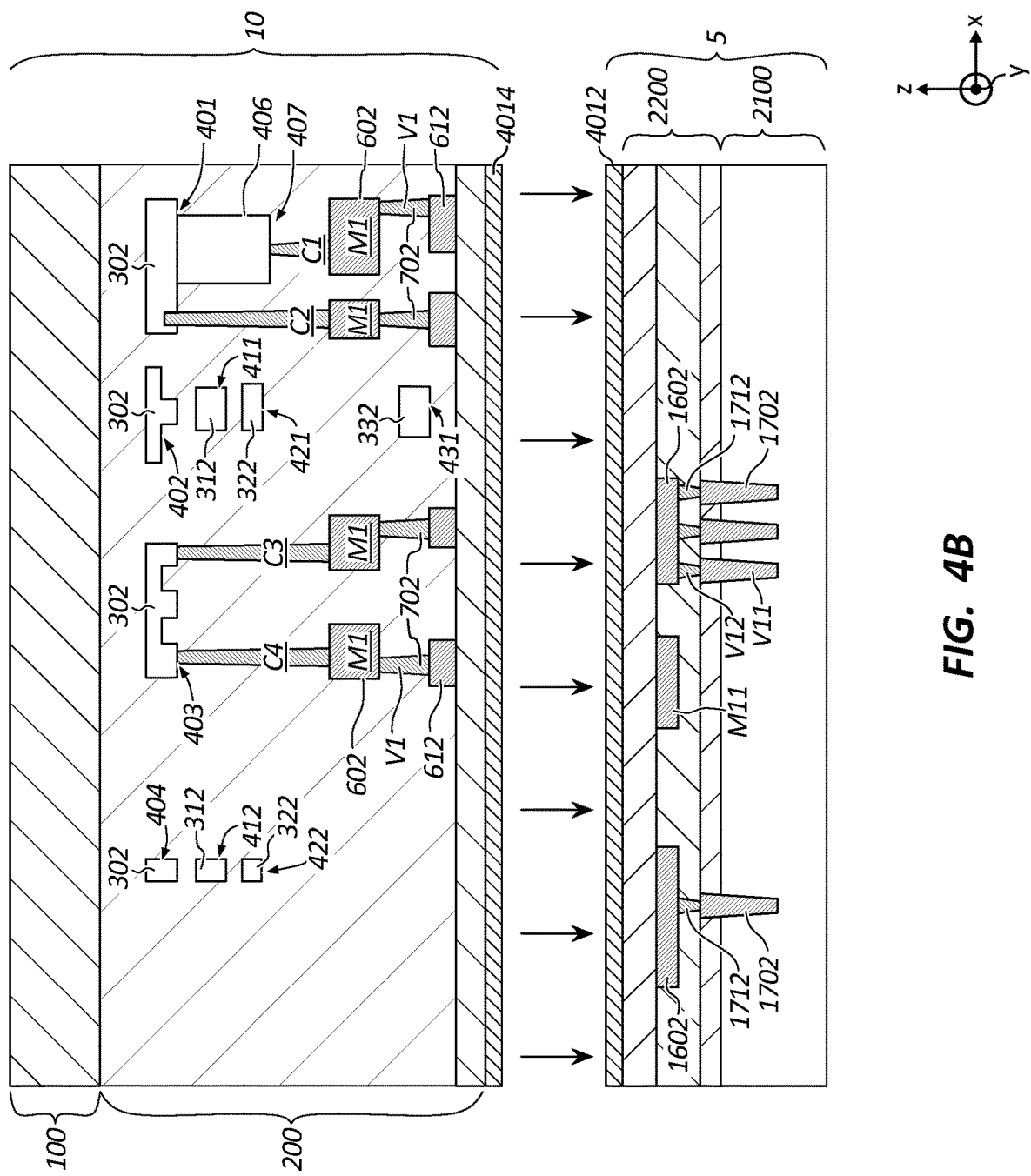
Figure 4C:
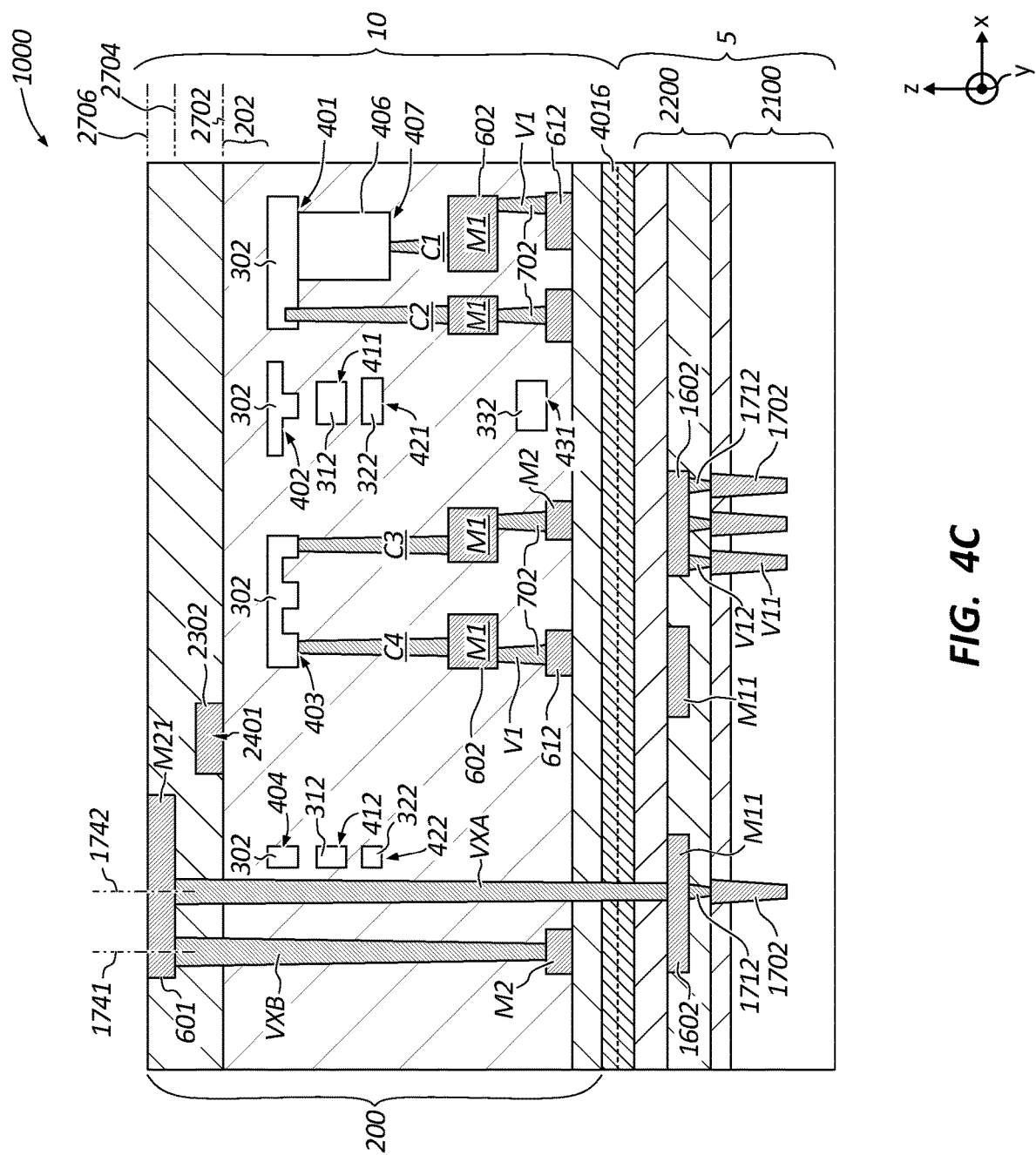

FIGS. 4B and 4C depict an oxide bonding thermal process. In FIG. 4B there is shown photonics structure 10 fabricated according to the fabrication stages set forth in reference to the fabrication stage views of FIGS. 2A-2E, aligned to the interposer base structure built as described in reference to FIG. 4A. Referring to FIGS. 4B and 4C, an oxide bonding thermal process is described. Low temperature oxide fusion bonding can be utilized. Low temperature oxide fusion bonding can be performed at a lower temperature, e.g. 300° C. or lower. For performance of low temperature oxide fusion bonding dielectric layers formed of silicon dioxide can be deposited as shown in FIG. 4B. Dielectric layer 4012 formed of silicon dioxide can be deposited on interposer base photonics dielectric stack 2200 of interposer base structure 5 and dielectric layer 4014 formed of silicon dioxide can be deposited on photonics dielectric stack 200 of photonics structure 10. Prior to depositing dielectric layers 4012 and 4014 their respective undersurfaces can be polished, e.g. using CMP to define atomically smooth surfaces to facilitate quality contact for promotion of activation of van der Waals forces.

The surfaces of dielectric layers 4012 and 4014 after their deposition and smoothing can be treated to define appropriate surface chemistry to promote bonding between the two layers on an atomic level. FIGS. 4B and 4C illustrate bonding between photonics interposer base structure 5 as depicted in FIG. 4A and the photonics structure 10 as fabricated according to the fabrication stage views of FIGS. 2A-2E. On bonding of the structures using low temperature oxide fusion bonding as set forth herein, the respective structures, namely, interposer base structure 5 and photonics structure 10 can be fusion bonded together and can define a bond layer 4016 as depicted in FIG. 4C between interposer base photonics dielectric stack 2200 and photonics dielectric stack 200 of photonic structure 10. Bonding of the interposer base structure 5 and photonics structure 10 with use of dielectric layers 4012 and 4014 can be completed by an annealing process for annealing of the layers 4012 and 4014 to form bond layer 4016, which according to one embodiment can be regarded as a bond dielectric layer and according to one embodiments can be provided by a low temperature oxide fusion bond dielectric layer.

According to one embodiment substrate 2100 of interposer base structure 5 fabricated as depicted in FIG. 4A can be provided by a substrate of a bulk silicon wafer and substrate 100 (FIG. 4B) of photonics structure 10 can be provided by a substrate of an SOI wafer and in one embodiment each wafer can be provided by a 300 mm wafer. A wafer bonder such as a 300 mm wafer bonder can be used for completion of bonding of interposer base structure 5 to photonics structure 10 as depicted in FIGS. 4B-4C. Bonding as depicted in FIGS. 4B and 4C can be provided by wafer scale bonding, wherein each of interposer base structure 5 and photonics structure 10 are of wafer scale (i.e. prior to dicing) when bonding is performed. Bonding as described in connection with FIGS. 4B and 4C can be performed with a thickness of substrate 2100 of interposer base structure 5 (which can be provided by a bulk wafer) and substrate 100 (FIG. 4B) which can be provided by an SOI wafer substrate preserved to their full thickness, e.g. each having a thickness of about 75 microns according to one embodiment. Thus, the wafer scale bonding set forth in reference to FIGS. 4B and 4C can be performed with low risk of wafer breakage and can be carried out without use of handle wafers. FIG. 4C in addition to depicting interposer base structure 5 and photonics structure 10 bonded together illustrates certain fabrication stages performed subsequent to the wafer scale bonding between interposer base structure 5 and photonics structure 10, wherein photonics structure 10 is bonded onto interposer base structure 5.

Referring to FIG. 4C depicts fabrication stage processing for fabrication of through via VX1 and through via VX2. On completion of bonding of photonic structure 10 onto interposer base structure 5 substrate 100 of photonics structure 10 can be removed. For removal of substrate 100 various processes can be used. For example, a majority of an original thickness of substrate 100 can be eliminated with use of a grinding process which can stop at a predetermined distance, e.g. about 10 microns from a top elevation of photonics dielectric stack 200 of photonics structure 10. With a relatively thin, e.g., 10 micron thickness portion of substrate 100 remaining where substrate 100 is formed of silicon the remaining portion of substrate 100 can be removed, e.g. via RIE. The RIE can be selective to silicon (where substrate 100 is formed of silicon) so that silicon material of substrate 100 can be removed without removal of dielectric material of photonics device 10 of photonics dielectric stack 200.

FIG. 4C relative to FIG. 4B depicts photonics structure 10 in a fabrication stage subsequent to removal of substrate 100 and subsequent to further fabrication processing to increase an elevation of photonics dielectric stack 200. Referring to FIG. 4C, with the removal of substrate 100 an elevation of photonics structure 10 can be reduced to elevation 2702 to reveal a surface of layer 2002 defining photonics dielectric stack 200. Layer 2002 of photonics dielectric stack 200 can be the insulator layer of an original SOI wafer for use in fabrication of photonics structure 10.

Layer 2002 which can be prefabricated using high temperature budget defect annihilation treatments can be of high quality e.g. in terms of defect density. On the removal of substrate 100 to reveal layer 2002 at elevation 2702, layer 2302 can be deposited. Layer 2302 can be a nitride layer, e.g. SiN. Layer 2302 can be patterned, e.g., using fabrication processing described in connection with FIGS. 2A-2E to define waveguide 2401.

Waveguide 2401, by its positioning adjacently deposited on layer 2002 can be fabricated to be of high quality in terms of throughput, signal to noise, and scattering reduction. With layer 2302 deposited on layer 2002 of low defect density, waveguide 2401 patterned can be fabricated to be of high quality, e.g., in terms of throughput, signal to noise, and scattering reduction.

On the patterning of waveguide 2401 an additional one or more layer of dielectric material can be deposited over waveguide 2401 and on the surface of layer 202 defined at elevation 2702 and then the deposited one or more additional dielectric layer can be subject to CMP to define horizontally extending planar surface at elevation 2704.

With photonics dielectric stack 200 extending to elevation 2704, trenches for the formation of through via VX1 and through via VX2 can be formed. A masking and lithography scheme can be selected so that the trench formation can be performed according to a certain order. Referring to FIG. 4C trench having vertically extending center axis 1742 can be etched for the formation of through via VX1 and a trench having vertically extending center axis 1741 can be etched for the formation of through via VX2. With the trench formed, the trench can be filled with conductive material, e.g. conductive metal so that conductive metal overflows the trench and the conductive metal can be subsequently planarized using CMP to return the top surface of the structure to elevation 2704. Through via VX1 can extend from metallization formation M11 defined by metallization layer 1602 of interposer base structure 5 to metallization layer M21 defined by metallization layer 601. Through via VXA formed of conductive metal, can extend entirely through fusion bond layer 4016. Through via VXB can extend from metallization formation M2 defined by metallization layer 612 to metallization formation M21 defined by metallization layer 601. Each of through via VXA and through via VXB can extend entirely through the elevations of layer 302 which is the silicon layer of an original SOI wafer used for fabrication of photonics structure 10. An additional dielectric layer can be deposited and then subject to CMP to define a planar horizontally extending planar surface at elevation 2706.

Figure 4D:
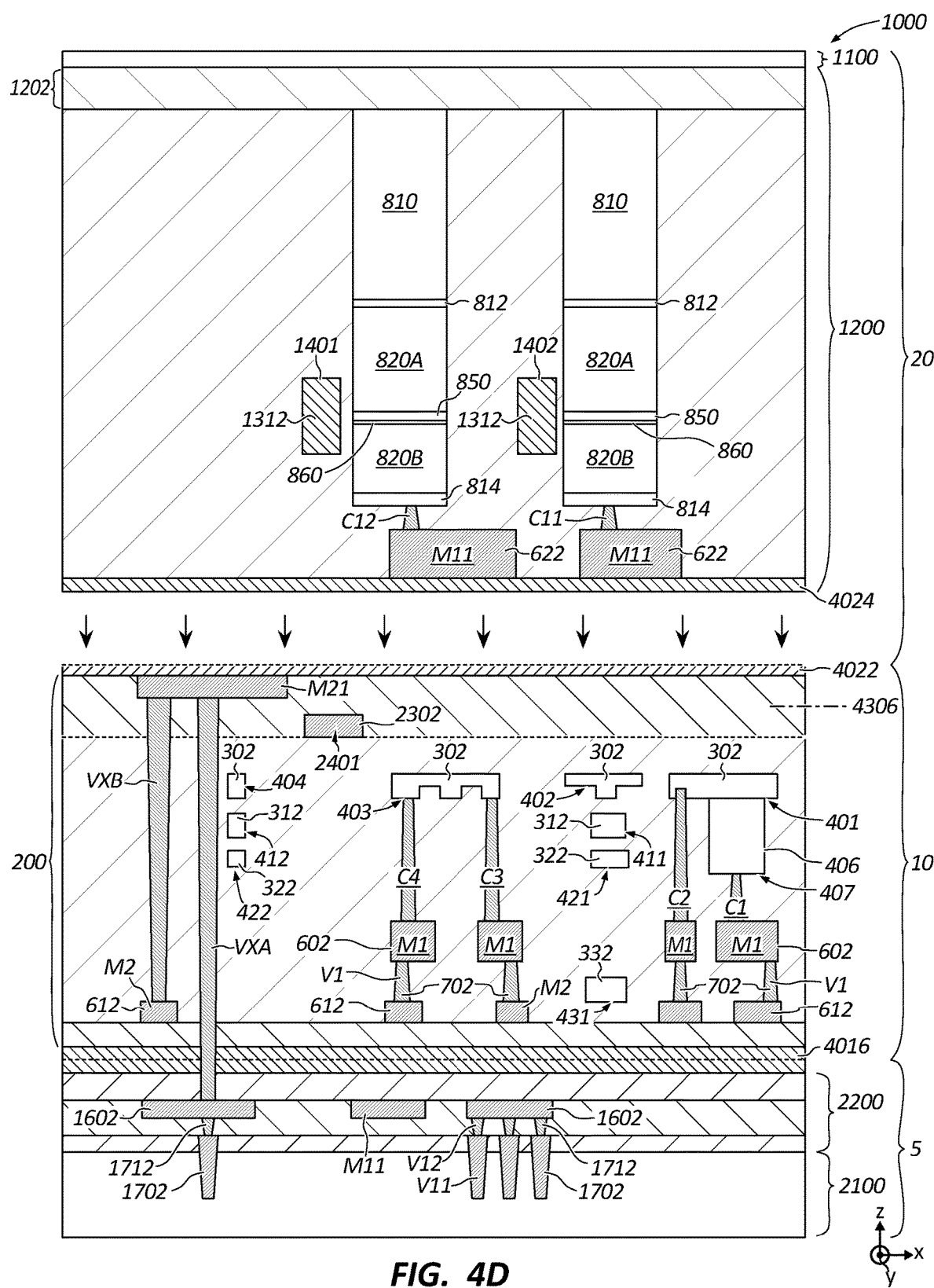

FIG. 4D depicts photonics structure 20 fabricated according to the fabrication stage views of FIG. 2F-2K aligned to photonics structure 10 fabricated according to the fabrication stage views of FIGS. 2A-2E having bonded, wherein photonics structure 10 has bonded thereto interposer base structure 5 fabricated as set forth in FIG. 4A. Referring to FIGS. 4C-4D an oxide bonding thermal process is described. Low temperature oxide fusion bonding can be utilized. Low temperature oxide fusion bonding can be performed at lower temperatures, e.g. 300° C. or lower. For performance of low temperature oxide fusion bonding dielectric layers formed of silicon dioxide can be deposited as shown in FIG. 4D. Dielectric layer 4022 formed of silicon dioxide can be deposited on photonics dielectric stack 200 of photonics structure 10 and dielectric layer 4024 formed of silicon dioxide can be deposited on photonics dielectric stack 1200 of photonics structure 20. Prior to depositing of layers 4022 and 4024 their respective undersurfaces can be polished, e.g. using CMP to define smooth surfaces to facilitate quality contact for promotion activation of van der Waals forces. The surfaces of layers 4022 and 4024 after their deposition and smoothing can be treated to define appropriate surface chemistry to promote bonding between the two layers on an atomic level.

Figure 4E:
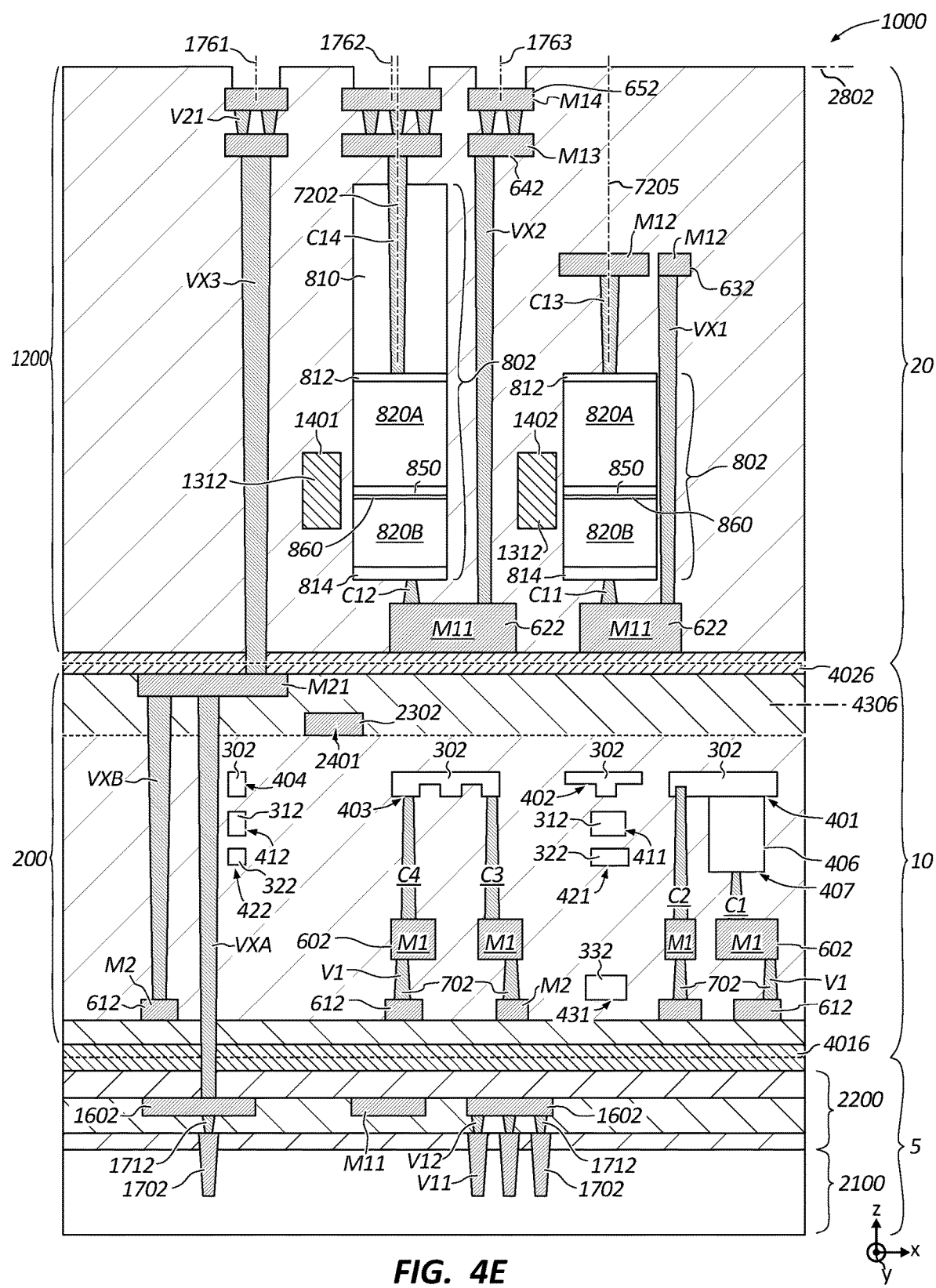

Referring to FIGS. 4D and 4E, FIGS. 4D and 4E illustrate wafer scale bonding between photonics structure 10 and photonics structure 20. On bonding of the structures using low temperature oxide fusion bonding as set forth in FIGS. 4D and 4E the respective structures can be fusion bonded together and can define a bond layer 4026 (FIG. 4E) between photonics structure 10 and photonics structure 20 for bonding of photonics structure 20 to bond to photonics structure 10. Bonding of photonics structure 10 and photonics structure 20 with use of dielectric layers 4022 and 4024 can be completed with use of an annealing process for annealing of the layers 4022 and 4024 to form bond layer 4026, which according to one embodiment can be regarded as a bond dielectric layer and according to one embodiment can be provided by a low temperature oxide fusion bond dielectric layer. According to one embodiment substrate 2100 of interposer base structure 5 onto which photonics structure 10 is bonded can be bonded and can be provided by a substrate of a bulk silicon wafer and substrate 1100 of photonics structure 20 can be provided by a substrate of an SOI wafer and in one embodiment each wafer structure in the wafer bonding depicted in FIGS. 4D and 4E can be provided by a 300 mm wafer structure. A wafer bonder such as a 300 mm wafer bonder can be used for completion of bonding photonics structure 20 onto photonics structure 10, which in the embodiment depicted has been previously bonded onto interposer base structure 5.

FIG. 4E depicts optoelectrical system 1000 in a fabrication stage view as depicted in FIG. 4D after completion of wafer scale fusion bonding to bond photonics structure 20 onto photonics structure 10 and after further fabrication processing to fabricate such features as metallization formations M13 defined by metallization layer 642, vias V21 defined by metallization formations M14 defined by metallization layer 652. On completion of bonding between photonics structure 20 and photonics structure 10, photonics structure 20 can have the form depicted in FIG. 4D. Subsequent processing can include processing for removal of substrate 1100, dielectric layer 1202 which can be the dielectric layer defining an insulator layer of an original SOI wafer. Layer 1302 which can be the silicon layer of an original SOI wafer an additional material such as material defining one or more of buffer structures 810 in manners that are according to processes as set forth herein. Metallization formations M13, vias V21, and metallization formations M14 can be fabricated using fabrication processes set forth herein, e.g. in connection with the fabrication of metallization layers M1 and M2 and vias V1 set forth in connection with FIG. 2E. On completion of fabrication of metallization formations M14, e.g. with CMP, so that a top elevation of photonics structure 20 extends horizontally extending planar surface coplanar with a top surface of metallization formations M14. An additional dielectric layer can be deposited and then subject to CMP to define a horizontally extending planar surface at elevation 2802. With photonics dielectric stack 1200 extending to elevation 2802 various trenches, e.g. having center axes 1761, 1762, and 1763 can be etched to expose metallization formations M14. With metallization formations M14 exposed as depicted in FIG. 4E fabrication processing can proceed to the stage depicted in FIG. 4F.

Figure 4F:
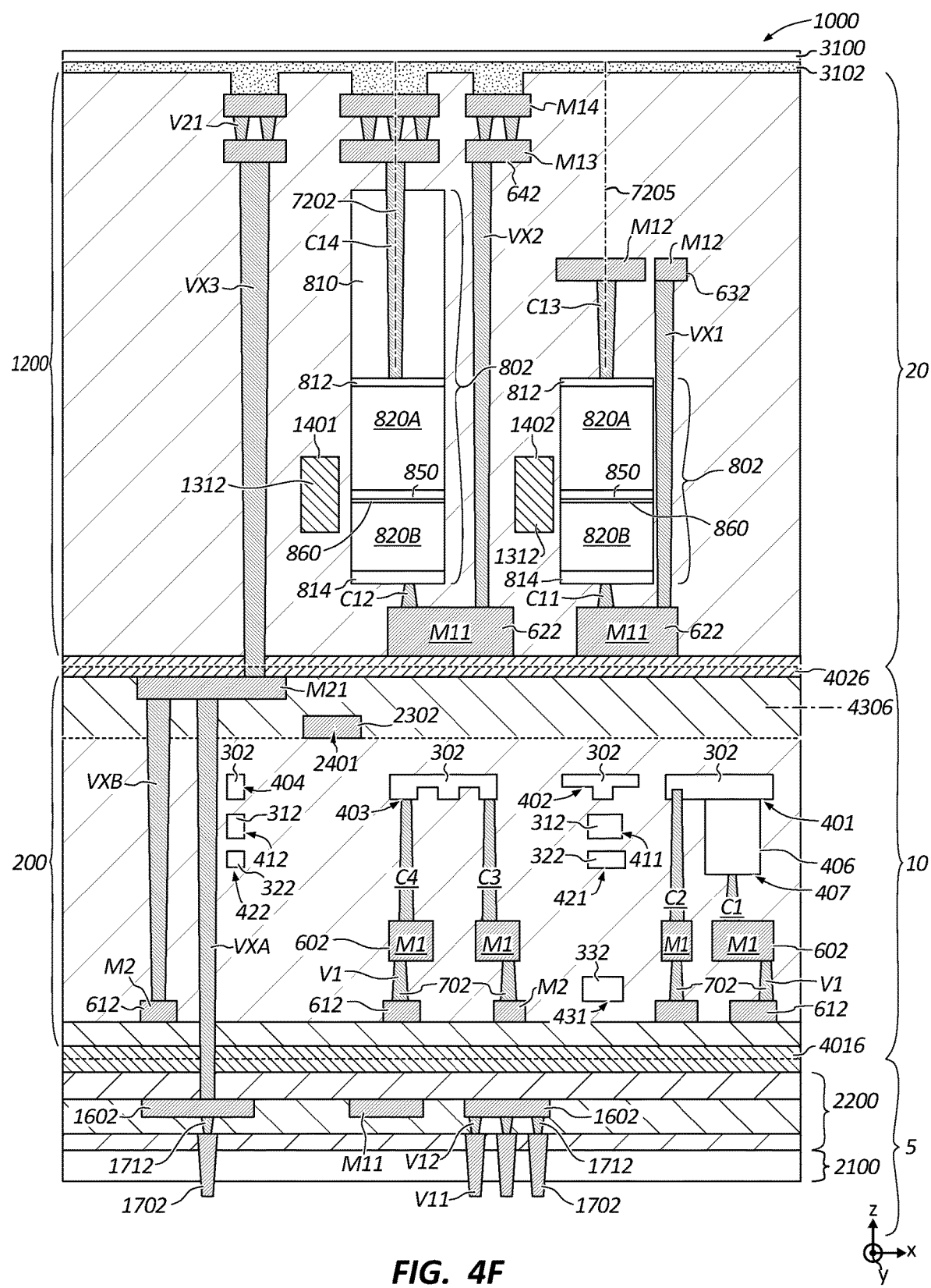

Referring to FIG. 4F, FIG. 4F depicts optoelectrical system 1000 as depicted in FIG. 4E with further processing to include deposition of layer 3102 and application of handle wafer 3100. With handle wafer 3100 attached to photonics structure 10, optoelectrical system 1000 can be subject to further fabrication processing. Namely, fabrication processing in regard to interposer base structure 5. Referring to FIG. 4F, material of substrate 2100 of interposer base structure 5 can be removed to reveal a portion of vertically extending vias, V11. Which vertically extending vias V11 prior to the reveal depicted in FIG. 4F terminate within substrate 2100. Removal of material of substrate 2100 can be performed, e.g. by way of grinding to a predetermined elevation above a designated final elevation and then further removal can be performed using RIE which can be selective to the material of substrate 2100 so that the material of substrate 2100 is selectively removed without removal of conductive material, e.g. conductive metal defining vias V11.

Figure 4G:
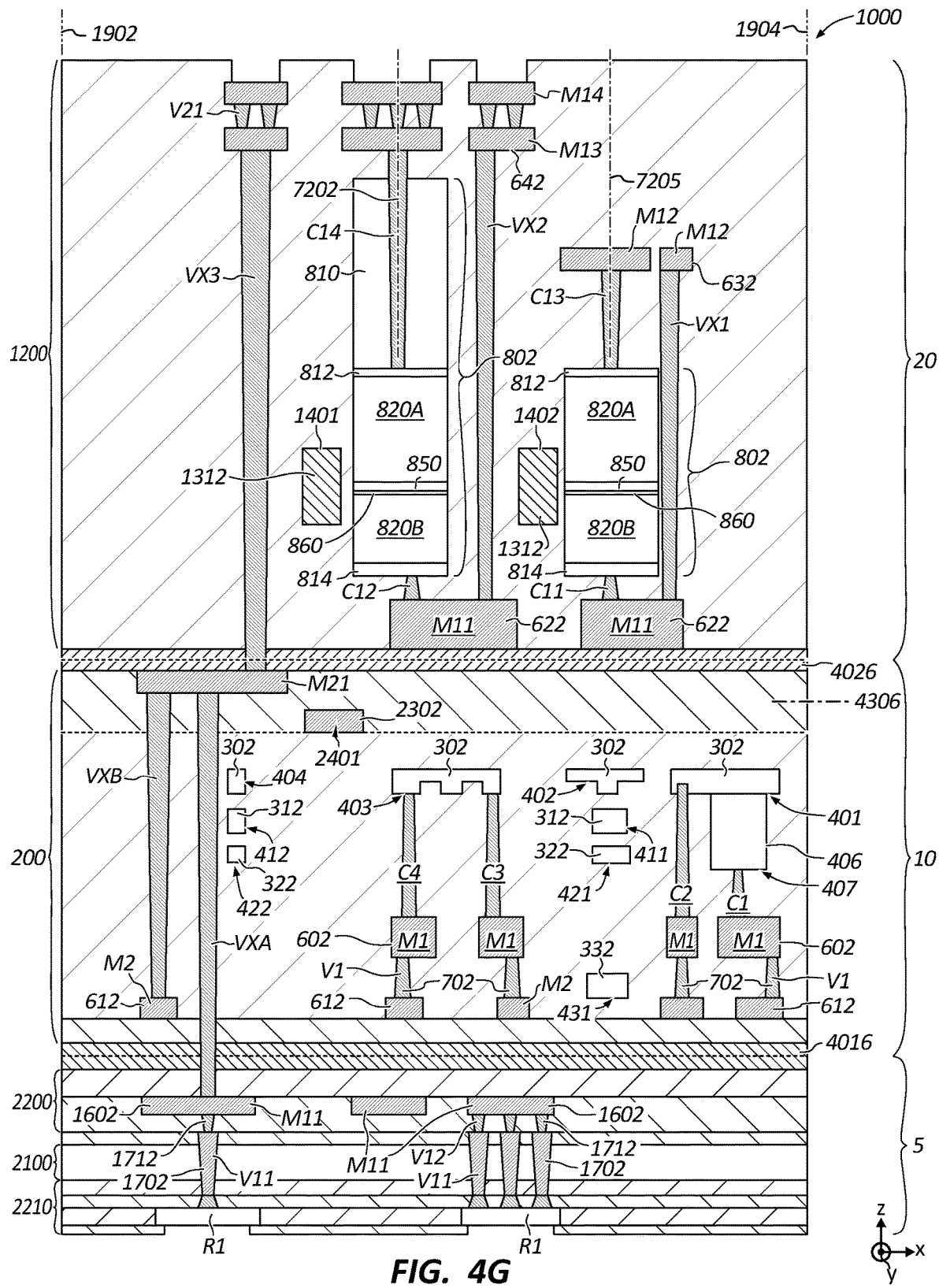

FIG. 4G optoelectrical system 1000 as shown in FIG. 4F after additional fabrication processing to define various interposer base structure features. Referring to FIG. 4G, FIG. 4G illustrates optoelectrical system 1000 as shown in FIG. 4F after further fabrication processing to fabricate a conductive interposer base redistribution layer R1. Redistribution layer R1 which can define horizontally extending redistribution wiring can be provided to fan out the contacts defined by vertically extending vias V11 which can be electrically connected to through vias VXA and through vias VX3. Redistribution layer R1 can be fabricated using a damascene process, e.g. by etching of dielectric material of photonics dielectric stack 2210 that can be deposited on photonics dielectric stack that can be deposited onto substrate 2100. Photonics dielectric stack 2210 can be etched using RIE selective to material of photonics dielectric stack 2210 to selectively remove material of photonics dielectric stack 2210 and then filling of a defined trench with a conductive material that defines redistribution layer R1.

For the fabrication of an optoelectrical structure fabricated as an interposer as shown in FIG. 3, an interposer base structure 5 can be separately fabricated relative to a photonics structure 10 and photonics structure 20. The interposer base structure 5 can be fabricated using a base wafer having a substrate 2100 (FIG. 4A) and photonics structure 10 can be fabricated using a first wafer having a first substrate 100 and photonics structure 20 can be fabricated using a second wafer having a second substrate 2100. After separate fabrication of an interposer base structure 5 (FIG. 4A) and photonics structure 10, interposer base structure 5 and photonics structure 10 can be bonded together using a low temperature oxide fusion bonding process. On the performing of a low temperature oxide bond process a bond layer 4016 can be defined between an interposer base structure 5 and a photonics structure 5, and specifically in one embodiment between an interposer base photonics dielectric stack 2200 and a photonics dielectric stack 200. With the structure having interposer base structure 5 wafer scale fusion bonded with photonics structure 10, photonics structure 20 can be fusion bonded with the structure having base structure 5 wafer scale fusion bonded with photonics structure 10. On the performing of a low temperature oxide bond process a bond layer 4026 can be defined between photonics structure 10 and photonics structure 20, and specifically in one embodiment between photonics dielectric stack 200 and a photonics dielectric stack 1200.

The resulting optoelectrical system defining an interposer as shown in FIG. 3 resulting after further fabrication processing, can feature backside to frontside electrical connectivity e.g. as provided by through vias V11 extending through base interposer substrate 2100 being associated to respective through vias VXA extending through photonics dielectric stack 200 of photonics structure, which through vias VXA can be associated to though vias VX3 extending through photonics dielectric stack 1200 of photonics structure 20.

The optoelectrical system 1000 as shown in FIG. 3 defining an interposer can be connected to an understructure e.g. by way of connection of solder bumps defined by the terminations 6002 of the interposer to UBM formations of the understructure (not shown). The understructure to which the optoelectrical system 1000 of FIG. 3 can be attached can be provided e.g. by a printed circuit board or can alternatively be provided e.g. by a ball grid array or an interposer.

Optoelectrical system 1000 depicted in FIG. 4G in wafer scale form can be subject to dicing, e.g. subsequent to fabrication of terminations 6002 (FIG. 3) to define a plurality of interposers. Referring to FIG. 4G, vertically extending plane 1902 and vertically extending plane 1904 depict dicing lines which define lateral sides of an interposer when dicing is complete. When a wafer scale structure is diced to produce an interposer of a plurality of interposers, photonics structure 20 defining a top side of the interposer and photonics structure 10 and interposer base structure 5 with termination 6002 can have common widths in the X direction as depicted in FIG. 4G and can also have common lengths in the Y direction. Interposers produced by dicing can have a lateral side at vertically extending plane 1902 and a second lateral side at vertically extending plane 1904. Vertically extending plane 1902 can commonly define a first lateral side of photonics structure 20 portion of a produced interposer and a photonics structure 10 portion of a produced interposer and an interposer base structure 5 portion of a produced interposer. Vertically extending plane 1904 can commonly define a first lateral side of photonics structure 20 portion of a produced interposer and a photonics structure 10 portion of a produced interposer and an interposer base structure 5 portion of a produced interposer. In resulting interposers produced by dicing along vertically extending plane 1902 and vertically extending plane 1904, a resulting photonics structure 10 and photonics structure 20 of a produced chip can have common widths in the X direction depicted in FIG. 4G.

In one aspect as set forth herein referring to FIGS. 1 and 3, vertically extending through vias VXA extending through photonics dielectric stack 200 and VX3 extending through photonics dielectric stack 1200 which can be provided as photonics structure through vias can be proportioned to have sizes in one embodiment that are a fraction of the size of corresponding vertically extending through vias V11 extending though base interposer substrate 2100 and which can be configured as through silicon vias. In one embodiment vertically extending through vias VXA and VX3 which can be provided as photonics structure through vias can be proportioned to have a size that is 0.5 or less the size of corresponding through vias V11 extending though base interposer substrate 2100. In one embodiment, vertically extending through vias VXA and VX3 which can be provided as photonics structure through vias can be proportioned to have a size that is 0.25 or less the size of corresponding through vias V11 extending though base interposer substrate 100. In one embodiment, vertically extending through vias VXA and VX3 which can be provided as photonics structure through vias can be proportioned to have a size that is 0.10 or less the size of corresponding through vias V11 extending though base interposer substrate 2100. Size as set forth hereinabove in this paragraph refers to one or more of a diameter, a height, or a volume.

In one example, through vias VXA and VX3 can have dimensions of about 1.0 microns diameter by 7.0 microns height and through vias V11 can have dimensions of about 10 micron diameter by 100 microns height. In one embodiment vertically extending through vias VXA and VX3 and vertically extending through vias V11 can be differently dimensioned but can have common or common order of magnitude aspect ratios, e.g. each can have a 10×1 aspect ratio, e.g. vertically extending through vias VXA and VX3 can be sized to a dimensions of about 0.7 microns×7.0 microns and vertically extending through vias V11 can be sized to dimensions of about 10.0 microns×100 microns.

Providing through vias VXA and VX3 to be dimensionally smaller facilitates fabrication of additional and larger scale photonics devices within photonics device photonics dielectric stack 200 and photonics dielectric stack 1200. Providing through vias VXA and/or through vias VX3 to carry one or more of control, logic and/or power signals rather than contact vias such as vias V21 can help avoid various electrical problems such as involving unwanted voltage drops and stray capacitance generation.

The optoelectrical system of FIG. 4G can be subject to further fabrication processing to fabricate terminations 6002 formed on photonics dielectric stack 1200 as shown in FIG. 3. Termination 6002 can include, e.g., one or more of (a) an opening formed in photonics dielectric stack 200 opening to metallization layer 612; (b) a pad formed on metallization layer 612 and an opening to the pad; (c) an under bump metallization (UBM) layer formed on the metallization layer 612 with an opening formed in photonics dielectric stack 200 to the UBM; (d) a UBM formed on metallization layer 612 and a solder bump formed on the UBM externally protruding from photonics dielectric stack 200.

For coupling light from active region 850 into a waveguide, photonics structure 10 can be fabricated so that a horizontally extending longitudinal axis of a waveguide can be aligned and coincident with a horizontally extending longitudinal axis of active region 850 of a laser stack structure 802 as described further in reference to FIGS. 5A and 5B.

FIG. 5A depicts laser light source 800 as shown in FIG. 2O, taken along the Y-Z plane rather than the X-Z plane, as shown in FIG. 2O (FIG. 5A illustrates a view, extending into and out of the paper, as shown in FIG. 2O). The alignment and light coupling features described in connection with FIG. 5A can be incorporated into any of the embodiments set forth herein in connection with FIGS. 1-4G.

Referring to FIG. 5A, optoelectrical system 1000 can be fabricated and accordingly configured so that active region 850 and waveguide 461 are arranged so that horizontally extending longitudinal axis of active region 850 aligns with and coincides with a horizontally extending longitudinal axis of waveguide 461. The horizontally extending longitudinal axes of active region 850 and waveguide 461 can be coincident with axis 2515 as shown. Waveguide 461 can be fabricated by patterning of layer 3006, which can be a nitride layer fabricated in the manner of layers 302, 312 and 322 formed of nitride (FIGS. 2C and 2D). FIG. 5A depicts direct coupling of active region 850 into waveguide 451 formed to silicon, wherein the silicon depicted is the silicon layer of an originally fabricated SOI wafer.

FIG. 5B depicts, also in Y-Z plane view, an alternative scheme for coupling light from active region 850 of laser stack 802 into waveguides, wherein light is evanescently coupled through a succession of waveguides into waveguide 451. In the coupling scheme depicted in FIG. 5B, light from active region 850 can directly couple into waveguide 476, and light subsequently can couple through a succession of waveguides into waveguide 451. For facilitation of light from active region 850 coupling into waveguide 476, active region 850 and waveguide 476 can be arranged so that horizontally extending longitudinal axis of active region 850 aligns with and coincides with a horizontally extending longitudinal axis of waveguide 476. The respective horizontally extending longitudinal axes of active region 850 and waveguide 461 can be coincident with axis 2515 as shown.

Light propagating through waveguide 476 can evanescently couple into waveguide 476 which light can evanescently couple into waveguide 475 which light can evanescently couple into waveguide 474 which light can evanescently couple through bond layer 4006 which can be provided by an oxide fusion bond layer into waveguide 473 which light can evanescently couple into waveguide 472 which light can evanescently couple into waveguide 471 which light can evanescently couple into waveguide 451 patterned from layer 302 formed of silicon. Waveguides 476-471 can be nitride e.g. silicon nitride waveguides patterned in the manner described with reference to waveguide 411 and waveguide 421 set forth in reference to FIGS. 2C-2D. Waveguides 476-471 can be patterned from respective layers 3006-3001 formed of nitride. Layers 3006-3001 can be nitride layers so that the fabricated respective waveguides 476-471 are nitride waveguides.

For optimizing evanescent coupling between waveguides, size, shape, and location of evanescently coupled waveguides can be coordinated. For tuning of evanescent coupling, parameters that can be controlled can include: (a) Z direction spacing distance, d, as depicted in FIGS. 5B, (b) overlap length, l, as depicted in FIG. 5B, and (c) taper geometry. Tapered evanescently coupled waveguides are depicted in the top view (Y-X plane view) of FIG. 5C. To promote evanescent coupling between first and second waveguides, waveguides can have overlapping tapered ends. As shown in FIG. 5C, first waveguide 491 can have a tapered end 4911 coordinated to a tapered end 4921 of second waveguide 492, wherein second waveguide has an elevation lower than that of waveguide 491 (and therefore is depicted in dashed form). First waveguide 491 and second waveguide 492 can represent any combination of upper and lower evanescently coupling waveguides as depicted in FIG. 5B. Characteristics of evanescent coupling can be in dependence on various additional parameters e.g. the index of refraction of first waveguide 491, the index of refraction of second waveguide 492, the index of refraction of surrounding dielectric material of photonics dielectric stack 200 surrounding the waveguides, and the wavelength of traveling light.

Waveguides such as waveguide 461 (FIG. 5A), and waveguide 476 (FIG. 5B) that are coupled to an active region 850 of a laser stack structure 802 can be edge coupled to active region 850. For promotion of light coupling between active region 850 and a waveguide edge coupled to the active region 850, the active region 850 and the waveguide can be configured to include compatible mode profiles, wherein the respective mode profiles define respective spatial area distributions of a traveling light signal. Mode profiles can be tuned using e.g. indices of refraction of e.g. the active region 850 and the edge coupled waveguide, the respective geometries of active region 850 and the edge coupled waveguide, and the index of refraction of dielectric material surrounding the edge coupled waveguide and laser stack structure 802. With the design parameters tuned for configuration of compatible mode profiles, light signal losses including by way of reflections returned to active region (recycling losses) can be reduced. According to some embodiments, for reduction of light losses, light entry ends of edge coupled waveguides that are edge coupled to active region 850 can be tapered.

Waveguides 476-471 as depicted in FIG. 5 can be sized, shaped and located, e.g. in the stepwise arrangement shown to facilitate evanescent coupling of light from waveguide 475 downwardly through the succession of waveguides 475 through 471 and eventually into waveguide 451 formed of silicon, which waveguide 451 can be patterned from layer 302 can be a silicon layer e.g. monocrystalline layer from a prefabricated SOI wafer.

Optoelectrical system 1000 as shown in FIG. 1 according to one embodiment can refer to a wafer scale photonics structure, prior to dicing to define photonics integrated circuit chips. Optoelectrical system 1000 according to one embodiment refers to an entire wafer scale structure.

Optoelectrical system 1000 as shown in FIG. 1 according to one embodiment can refer to a photonics integrated circuit chip formed by fabrication processing that includes dicing of a photonics wafer scale structure. Optoelectrical system 1000 according to one embodiment can refer to photonics structure integrated circuit chip defined by dicing of an entire wafer scale structure.

Optoelectrical system 1000 as shown in FIG. 3 according to one embodiment can refer to a wafer scale photonics structure, prior to dicing to define interposers. Optoelectrical system 1000 according to one embodiment refers to an entire wafer scale structure.

Optoelectrical system 1000 as shown in FIG. 3 according to one embodiment can refer to an interposer formed by fabrication processing that includes dicing of a photonics wafer scale structure. Optoelectrical system 1000 according to one embodiment can refer to an interposer defined by dicing of an entire wafer scale structure.

The terminology used herein is for the purpose of describing particular embodiments only and is not intended to be limiting. The term "on" in one embodiment can refer to a relationship where an element is "directly on" a specified element without intervening elements between the element and the specified element. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Forms of the term "defined by" encompass relationships where an element is partially defined by as well relationships where an element is entirely defined by. Numerical identifiers herein, e.g. "first" and "second" are arbitrary terms to designate different elements without designating an ordering of elements. Furthermore, a system method or apparatus that is configured in a certain way is configured in at least that way, but may also be configured in ways that are not listed. Furthermore, a system method or apparatus set forth as having a certain number of elements can be practiced with less than or greater than the certain number of elements.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An optoelectrical system, comprising:
a first photonics structure having a first photonics dielectric stack;
a second photonics structure having a second photonics dielectric stack;
one or more metallization layers integrally formed in the first photonics dielectric stack;
one or more first photonics devices integrally formed in the first photonics dielectric stack;
at least one metallization layer integrally formed in the second photonics dielectric stack;
at least one second photonics device integrally formed in the second photonics dielectric stack;
one or more laser stack structures formed in the second photonics dielectric stack, each laser stack structure including a buffer structure, and each laser stack structure having a bottom contact structure thereof; and
an extended dielectric stack region of the second photonics dielectric stack including a contact extending therethrough to contact at least one bottom contact structure of a laser stack structure, and the extended dielectric stack region further including a termination in electrical communication with the contact.

2. The system of claim 1, comprising:
a first waveguide integrally formed in the second photonics dielectric stack, the waveguide being edge coupled to an active region of a laser stack structure of the one or more laser stack structures integrally formed in the second photonics dielectric stack;
a monocrystalline waveguide integrally fabricated within the first photonics dielectric stack; and
a plurality of intermediary waveguides configured to evanescently couple light from the first waveguide to the monocrystalline waveguide.

3. The system of claim 1, wherein the one or more first photonics devices includes at least one waveguide, and wherein the at least one second photonics device includes at least one waveguide.

4. The system of claim 1, wherein the buffer structure is includes a layer of Ge.

5. The system of claim 4, wherein the buffer structure includes a layer of GaAs.

6. The system of claim 5, wherein the buffer structure is epitaxially grown.

7. The system of claim 1, wherein each of the one or more laser stack structures includes plurality of buffer structures.

8. The system of claim 1, wherein the buffer structure is comprised of one or more III-V material.

9. An optoelectrical system, comprising:
a first photonics structure having a first photonics dielectric stack;
a second photonics structure having a second photonics dielectric stack;
a bond layer that fusion bonds the first photonics structure to the second photonics structure;
one or more first metallization layers integrally formed in the first photonics dielectric stack;
at least one second metallization layer integrally formed in the second photonics dielectric stack;

one or more first photonics device integrally formed in the first photonics dielectric stack;

at least one second photonics device integrally formed in the second photonics dielectric stack;

one or more laser stack structures formed in the second photonics dielectric stack, each laser stack structure including a buffer structure, and each laser stack structure having a bottom contact structure thereof;

an extended dielectric stack region of the second photonics dielectric stack including a contact extending therethrough to contact at least one bottom contact structure of a laser stack structure, and the extended dielectric stack region further including a termination in electrical communication with the contact; and a waveguide integrally formed in the second photonics dielectric stack, the waveguide being edge-coupled to one of the one or more laser stack structures.

10. The system of claim 9, wherein the buffer structure is includes a layer of Ge.

11. The system of claim 9, comprising:

a first waveguide integrally formed in the second photonics dielectric stack, the waveguide being edge coupled to an active region of a laser stack structure of the one or more laser stack structures integrally formed in the second photonics dielectric stack;

a monocrystalline waveguide integrally fabricated within the first photonics dielectric stack; and a plurality of intermediary waveguides configured to evanescently couple light from the first waveguide, through the bond layer, to the monocrystalline waveguide.

12. An optoelectrical system, comprising:

a first photonics structure having a first photonics dielectric stack;

a second photonics structure having a second photonics dielectric stack;

one or more metallization layers integrally formed in the first photonics dielectric stack;

one or more first photonics devices integrally formed in the first photonics dielectric stack;

at least one metallization layer integrally formed in the second photonics dielectric stack;

at least one second photonics device integrally formed in the second photonics dielectric stack;

one or more laser stack structures formed in the second photonics dielectric stack, each laser stack structure having a bottom contact structure thereof; and an extended dielectric stack region of the second photonics dielectric stack including a contact extending therethrough to contact at least one bottom contact structure of a laser stack structure, and the extended dielectric stack region further including a termination in electrical communication with the contact.

13. The system of claim 12, each laser stack structure including at least one light-confining structure.

14. The system of claim 13, wherein the light-confining structure is epitaxially grown.

15. The system of claim 13, wherein the one or more laser stack structures further include a buffer structure, a contact structure on the buffer structure, and wherein the light-confining structure is on the contact structure.

16. The system of claim 15, where the one or more laser stack structures further includes an active region on a first light-confining structure, a mode selection structure on the active region, and a second light-confining on the mode selection structure.

17. The system of claim 13, wherein the light-confining structure is at least one cladding structure.

18. The system of claim 13, wherein the light-confining structure is n-doped and comprised of AlGaAs, GaInP or a combination thereof.

19. The system of claim 12, comprising:

a first waveguide integrally formed in the second photonics dielectric stack, the waveguide being edge coupled to an active region of a laser stack structure of the one or more laser stack structures integrally formed in the second photonics dielectric stack;

a monocrystalline waveguide integrally fabricated within the first photonics dielectric stack; and a plurality of intermediary waveguides configured to evanescently couple light from the first waveguide to the monocrystalline waveguide.

20. The system of claim 12, wherein the one or more laser stack structures further include a buffer structure.

* * * * *